United States Patent [19]
Yamaguchi et al.

[11] Patent Number: 5,513,201
[45] Date of Patent: Apr. 30, 1996

[54] OPTICAL PATH ROTATING DEVICE USED WITH LINEAR ARRAY LASER DIODE AND LASER APPARATUS APPLIED THEREWITH

[75] Inventors: Satoshi Yamaguchi; Masahiro Daimon, both of Sagamihara; Koichi Chiba, Tokyo; Tetsurou Kobayashi, Tokyo; Yoshimasa Saito, Tokyo, all of Japan

[73] Assignee: Nippon Steel Corporation, Tokyo, Japan

[21] Appl. No.: 235,455

[22] Filed: Apr. 28, 1994

[30] Foreign Application Priority Data

| Apr. 30, 1993 | [JP] | Japan | 5-124647 |
| Jun. 28, 1993 | [JP] | Japan | 5-182048 |
| Jul. 2, 1993 | [JP] | Japan | 5-190775 |
| Jul. 14, 1993 | [JP] | Japan | 5-197926 |
| Jul. 20, 1993 | [JP] | Japan | 5-201116 |

[51] Int. Cl.$^6$ .................................................. H01S 3/094
[52] U.S. Cl. .................. 372/75; 372/70; 385/33
[58] Field of Search .......................... 372/50, 69, 70, 372/75; 385/33, 34; 359/619, 629

[56] References Cited

U.S. PATENT DOCUMENTS

| 4,794,615 | 12/1988 | Berger | 372/69 |
| 4,813,762 | 3/1989 | Leger et al. | 359/565 |
| 4,895,790 | 1/1990 | Swanson et al. | 430/321 |
| 5,081,637 | 1/1992 | Fan et al. | 372/72 |
| 5,268,978 | 12/1993 | Po et al. | 372/70 |
| 5,369,661 | 11/1994 | Yamaguchi et al. | 372/69 |

FOREIGN PATENT DOCUMENTS 4-78179  3/1992  Japan.

OTHER PUBLICATIONS

High–Power Nd:YAG Laser End Pumped By A CW, 10 mm×1 μm Aperature, 10–W Laser–Diode Bar, Shannon et al., Optics Letters, vol. 16, No. 5, Mar. 1, 1991.

*Primary Examiner*—James W. Davie
*Attorney, Agent, or Firm*—Pollock, Vande Sande & Priddy

[57] ABSTRACT

An optical path rotating device, disposed in front of a linear array laser diode having a plurality of long and narrow and linearly arranged emitters for emitting a group of laser beams in the form of a dotted line, the optical path rotating device being able to convert the laser beams from the emitters into laser beams lined up in the form of ladder rungs by receiving the group of laser beams collimated by being refracted in a direction substantially perpendicular to the direction of the dotted line, rotating the positions of the laser beams from the emitters substantially for a right angle, and emitting the laser beams, and a laser apparatus, which uses the optical path rotating device, for collimating the substantially rung-shaped laser beams into two directions independently, bringing the laser means into focus, thus increasing the density of the laser energy at the focus.

54 Claims, 50 Drawing Sheets

$B = A - 2(A \cdot N)N_1$
$C = B - 2(B \cdot N)N_1$
$B_p = A_p - 2(A_p \cdot N_1)N_1$
$C_p = B_p - 2(B_p \cdot N_2)N_2$ F I G. 13
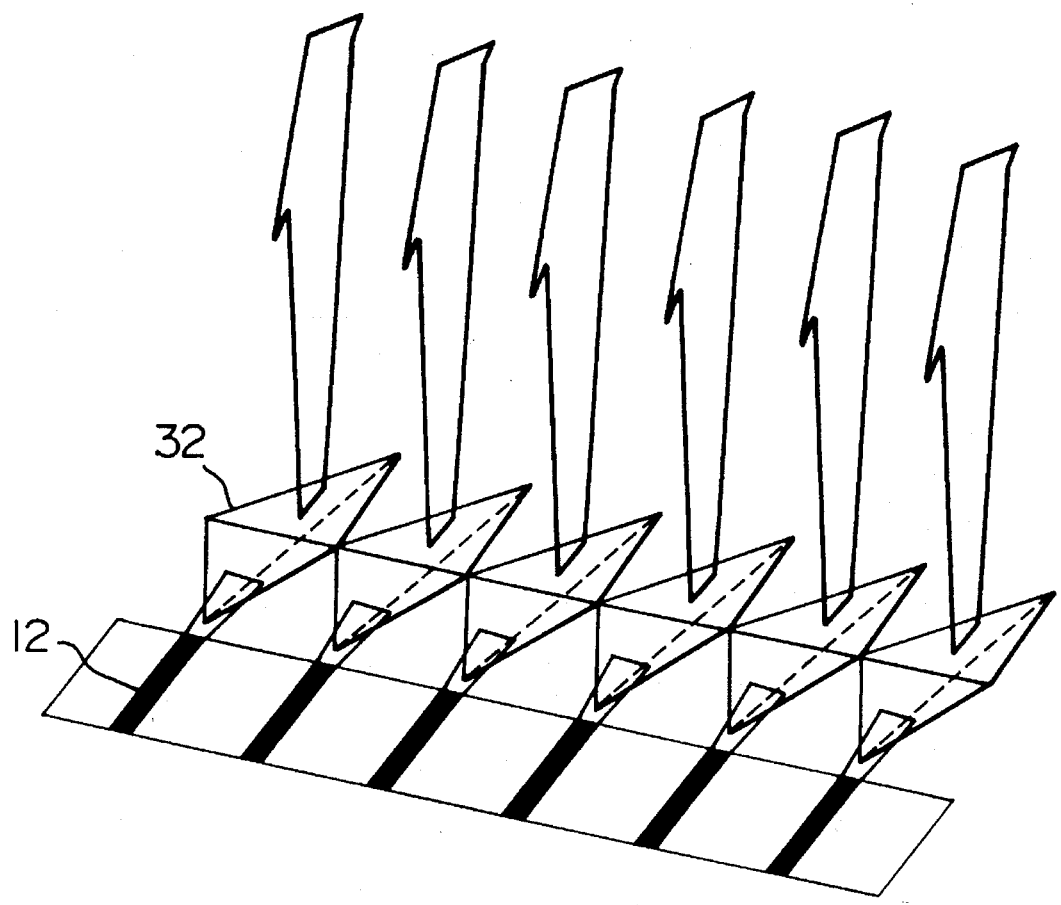

F I G. 15
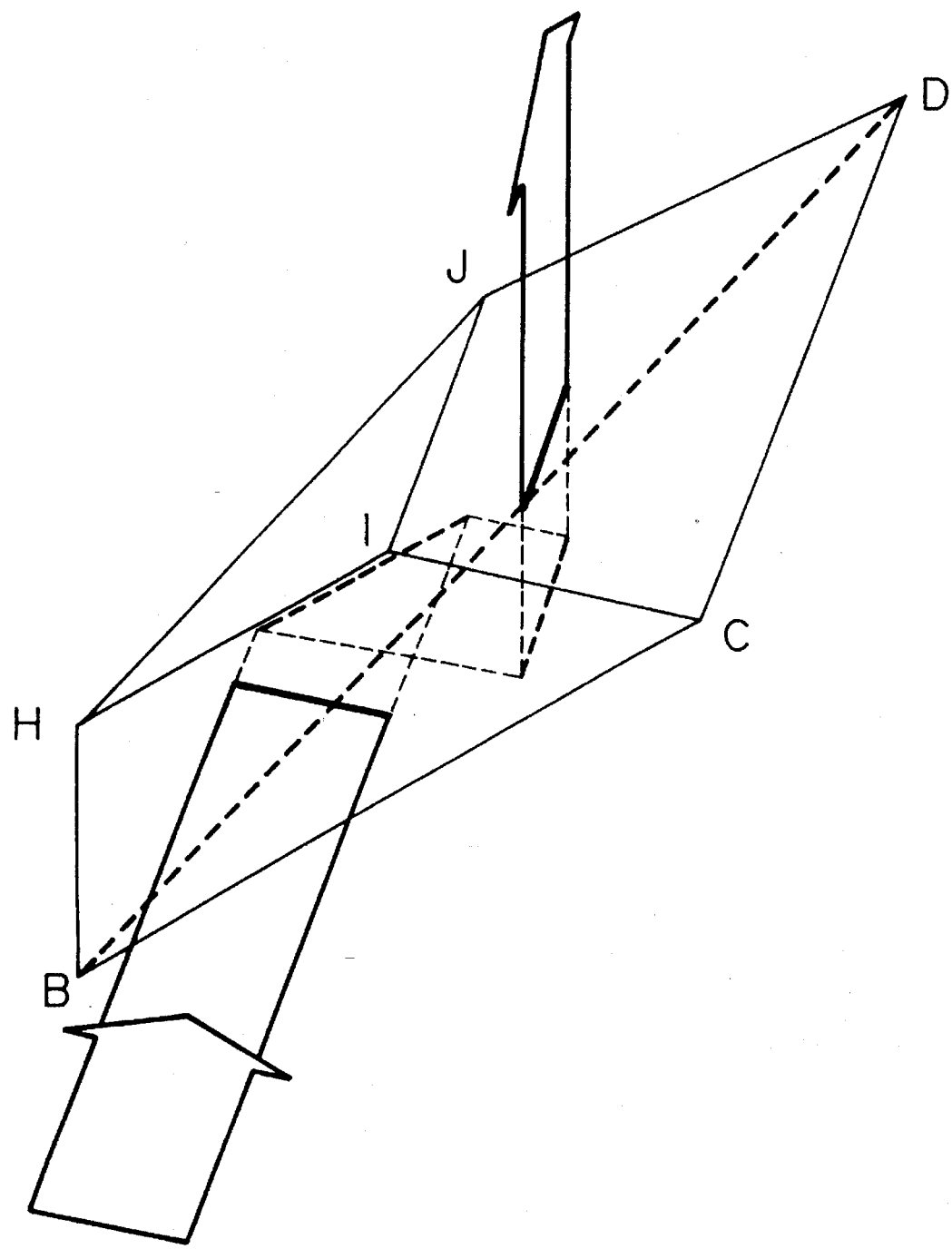

F I G. 19
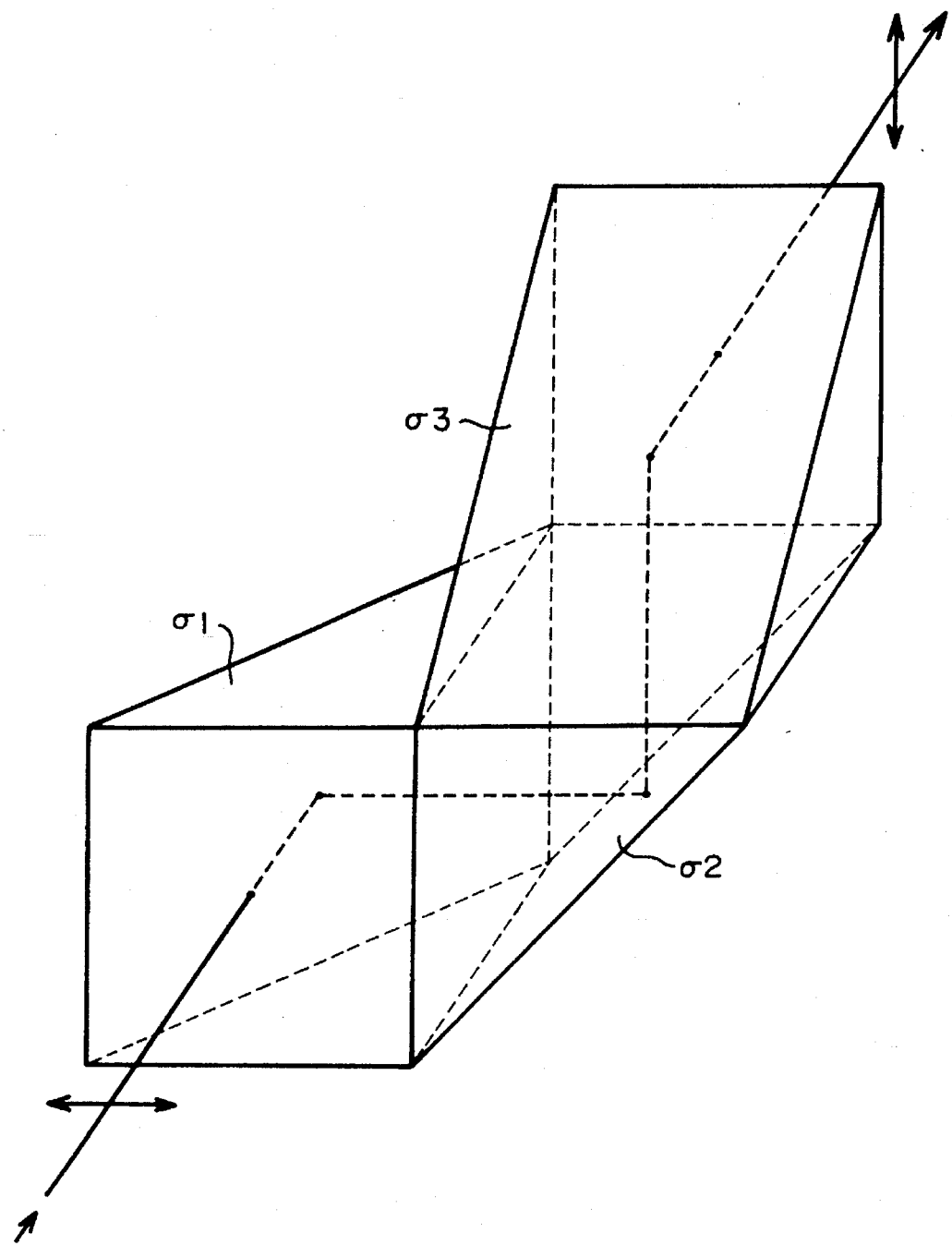

F I G. 29
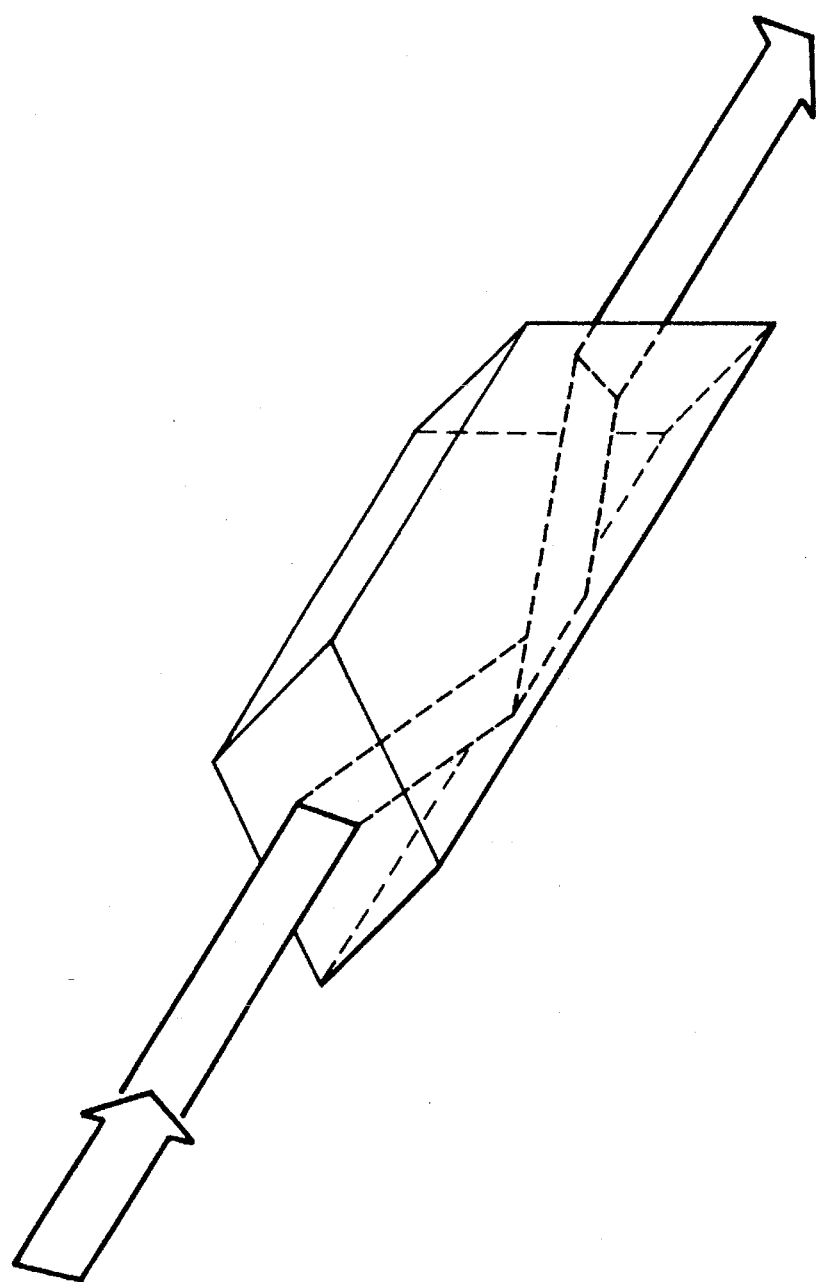

OPTICAL PATH ROTATING DEVICE USED WITH LINEAR ARRAY LASER DIODE AND LASER APPARATUS APPLIED THEREWITH

BACKGROUND OF THE INVENTION

1. Field of the Invention

This invention relates to an optical path rotating device and a laser apparatus using this optical path rotating device. More particularly, this invention relates to a semiconductor laser condenser for condensing semiconductor laser beams into a small spot and a semiconductor-laser-pumped solid state laser apparatus in which solid state laser elements are optically pumped.

2. Description of Related Art

The YAG laser has been used for laser processing or medical applications. However, the YAG laser, which is a solid state laser, has a low electro-optic conversion efficiency. The reason is that only a small portion of emission energy can be used to pump the solid state laser because in the conventional YAG laser, the luminous efficiency of a Xe lamp or a flash lamp used for pumping the solid state laser is low and the spectrum width of light emission is wide. Therefore, the equipment has to be large in size and normally requires cooling water.

On the other hand, the semiconductor laser (LD) has a high conversion efficiency, is compact in size and does not require an extensive cooling system. Recently, the cost of high output semiconductor lasers is decreasing notably. It is desirable to use semiconductor lasers even in the field of laser processing. However, the semiconductor lasers are generally inferior in laser beam quality, and, furthermore, there is a limit to enlarging the output of the single-striped semiconductor laser, so that it is difficult to use the semiconductor laser as is for laser processing. A multi-stripe array semiconductor laser having arranged linearly therein 10 to 100 active layer stripes to serve as a broken-line-shaped light source for emitting laser beams is known as a high output laser.

As for semiconductor lasers of a linear array type having active layer stripes arranged linearly, CW (continuous wave) lasers with high optical power of 20 W are now available on the market. In a multi-stripe array semiconductor laser, as shown in FIG. 1 for example, ten to several tens of 100–200 μm wide stripes having emitters at their ends are arranged at fixed intervals within a flat face of the laser having a total width of about 1 cm.

As described above, one piece of semiconductor laser element provides a light source composed of line segments for emitting ten to several tens of laser beams arranged in line. Some means for condensing a high-level energy in a narrow area should be contrived in order to apply the multi-stripe array semiconductor laser to laser processing or medical applications.

Each stripe beam is emitted from a flat light source, and with reference to the divergence angle of the beam, the vertical component φ in relation to the active layer is about as wide as 40 to 50 degrees, while the horizontal component θ is about as small as 10 degrees. With reference to the widths of each light source, the vertical component is narrow with up to 1 μm, while the horizontal component is wide with 100 to 200 μm as mentioned above.

Due to the characteristics of the semiconductor laser mentioned above, when the emitted beams from the semiconductor lasers are condensed and converged with lenses, the vertical components can be converged easily, but it is difficult to converge the horizontal components into a small spot because the total width of the light sources is wide and the divergence angle of the horizontal components is narrower than of vertical components. D. C. Shannon et. al. disclose in Opt. Lett., 16, 318 ( 1991) an apparatus which uses an aspherical lens to converge the beams of the semiconductor laser array in a spot to pump a solid state laser. However, in this case, there is a great coupling loss of the optical fiber. In addition, the horizontal components of the LD beams cannot be condensed to an area smaller than several millimeters, so that some method needs to be contrived, such as distorting the surface of the solid state laser resonator to match it with the pump space. On the other hand, Yamaguchi et. al. disclose in JP-A-04-078179 (which corresponds to U.S. patent application Ser. No. 07/828,347 by the same assignee of the present patent application) that as shown in FIG. 2, micro lenses are arranged on a one-to-one correspondence with the stripes, and after condensing and collimating the beams from the stripes, this plurality of beams is condensed and superposed on one another by a condenser lens, and by this method, the beams can be converged upon a relatively small area. However, the converged beam spot diameter is a value obtained by multiplying the light source width by the magnification ($f_2/f_1$) determined by the ratio of the distance between the condenser lens and the beam spot (i.e., the focal length $f_2$ of the condenser lens) to the distance between the semiconductor laser stripes and the micro lens array (i.e., the focal length $f_1$ of the micro lenses). Therefore, the length $w_1$ (horizontal component) of the beam spot is a value ($\omega\theta f_2/f_1$) obtained by multiplying the width of a stripe ($\omega\theta$: 100–200 μm) by the above-mentioned magnification. The vertical component of the beam spot does not amount to a large diameter when the width of the vertical component of the light source is multiplied by the same magnification ($f_2/f_1$) because the vertical width is very small (no more than 1 μm). Therefore, in view of the light convergence in the width direction of the stripes, in order to increase the light intensity by reducing the beam spot, it would be better to arrange the micro lenses as distant from the stripes as possible. However, this is difficult to realize because the radiant energy leaking out of the lens apertures located at a distance from the stripes is large owing to the large divergence angle of the vertical components of the stripe beams.

A possible solution is to condense the vertical components and the horizontal components by separate cylindrical lenses and by arranging the lens for condensing the vertical components close to the stripes and the micro cylindrical lenses for condensing the horizontal components remote from the stripes. The micro cylindrical lenses are provided on a one-to-one correspondence with the stripes. A typical LD stripe array product available on the market is one which has twelve stripes having 1 μm thickness and 200 μm width arranged at 800 μm pitches. The adjacent horizontal components of the beams from the stripes, each having a beam divergence angle of 10° overlap each other at about 3.4 mm from the emitter end of the stripes. If the micro lenses are placed beyond this overlapping point, part of the beams travel at a certain angle from the axes of the lenses, and converge at a point different from the focus of the focusing lens, so that the efficiency of the system is reduced. Therefore, in order to collimate the beams from the stripes by using a micro cylindrical lens array, it is necessary to place the lenses at a position less than 3.4 mm away from the stripes (focal distance $f_1 \leq 3.4$ mm). The converged spot diameter is inevitably large when the spot diameter is estimated by multiplying the stripe width by the magnification ($f_2/f_1$) determined by involving the focal distance $f_2$ of the condenser lens for condensing the collimated beams.

As has been discussed, it has been difficult to focus the laser beams in the form of a broken line emitted from the linear array of LDs in a small area at a high energy density.

According to an end surface pumping method for optically pumping the solid state laser in the direction of its optical axis in a semiconductor-laser-pumped solid state laser, a highly efficient emission of single fundamental transverse mode can be realized by matching the pumping space by a semiconductor laser output light width the mode space of solid state laser oscillation.

A multi-stripe array semiconductor laser element having semiconductor laser active layers arranged in a line produces output power of 10 W or more which is sufficient for laser micro processing. If the multi-stripe laser beams can be converged directly into a sufficiently thin spot by using an optical system, the semiconductor laser output should be able to be directly used for laser beam machining.

However, as described above, when the emitted beams from the semiconductor laser generating element are condensed and converged by lenses, the vertical components of the beams may be converged into a small spot, but it is difficult to converge the horizontal components in small areas since the whole width of the light sources is so large.

When such a linear array semiconductor laser is used as a pumping light source, as the array width reaches around 1 cm, a plurality of light beams cannot be converged into a small spot by an ordinary optical system, and for this reason, the end pumping method which is excellent in pumping efficiency cannot be adopted, and therefore a side surface pumping method could only be used with this linear array semiconductor laser as the light source.

SUMMARY OF THE INVENTION

Therefore, it is an object of the present invention to provide a semiconductor laser apparatus with an increased energy density at the light focus of the semiconductor laser apparatus which uses a linear array semiconductor laser.

Another object of the present invention is to provide a novel optical path rotating device to be used in a semiconductor laser apparatus incorporating a linear array semiconductor laser which enables an increase in the energy density by minimizing the light focusing area of the semiconductor laser apparatus.

Yet another object of the present invention is to provide a powerful semiconductor-laser-pumped solid state laser apparatus by using the above-mentioned semiconductor laser apparatus.

In order to achieve the above objects, the semiconductor laser apparatus according to the present invention comprises a linear array laser diode having a plurality of long, narrow emitters for emitting laser beams arranged in a line in the lengthwise direction; a first collimating element for collimating the laser beams emitted by the emitters or groups of the multiple emitters in a direction perpendicular to the lengthwise direction of the emitters; an optical path rotating device for rotating by a right angle the emitter length-wise axis of the cross section of each laser beam collimated only in one direction and outputting the rotated laser beams; a second collimating element for collimating the laser beams output from the optical path rotating device in a direction corresponding to the lengthwise direction of the emitters; and a focusing element for condensing the laser beams collimated in two directions.

The laser beams from the long and narrow emitters, arranged like a dotted line, of the linear array laser diode have a small divergence angle in the longitudinal direction of the emitters and a large divergence angle in the direction perpendicular to the emitters, and therefore unless different focusing powers are applied to these two directions, the radiant energy cannot be concentrated in a sufficiently small area. As described above, the divergence angle of the laser beam is small in the width direction of the laser diode and moreover the whole width of the laser beams emitted from the linear array laser diode is large in accordance with the width of the linear array laser diode. Therefore, it is difficult to concentrate the radiant energy in a small area. In the semiconductor laser apparatus of the present invention, however, the laser beams from the long and narrow emitters, arranged like a dotted line, of the linear array laser diode are received by the first collimating element, which changes the beams into substantially collimated beams in planes perpendicular to the emitters by refracting the beams to a direction perpendicular to the emitters. The light beams are incident on the optical path rotating device, and while their advancing directions are changed, the directions corresponding to the transverse axes of the emitters are rotated substantially up to a right angle. The beams emitted with anisotropical divergence are, as they pass through the second collimating element, refracted by different condensing powers of the second element to a direction perpendicular to the transverse axes of the emitters to become substantially parallel beams, and then focused to a spot by the focusing element. For this reason, the semiconductor laser apparatus which converges the laser energy produced by the linear array laser diode into a very small area can be used for laser processing or for medical purposes.

In order to achieve the above objects, the optical path rotating device of the present invention comprises a plurality of optical elements, each receiving a beam emitted in the form of a slit, rotating the slit direction in the cross section of the beam substantially by a right angle about the optical axis and emitting the beam, wherein the light receiving faces and the light emitting faces of the optical elements are arranged in a line respectively without space between adjacent elements in such a way that each of the optical elements faces a corresponding light-emitting face or a group of the light-emitting faces of the linear array laser diode. In other words, the optical path rotating device of the present invention is arranged to rotate by a substantially right angle about the optical axis the directions corresponding to the emitters of the laser beams emitted from the line-shaped emitters or groups of emitters of the linear array semiconductor laser. When the optical path rotating device of the present invention is disposed in front of the linear array semiconductor laser, the optical elements of the device receive the laser beams emitted from the emitters or the groups of emitters, and rotate the directions corresponding the transverse axis of the emitters of the laser beams by a right angle around the optical axis. Therefore, in the laser beams output from the optical path rotating device, component beams from the respective optical elements have the directions corresponding the transverse axis of the emitters rotated by a right angle, that is, as many beams as the optical elements are arranged side by side like the rungs of a ladder. Consequently, the results can be obtained as if the emitters of the linear array semiconductor laser were arranged like the ladder rungs. It is easy to focus the beams in a direction perpendicular to the transverse axis of the emitters, and it is also easy to converge the beams from the parallel emitters lined up like ladder rungs at a very small area. Therefore, a semiconductor laser apparatus which offers effects of substantially arranging the emitters of the linear array semiconductor laser in the form of ladder rungs by using the optical path rotating device of the present invention can concentrate the energy of the linear array semiconductor laser in a very small spot.

Furthermore, the semiconductor-laser-pumped solid state laser apparatus of the present invention has the solid state laser arranged its pumping-light-receiving end face at the focus of the above-mentioned laser beams from the semiconductor laser apparatus.

By the arrangement as described, the semiconductor-laser-pumped solid state laser apparatus of the present invention is capable of end pumping by using a powerful semiconductor laser, and therefore a solid state laser output can be obtained with a good quality beam and with high efficiency.

BRIEF DESCRIPTION OF THE DRAWINGS

FIG. 5 is a plan view of the semiconductor laser apparatus of the present invention using QCWLD or the like;

FIG. 13 is a perspective view of an optical path rotating device of the present invention having the optical elements in FIG. 3 arranged in parallel;

FIG. 15 is a perspective view showing an optical element shaped in the form of a frustum of tetrahedron;

FIG. 19 is a diagram for explaining the principle of the oblique prism;

FIG. 29 is a perspective view showing an optical element formed by a dove prism;

DESCRIPTION OF THE PREFERRED EMBODIMENTS

The present invention will be described with reference to the accompanying drawings.

Embodiment 1

Figure 1:
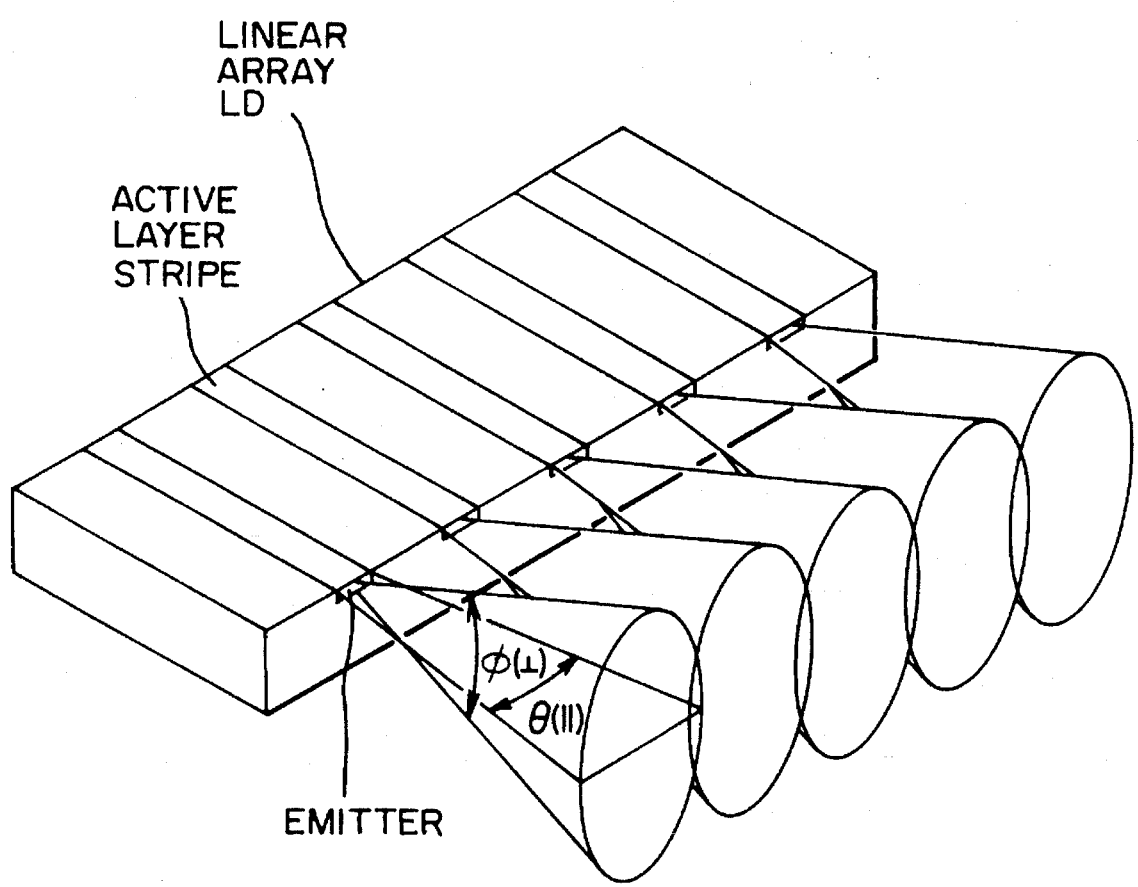
FIG. 1 is a diagram for explaining the directivity of laser beams of a linear array laser diode.
Figure 2:
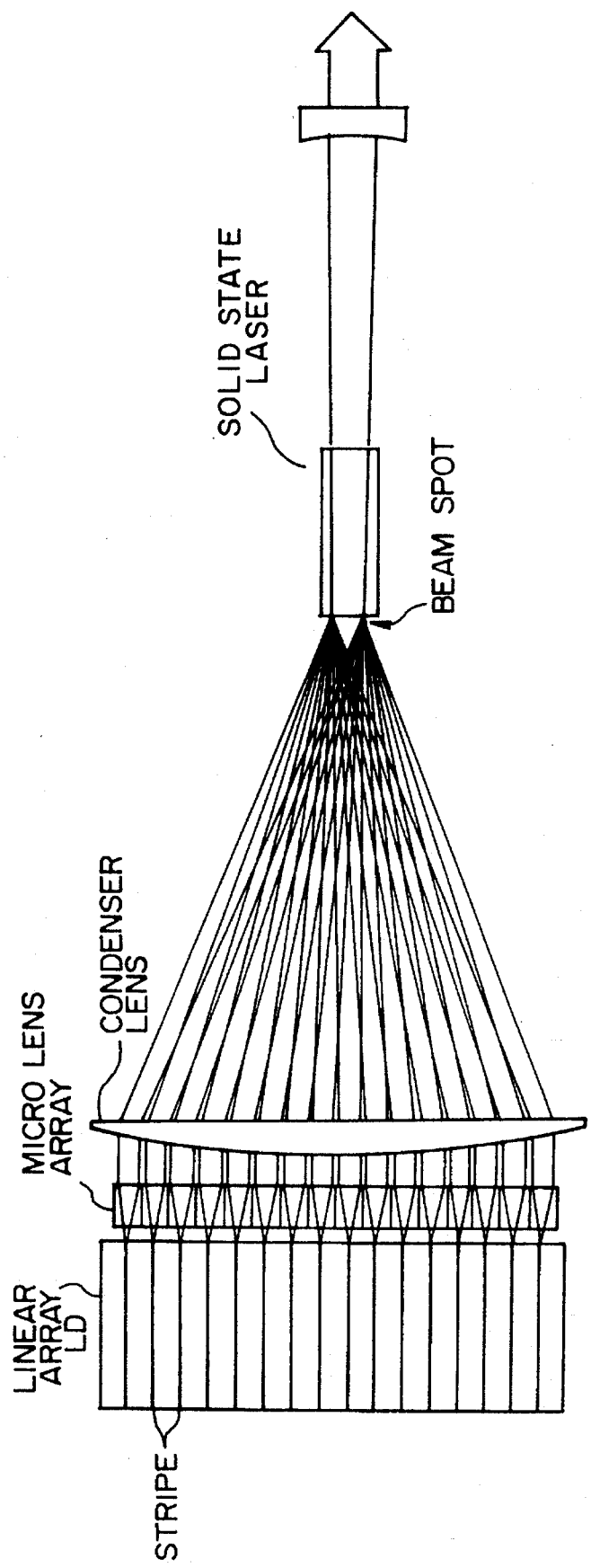
FIG. 2 is a block diagram for explaining a semiconductor laser apparatus of the prior art.
Figure 3:
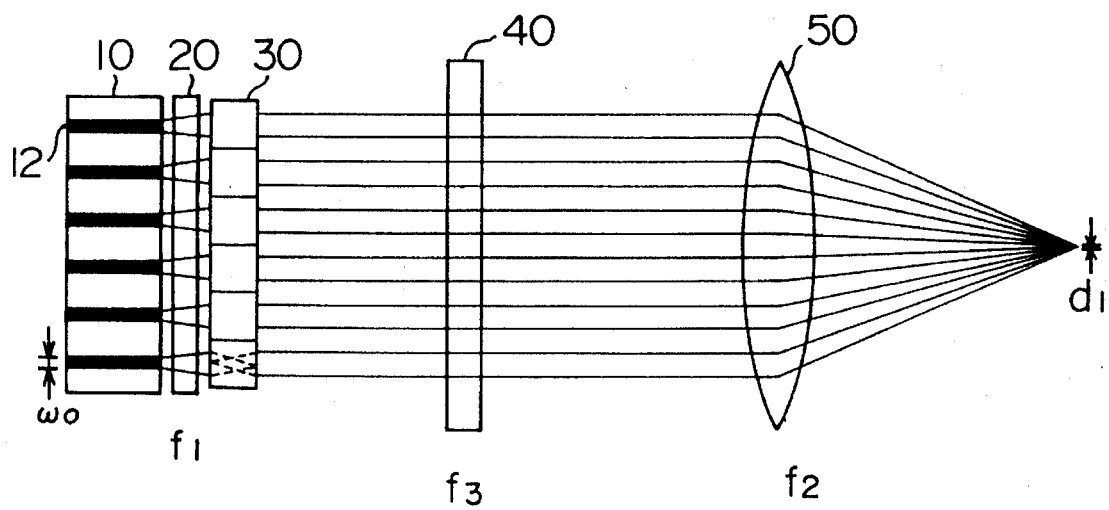
FIG. 3 is a plan view of a semiconductor laser apparatus of the present invention.
Figure 4:
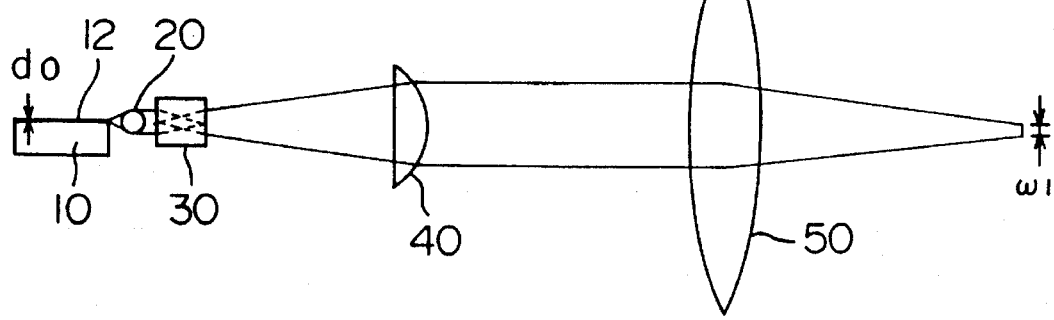
FIG. 4 is an elevation of the semiconductor laser apparatus shown in FIG. 3.

FIG. 3 is a plan view of the semiconductor laser apparatus of the present invention, and FIG. 4 is its elevation view.

A multi-stripe array semiconductor laser 10, which is an example available on the market, has arranged in a row being 1 0-mm long 10 to 100 pieces ( 12 pieces for example, but six pieces are shown in the figure for simplicity's sake) of active layer stripes designated by numeral 12 for emitting laser beams. The cross section of each active layer stripe 12 is 100 to 200 μm wide and 0.1 to 1 μm thick, for example, and in a laser beam radiated from the end face of an active layer stripe, the divergence angle expanding in the thickness direction of the stripe is 40 to 50 degrees and the divergence angle expanding in the width direction is about 10 degrees. Under these conditions, the active layer stripe 12 serves as a light source. The active layer stripes are arranged in a row at the end face of the multi-stripe array semiconductor laser 10, so that the radiation from the semiconductor laser is shaped like a dotted line.

The first cylindrical lens 20 has a condensing power for condensing the laser beams from the multi-stripe array semiconductor laser 10 in the thickness direction of the active layer stripes, and therefore the lens 20 changes the radiant beams as the components normal to the active layer stripes into parallel beams. The first cylindrical lens 20, having a uniform length in its width direction, allows the light to travel substantially straight, and therefore the divergence angle of the laser beams in the width direction remains about 10 degrees.

An optical path rotating device 30 rotates the cross section of the laser beams incident from the first cylindrical lens 20 by substantially 90 degrees with respect to the cross section at the position of the incident light. The optical path rotating device 30 includes optical elements on a one-to-one correspondence with the active layer stripes 12 of the multi-stripe array semiconductor laser 10, and the optical elements are arranged linearly so as to correspond to the respective active layer stripes. As they pass through the first cylindrical lens 20, the laser beams travel at a divergence angle of about ten degrees in the width direction and in parallel in the thickness direction (see FIG. 3). Rotated about 90 degrees with respect to the respective active layer stripes by the optical path rotating device 30, the laser beams are changed into parallel beams in the width direction but have a divergence angle of about ten degrees expanding in the thickness direction (see FIG. 4). Note that the optical elements may be provided such that each optical element covers a group of multiple active layer stripes.

The laser beams whose optical paths have been rotated about 90 degrees are arranged in the same number of parallel lines as the number of the active layer stripes or the number of the groups of stripes, and therefore the radiant beams of the multi-stripe array semiconductor laser 10 are substantially the same as those when the active layer stripes are arranged in a row like ladder rungs.

The second cylindrical lens 40 is placed in parallel with the multi-stripe array semiconductor laser 10 in the width direction of the semiconductor laser 10.

Of the laser beams which were emitted from the multi-stripe array semiconductor laser 10 and passed through both the first cylindrical lens 20 and the optical path rotating device 30, the light components normal to the active layer stripes become parallel beams separately for the respective active layer stripes, and the laser beams have a divergence angle of about ten degrees, expanding in the width direction. Since the laser beams are arranged in the form of ladder rungs, the whole of the laser beams from the overall length of the emission face of the semiconductor laser has a divergence angle of about ten degrees. The second cylindrical lens 40 receives the laser beams and changes them into parallel beams as viewed from above, so that the laser beams are now parallel beams as viewed both in the width and thickness directions.

A focusing lens 50 focuses the laser beams, which have become the complete parallel beams as they passed through the second cylindrical lens, into a small beam spot.

Let us here designate the focal distance of the first cylindrical lens 20 as $f_1$, the focal distance of the second cylindrical lens 40 as $f_3$, the focal distance of the focusing lens 50 as $f_2$, and the width and thickness of the active layer stripe as $\omega_0$ and $d_0$. Then, the width $\omega_1$ and thickness $d_1$ of the beam spot of the laser beam from the active layer stripe can be obtained as follows.

$$d_1 = d_0 * f_2/f_1$$

$$\omega_1 = \omega_0 * f_2/f_3$$

Therefore, in order to obtain a sharp spot, the greater are $f_1$ and $f_3$, the better. Considering that $\omega_0$ is 100 to 200 μm and $d_0$ is 0.1 to 1 μm, the magnitude of $f_1$ is of no significance compared with $f_3$. In the case where the stripe width $\omega_0$ is 200 μm, the stripe pitch is 800 μm and the divergence angle expanding in the length-wise direction of the stripes is ten degrees, the laser beam from the adjacent stripes overlap each other at 3.4 mm away from the stripe face as they are widening in the lengthwise direction of the stripes.

Therefore, when the optical path rotating device of the present invention is not used, in order to utilize output energy with high efficiency, the first and second cylindrical lenses need to be placed at a distance of 3.4 mm or less from the stripe face, and in order to collimate the laser beams, the focal distances $f_1$ and $f_3$ must be 3.4 mm at the longest. However, if the first cylindrical lens with $f_1$ of a suitable value of 3.4 mm or less is placed at a distance of 3.4 mm or less away from the stripe face and the laser beams are rotated by the optical path rotating device of the present invention, the laser beams become parallel beams in a direction in which the laser beams corresponding to the active layer stripes are arranged in parallel, and they never overlap each other. Those parallel beams widen at an angle of about ten degrees in a direction parallel with FIG. 4 on the paper. To change the radiant beams into parallel beams by the second cylindrical lens, it is possible to set a sufficiently large value for the focal distance $f_3$. In other words, $f_3$ is not limited by the maximum value of 3.4 mm, but any value can be selected for $f_3$. When the same value as the focal distance of the condenser lens is selected, the beam spot width $\omega_1$ will be 200 μm. As has been described, according to the laser apparatus of the present invention, the width $\omega_1$ and thickness $d_1$ can be reduced to sufficiently small values, with the result that a powerful laser which efficiently utilizes the output of the linear array laser diode can be obtained. Therefore, the laser apparatus of the present invention can be used for laser processing or as a laser knife in medical treatment.

Figure 5:
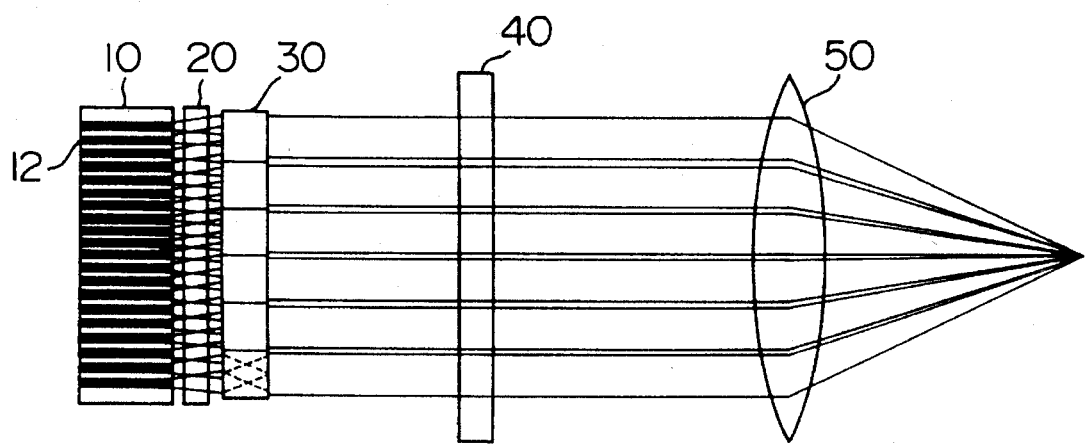

FIG. 5 is a plan view of the semiconductor laser apparatus of the present invention when a quasi-continuous wave laser diode QCWLD or the like with a high energy density at the light emitter is used as a linear array laser diode. The linear array laser diode 10 has a large number of active layer stripes 12 provided with high density, thus forming a linear light emitter with substantially no separation. The optical path rotating device 30 having arranged linearly an adequate number of optical elements regardless of the size of the active layer stripes or in a size corresponding to a specified number of stripes. The positions and functions of the first cylindrical lens 20, optical path rotating device 30, second cylindrical lens 40, and focusing lens 50 are the same as those described with reference to FIG. 3. When a laser diode including active layer stripes short in width or narrow in pitch is used, there is a problem that if it is necessary to install the optical elements of the optical path rotating device so as to correspond one to one with the active layer stripes, then it is difficult to manufacture the optical path rotating device. This embodiment has been made to solve this problem, more specifically, the above-mentioned correspondence is achieved by collecting the active layer stripes into groups of a certain number of stripes. It is also possible to take such a view about this embodiment as follows: the emitter portion of the laser diode is looked on as a single stripe instead of a number of dots, and by dividing the stripe into a suitable number of subdivisions by the optical elements and rotating them laser diode emitting light beams are substantially in the form of ladder rungs.

Figure 6:
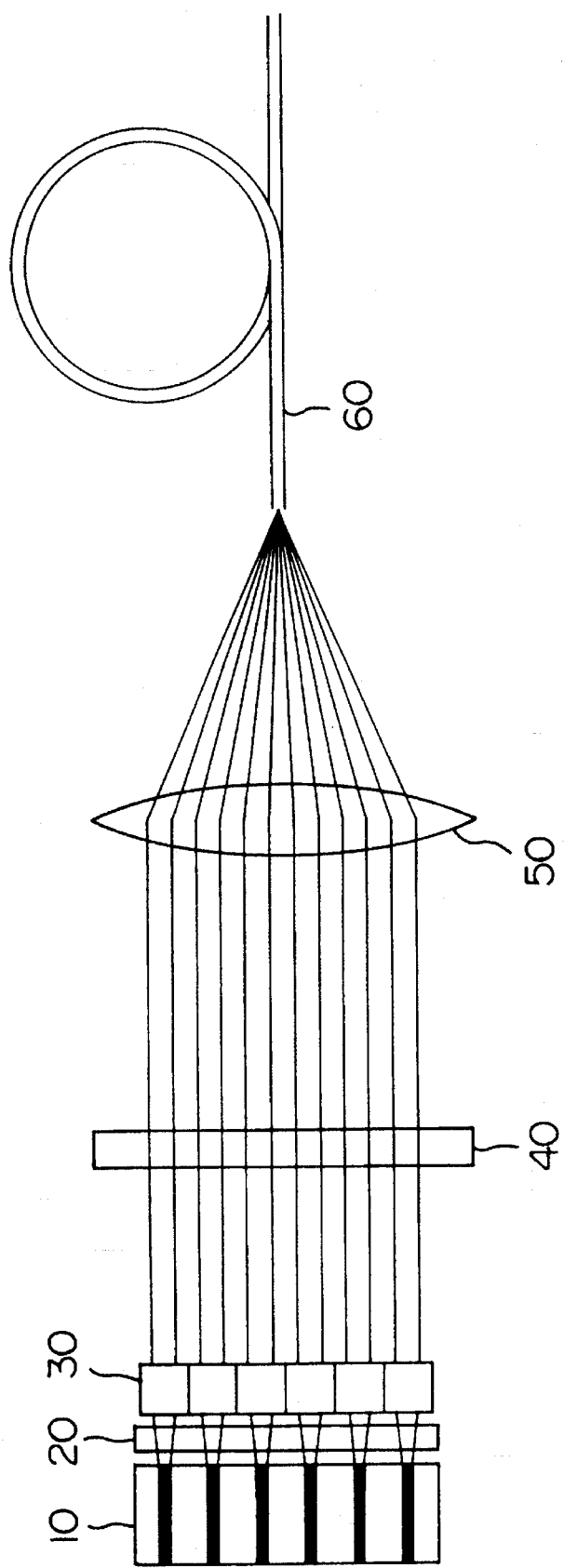
FIG. 6 is a plan view of the semiconductor laser apparatus of the present invention using optical fiber.
Figure 7:
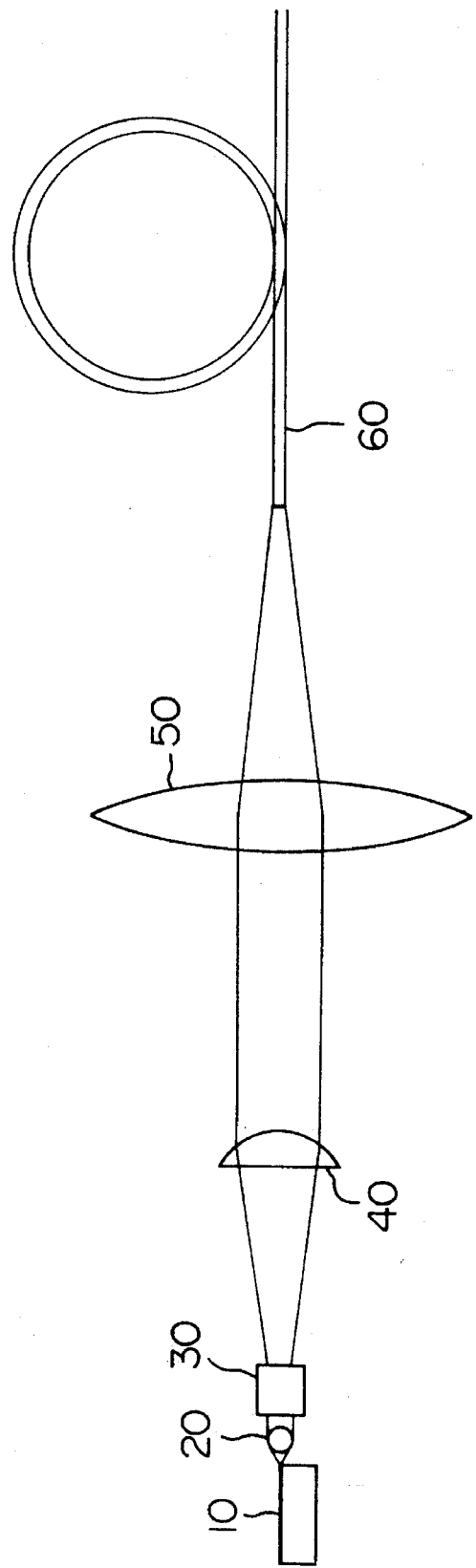
FIG. 7 is an elevation of the semiconductor laser apparatus shown in FIG. 6.

FIG. 6 is a plan view of the laser apparatus according to the present invention using an optical fiber 60, and FIG. 7 is its elevation view. A light receiving end face of the optical fiber 60 is placed at a position of a laser light spot formed by the laser apparatus, and the laser energy radiated by the laser 10 is transmitted through the optical fiber 60 to the other end face. An easy-to-use laser apparatus can be obtained which has the length and flexibility of the optical fiber 60 to enable the emitter portion to be easily brought into the site of use. A laser apparatus which used the linear array laser diode 10 with an output of 10 W as the light source and formed a small laser light spot smaller than the cross section of the core on the incident face of the optical fiber 60 with a core diameter of 400 μm performed with the efficiency of 60%.

Embodiment 2

Figure 8:
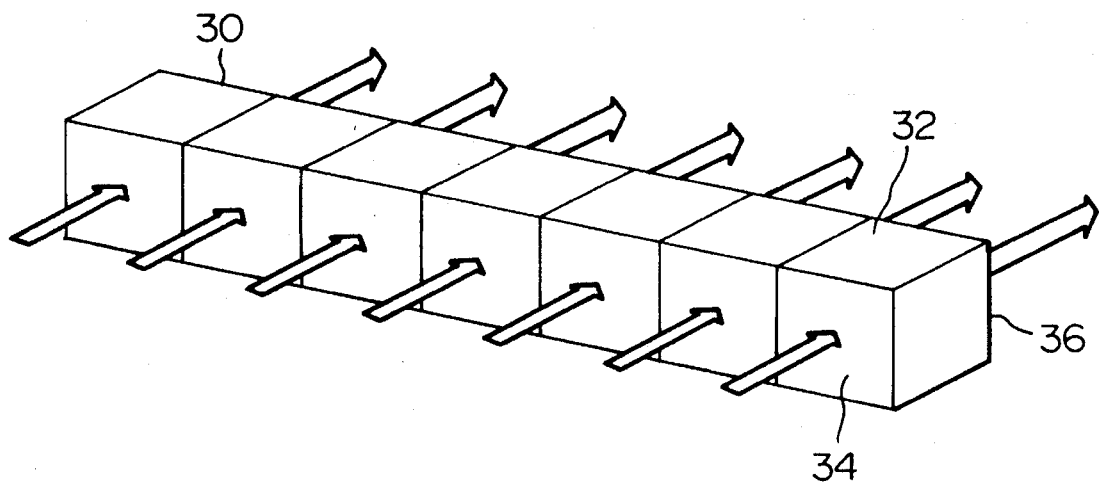
FIG. 8 is a block diagram for explaining an optical path rotating device of the present invention.
Figure 9:
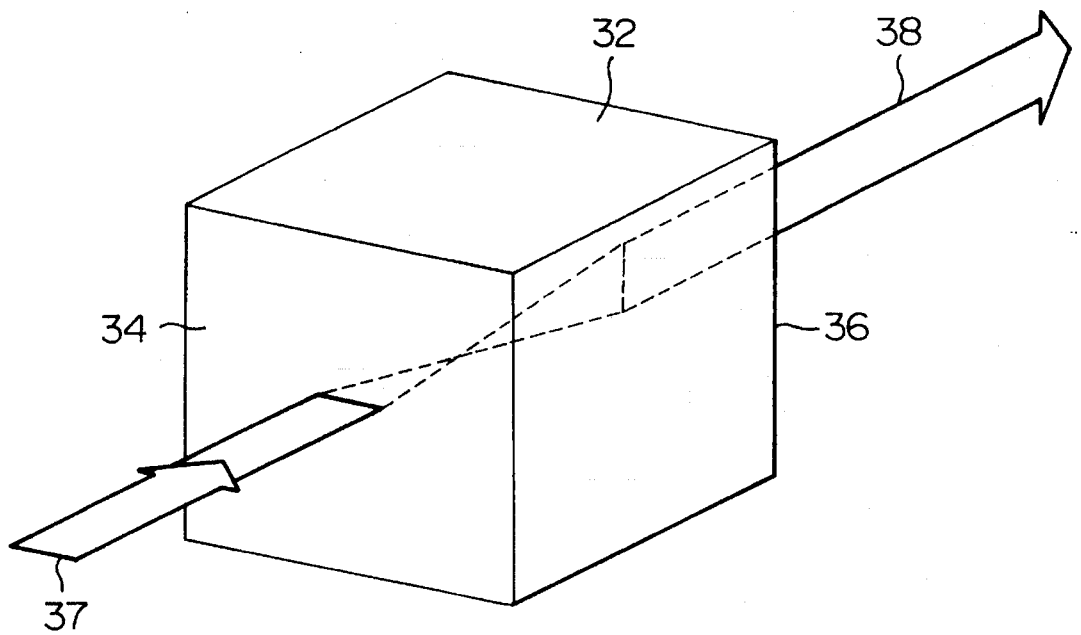
FIG. 9 is a block diagram for explaining the function of an optical element as a component of the optical path rotating device.

FIG. 8 is a block diagram for explaining the optical path rotating device according to the present invention, and FIG. 9 is a diagram for explaining the function of the optical element as a component of the optical path rotating device. The optical path rotating device 30 is formed in a rectangular shape by connecting a suitable number of optical elements 32 in the longitudinal direction of the device as shown in FIG. 8. The length of the optical path rotating device is set to correspond to the emitter face of the linear array laser diode. The optical element 32 has a light receiving face 34 for receiving a laser beam 37 perpendicularly to this receiving face. The laser beam 37 has the direction corresponding to the traverse axis of the active layer stripe parallel to the longitudinal direction of the optical path rotating device as shown in FIG. 9. The optical element 32 also has an output face 36 for outputting a laser beam perpendicularly from the output face. The output laser beam has its optical path twisted as it undergoes a process of twisting the optical path about the optical axis inside the optical element. The optical path element 32 accepts the laser beam 37 emitted from the active layer stripe which is placed in repetition by 800 μm pitches, for example, and having the direction corresponding to the transverse axes of the stripes in the horizontal direction and rotates the orientation of the cross section of the accepted laser beam by substantially 90 degrees. The angle relationship between the light receiving and outputting faces may be set as one pleases, but it is most desirable in design of the apparatus that both faces are parallel to each other and the direction of the optical axis of the incident light is maintained. When the light receiving and outputting faces are not parallel with each other, it is easy to change the direction of the optical axis by having reflected the emerging light at a fixed angle to the direction of incidence and direct the emerging light in a direction desirable for reasons of the construction of the apparatus.

The optical elements 32 used in the optical path rotating device 30 are placed in a one-to-one correspondence with the active layer stripes 12 of the linear array laser diode 10 used in the laser apparatus which generally incorporates an optical path rotating device. Therefore, when a linear array laser diode having 12 active layer stripes arranged at 800 μm pitches, for example, the optical path rotating device has 12 optical elements arranged at 800 μm pitches.

However, when active layer stripes are arranged with high density as in the embodiment shown in FIG. 5, by regarding the laser beams as a single beam emitted from a continuous line, dividing the "continuous" laser beam at suitable intervals and turning the divided laser beams about 90 degrees, respectively, the linear array laser diode can be treated as one that has a ladder-shaped emitter section substantially having the divided emitters with a width corresponding to the subdivision interval. To this end, it is only necessary to arrange in parallel a suitable number of optical elements regardless of the number of the active layer stripes.

To comply with the flatness of the emitter face of the linear array laser diode, it is convenient in terms of the construction of the laser apparatus to provide the incidence face 34 and the emergence face 36 of the optical path rotating device 30 as separate flat faces through the overall length of the optical path rotating device. It is possible to divide a single incident light into two optical paths in the optical element and emit the beams from two faces of emergence. In this case, too, the faces of emergence are provided as two separate flat faces.

The above-mentioned optical element 32 can be formed on various principles.

Figure 10:
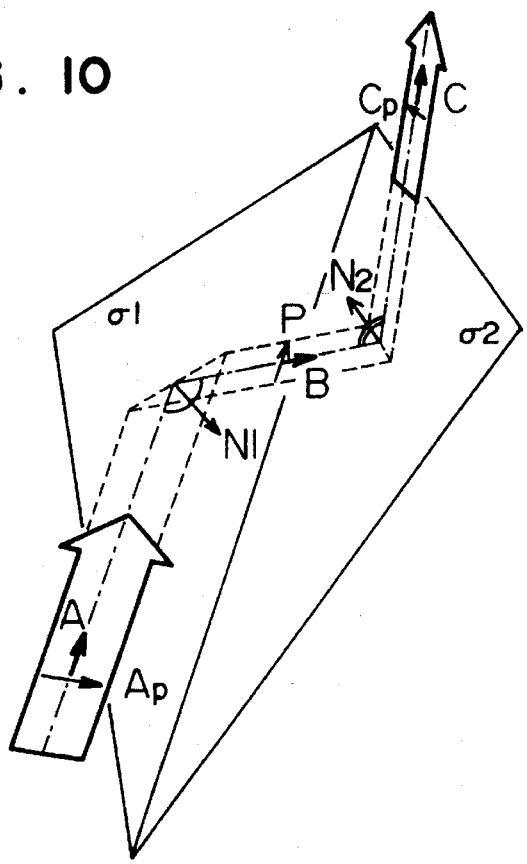
FIG. 10 is a diagram for explaining the principle of a case where the optical path is rotated by a combination of two reflecting faces.

FIG. 10 is a diagram for explaining the principle in a case where the optical path is changed by a combination of two reflecting faces. In an optical element having a face of incidence which a incident light enters perpendicularly thereto and a face of emergence from which an emerging light emerges perpendicularly, there are provided a first reflecting face $\sigma_1$ having a unit normal vector $N_1$ and a second reflecting face $\sigma_2$ having a unit normal vector $N_2$. The incident light having a unit vector A of the optical axis and a unit vector Ap representing the transversal axis direction of a laser diode is incident on the first reflecting face, and reflected by this face, becomes a reflected light having a unit vector B of the optical axis and a unit vector Bp representing the transversal axis direction of the laser diode. Subsequently, the reflected light is incident on the second reflecting face, and further reflected by this face, becomes an emerging light having a unit vector C of the optical axis and a unit vector Cp representing a transversal axis direction of the laser diode and is output from the optical element. By setting the angles of the two reflecting faces so that a specified relation is established between them, the incident light is reflected twice by the two reflecting faces in order to change the direction of the optical axis by an angle $\theta$, and at the same time, by turning the direction of the laser beam corresponding to the length of the laser diode about the optical axis, so that the orientation of the cross section of the incident light is eventually turned about 90 degrees as compared with that when the light fell on the face of incidence.

Figure 11:
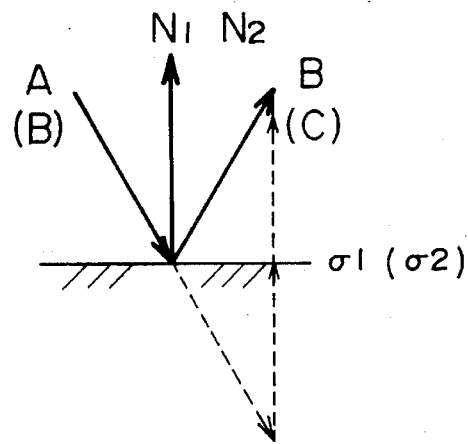
FIG. 11 is a diagram for explaining the conditions of reflection on the reflecting face.

FIG. 11 is a diagram for explaining the condition of reflection at the reflecting face. It is obvious from FIG. 11 that when the incident light A is reflected by the reflecting face $\sigma_1$ with a normal $N_1$, and becomes a reflected light B, the following relation holds:

$$B = A - 2(A \cdot N_1)N_1 \tag{1}$$

where A·N is an inner product of the unit vectors A and N, for example.

It is also understood that when the reflected light B is reflected by the reflecting face $\sigma_2$ of the normal $N_2$ and becomes an emerging light C, the following relation holds:

$$C = B - 2(B \cdot N_2)N_2 \tag{2}$$

A similar relation holds also among Ap, Bp and Cp. That is, $$Bp = Ap - 2(Ap \cdot N_1)N_1 \tag{3}$$

$$Cp = Bp - 2(Bp \cdot N_2)N_2 \tag{4}$$

Since the optical axis of the incident light and the transversal axis direction of the laser diode perpendicularly intersect each other, $$A \cdot Ap = 0 \tag{5}$$

If an angle between the incident light A and the emerging light C is designated by $\theta$, $$A \cdot C = \cos \theta \tag{6}$$

Because the condition for the optical path rotating device is that the unit vector Ap of the incident light which corresponds to the transversal axis of the laser diode perpendicularly intersects with the unit vector Cp of the emerging light which corresponds to the transversal axis of the laser diode, then $$Ap \cdot Cp = 0 \tag{7}$$

From equations (1), (2) and (6), the following equation must hold.

$$(N_1 \cdot A)^2 + (N_2 \cdot A)^2 - 2(N_1 \cdot A)(N_2 \cdot N_2) = (1 - \cos\theta)/2 \tag{8}$$

From equations (3), (4) and (7), the following equation must hold.

$$(N_1 \cdot Ap)^2 + (N_2 Ap)^2 - 2(N_1 \cdot Ap)(N_2 \cdot Ap)(N_1 \cdot N_2) = \frac{1}{2} \tag{9}$$

The incident light falls perpendicularly to the face of incidence, and therefore the normal vector of the face of incidence is A. On the other hand, the emerging light is emitted perpendicularly from the face of emergence, and therefore, the normal vector of the normal line of the face of emergence is C.

Therefore, the relation among the incidence face, emergence face, two reflecting faces of the optical path rotating device of the present invention, and the incident light is regulated by three equations (5), (8) and (9).

If the optical path rotating device is formed by a space defined by two reflecting faces, the incidence face and the emergence face are mere imaginary faces without substance.

In an optical path rotating device formed by using a combination of three or more reflecting faces, because the reflecting faces have a great degree of freedom, it is difficult to express the relation among the items by a relatively simple relational expressions as shown above.

For example, when three reflecting faces are provided, equations similar to equations (8) and (9) can be obtained as follows.

$$(A \cdot N_1)^2 + (A \cdot N_2)^2 + (A \cdot N_3)^2 - 2(A \cdot N_1)(N_1 \cdot N_2)(N_2 \cdot A) -$$
$$2(A \cdot N_2)(N_2 \cdot N_3)(N_3 \cdot A) - 2(A \cdot N_3)(N_3 \cdot N_1)(N_1 \cdot A) +$$
$$4(A \cdot N_1)(N_1 \cdot N_2)(N_2 \cdot N_3)(N_3 \cdot A) = (1 - \cos \theta)/2$$

$$(Ap \cdot N_1)^2 + (Ap \cdot N_2)^2 + (Ap \cdot N_3)^2 -$$
$$2(Ap \cdot N_1)(N_1 \cdot N_2)(N_2 \cdot Ap) - 2(Ap \cdot N_2)(N_2 \cdot N_3)(N_3 \cdot Ap) -$$
$$2(Ap \cdot N_3)(N_3 \cdot N_1)(N_1 \cdot Ap) +$$
$$4(Ap \cdot N_1)(N_1 \cdot N_2)(N_2 \cdot N_3)(N_3 \cdot Ap) = 1/2$$

As a more practical method, it is possible to consider as follows.

The reflected light beam obtained by having the incident beam reflected twice by the two reflecting surfaces has its optical axis different by angle θ from that of the incident beam according to equation (8). Therefore, by setting a third reflecting face in a suitable direction determined by the relation with this angle θ, the above-mentioned reflected beam can be made to emerge in the same direction as the incident beam by having it reflected by the third reflecting face. At this time, the positions of the reflecting faces are arranged such that the position of the emerging beam which corresponds to the position of the laser beam emitting active layer stripes is to be rotated 90 degrees with respect to the incident beam. The optical path rotating device, including a plurality of optical elements as mentioned above, can achieve the object of the present invention as if the active layer stripes of the linear array laser diode are substantially distributed in the form of ladder rungs. Thus, a typical optical path rotating device constructed by combining three reflecting faces can be obtained.

Figure 12:
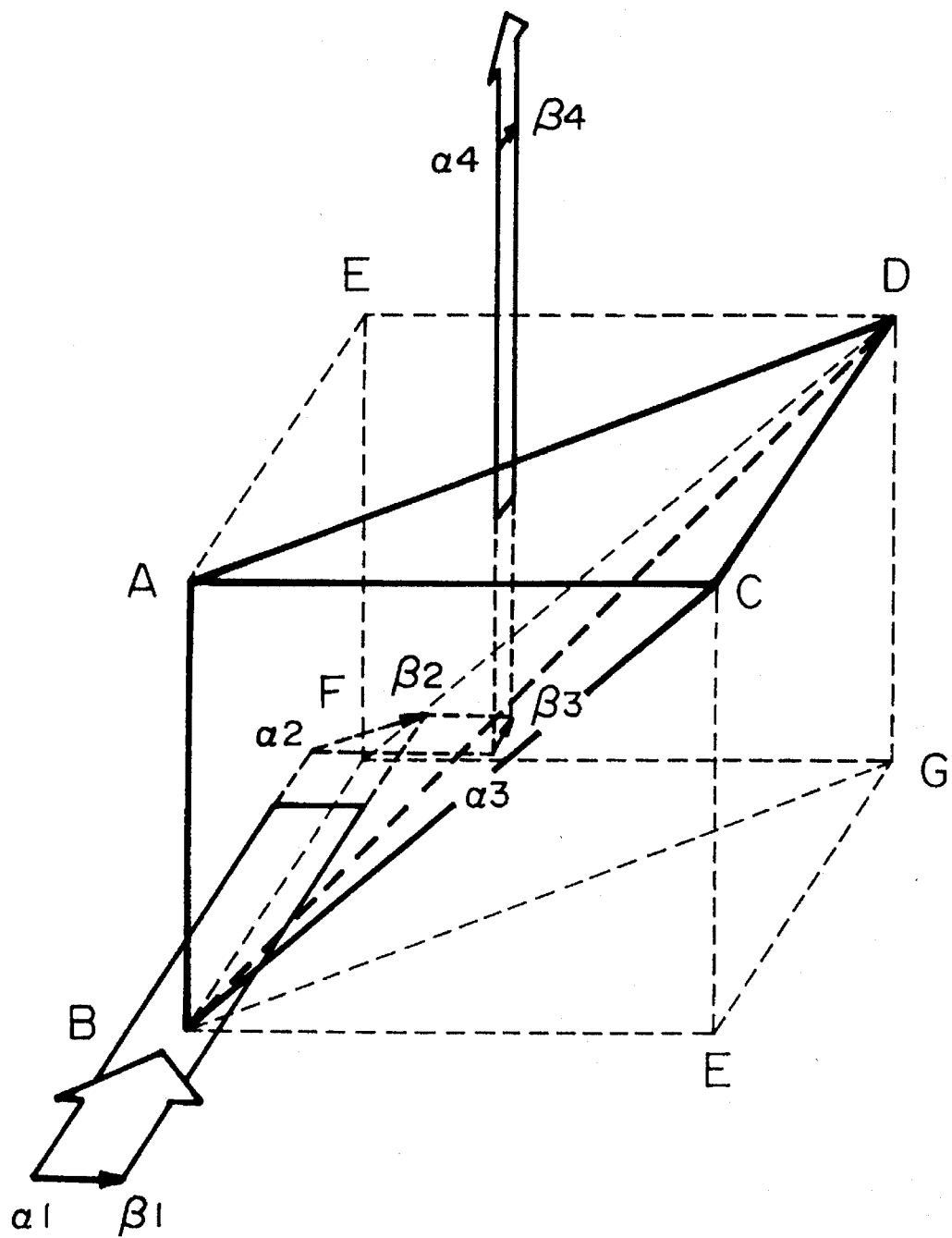
FIG. 12 is a perspective view of an optical element in the form of a tetrahedron.

The optical path rotating device can be constructed by using prisms. In this case, the above-mentioned reflecting faces correspond to the internal reflecting faces of the prisms. The simplest type of an optical path rotating device using a prism is one that uses an optical element in the form of a tetrahedron. FIG. 12 is a perspective view showing the simplest optical element shaped as a tetrahedron prism having two reflecting faces.

The tetrahedron prism of FIG. 12 is expressed by solid lines in a cube ABECDEFG. In other words, the optical element is a tetrahedron prism defined by a plane of incidence ABC, a plane of emergence ACD, a first reflecting plane ABD, and a second reflecting plane BCD. The plane of incidence ABC is a part of the front face ABEC of the cube, and the normal is arranged so as to be in parallel with the optical axis of the incident beam, that is, so as to intersect perpendicularly to the incident beam. The first reflecting plane ABD is formed by a part of a plane ABGD bisecting the cube, and is vertical and intersects obliquely at 45 degrees to the optical axis of the incident beam. The second reflecting plane BCD is formed by a part of another plane BCDF bisecting the cube, and is inclined at 45 degrees to horizontal, and is parallel with the optical axis of the incident beam. The plane of emergence ACD is a part of the top face ACDE of the cube.

The incident beam is a laser beam emitted from an active layer stripe of the linear array laser diode, and its horizontal direction corresponds to the active layer stripe. The incident beam falls perpendicularly to the plane of incidence ABC, substantially all radiated energy passes through the plane of incidence, and then the beam enters the first reflecting plane ABD. The first reflecting plane is vertical, but degrees inclined to the incident beam, and therefore while the optical axis of the incident beam is kept horizontal, the incident beam travels in parallel with the face of incidence of the optical element, and enters the second reflecting plane BCD. The second reflecting plane is inclined at 45 degrees to horizontal, and therefore the incident beam is reflected on the second reflecting plane and advances vertically upwards. The reflected beam from the second reflecting plane is incident perpendicularly to the plane of emergence ACD, and therefore without changing its direction, advances vertically upwards.

At this time, the direction of the incident beam corresponding to the active layer stripe changes at the first reflecting plane to the direction opposite to the optical axis, but both directions lie in the same horizontal plane. When the reflected beam is reflected on the second reflecting plane, its direction corresponding to the active layer stripe changes 90 degrees, and exists in the vertical plane.

The shape of the triangular prism will be described in detail. Triangles ABC and CDA are isosceles right triangles, the sides AB, AC and CD are equal in length, and an angle BAC and an angle DCA are right angles. A triangle ABD and a triangle CDB are right angled triangles having a right angle BAD and a right angle DCB, respectively. A face ABC and a face CDA intersect at right angles to each other, and the angle formed by the face ABC and the face ABD and the angle formed by the face CDA and the face CDB are 45 degrees. The face on which the light is incident is the face ABC, the face of emergence is the face CDA. As shown in FIG. 8, the light beam which is incident on the face ABC is reflected totally on the face ABD and then on the face CDB, and emerges from the face CDA. If the light beam emitted from the linear light source and is incident on the face ABC is designated as a line segment $\alpha_1\beta_1$, the line segment $\alpha_1\beta_1$ is reflected totally at the line segment $\alpha_2\beta_2$ in the face ABD and at the line segment $\alpha_3\beta_3$ in the face CDB, and emerges as the line segment $\alpha_4\beta_4$ in the face CDA.

In a multi-stripe array semiconductor laser having active layer stripes arranged linearly, generally 10 to 100 stripes about 100 to 200 μm wide are arranged at fixed pitches in a flat section about 1 cm wide. Therefore, this semiconductor laser serves as a light source in a dotted line emitting 10 to 100 laser beams. Since each stripe-shaped light beam is emitted from a flat light source, the beam divergence angle is about 40 to 50 degrees large for the vertical light component with respect to the active layer, and about 10 degrees small for the horizontal light component. The width of each light source is as small as 0.1 to 1 μm for the vertical component, and as large as 100 to 200 μm for the horizontal component. As a result, when the incident beams from the semiconductor laser are condensed and converged by using lenses, the vertical components can be easily converge, but it is difficult to converge the horizontal components into a tiny spot because the total width of the light sources is large. Therefore, a possible solution for the above-mentioned difficulty is to use micro lenses arranged on a one-to-one correspondence with the stripes to condense and collimate the beams and then converge the beams with a lens. The diameter of the converged beam spot is a spot diameter obtained by multiplying the width of the stripes by a magnification determined by a ratio between the distance from the micro lenses to the beam spot and the distance from the stripes to the micro lenses.

For this reason, it may be better to arrange the micro lenses as far away from the stripes as possible, but this is difficult in view of the wide divergence angle of the vertical components of the stripe beams. A possible solution is to use separate lenses to converge the vertical and horizontal components. To be more specific, a lens for converging the vertical components is placed at a close distance from the stripes and a lens for converging the horizontal components at a remote position. However, when the divergence angle for the horizontal components is 10 degrees, the adjacent stripe beams overlap when the lens is positioned beyond a certain distance, so that the distance at which the lens is set remotely is limited. In order to converge the beams at a position remote from the active layer stripes, it is necessary to take some measures to prevent the stripe beams from overlapping one another.

To prevent the adjacent stripe beams from overlapping each other, the positions of the stripe beams are changed by using prisms as if the active layer stripes arranged in a dotted line were turned 90 degrees respectively and arranged in a ladder form. More specifically, prisms as shown in FIG. 12 are arranged on a one-to-one correspondence with the stripes. So, a stripe beam $\alpha_1\beta_1$ is converted by twice total reflection in the prism into a stripe beam $\alpha_4\beta_4$. After all, when there are a number of stripes, the arrangement is converted seemingly into the form of a ladder. If the vertical component of the stripe beam with respect to the active layer is converged by a cylindrical lens 20 placed at a very close distance from the stripe and if for the horizontal component a cylindrical lens 40 is arranged such that the emerging beam from the tetrahedron prism is reflected by a right angle prism, and after the optical axis is made parallel with the optical axis of the semiconductor laser, the emerging beam from the right angle prism is converged, then the adjacent stripe beams are prevented from overlapping each other even if a long optical distance is-taken between the stripes and the cylindrical lens. Under this arrangement, a small ratio can be set between the distance from the focusing lens and the beam spot and the distance from the stripes and the cylindrical lens. For the vertical components, the ratio is large between the distance from the focusing lens to the beam spot and the distance from the stripes to the cylindrical lens, but because the width of the light source is sufficiently small, the diameter of the converged beam spot does not become large.

FIG. 13 is a perspective view of an optical path rotating device having a suitable number of optical elements of FIG. 12, preferably as many as the active layer stripes of the linear array laser diode, arranged in parallel. The optical elements are arranged such that the plane of incidence and the plane of emergence are in the same plane, respectively. The optical elements are provided on a one-to-one correspondence with the active layer stripes, and the optical elements are spaced with the same spacing between the active layer stripes of the linear array laser diode.

The optical path rotating device placed against the emitting face of the linear array layer diode changes the laser beams emitted from the respective active layer stripes with their attitudes from horizontal to vertical without changing their intervals. Therefore, the laser beams which have been processed by the optical path rotating device and which are emitted from the top face thereof are equivalent to the beams emitted from the linear array laser diode having the active layer stripes arranged in the form of ladder rungs.

Figure 14:
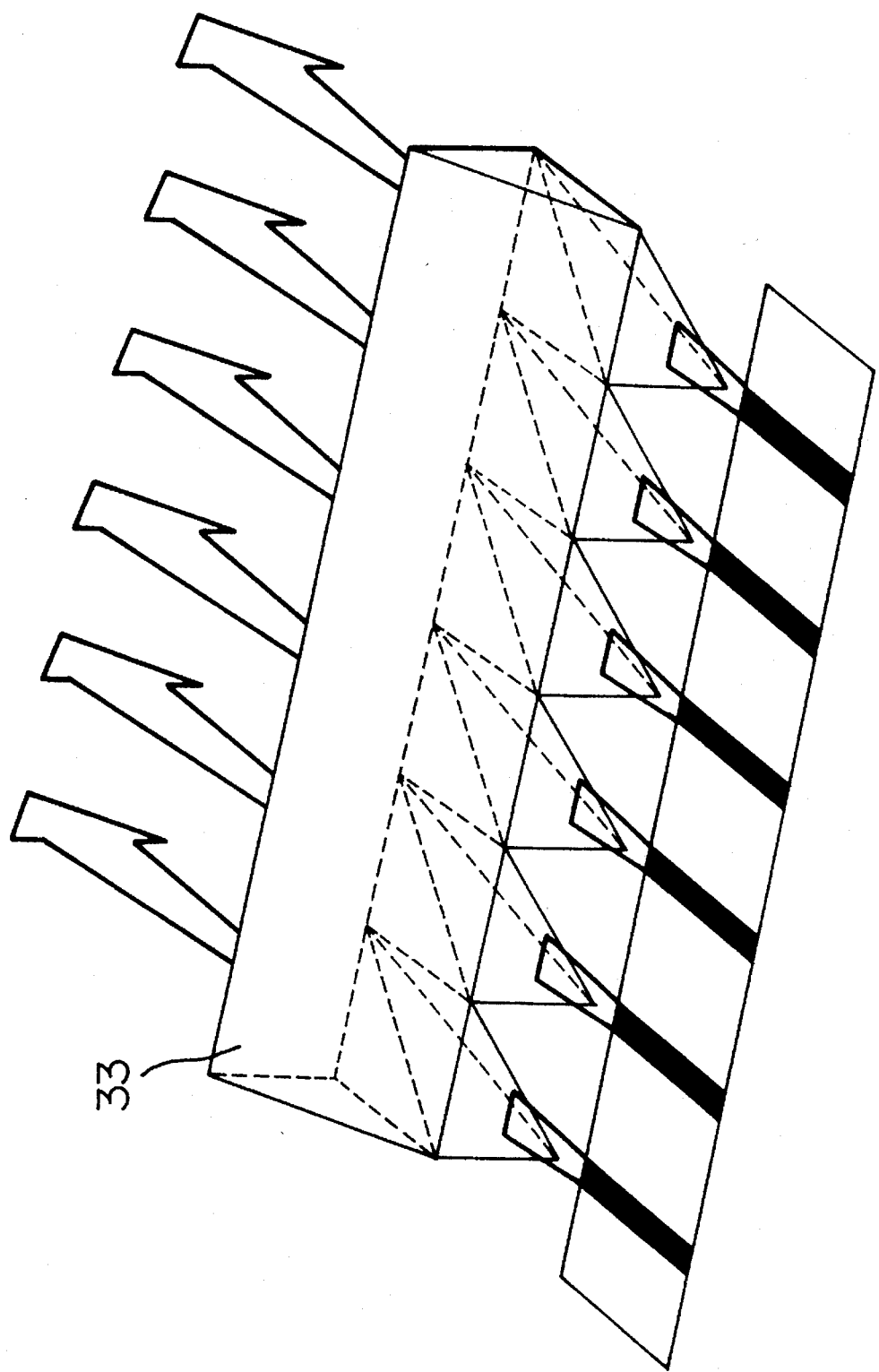
FIG. 14 is a perspective view of the optical path rotating device of the present invention, formed by having the optical path rotating device of FIG. 13 added with a right angle prism.

However, since the optical axis has changed its direction by 90 degrees from its direction when the beam was emitted from the LD, there is difficulty in dealing with such a laser beam. Therefore, it is desirable that the optical-path-rotated beam maintains its original direction. To this end, it is only necessary to have the emerging beam from the prism array reflected further by a right angle prism. FIG. 14 shows an optical path rotating device having aright angle 33, the cross section of which is an isosceles right triangle, attached to the plane of emergence of the prism array of FIG. 13. The laser beams obtained by this optical path rotating device are the same as in the above case, that is, substantially the beams arranged in parallel in the form of ladder rungs, so that the adjacent stripe beams do not overlap each other. By the above method, the optical axis can be obtained by moving the original optical in parallel displacement.

FIG. 15 is a diagram showing an optical element of a frustum of tetrahedron formed by cutting off the apex portion A of the optical element ABCD of FIG. 12 at a plane parallel with the bottom face BCD.

Figure 16:
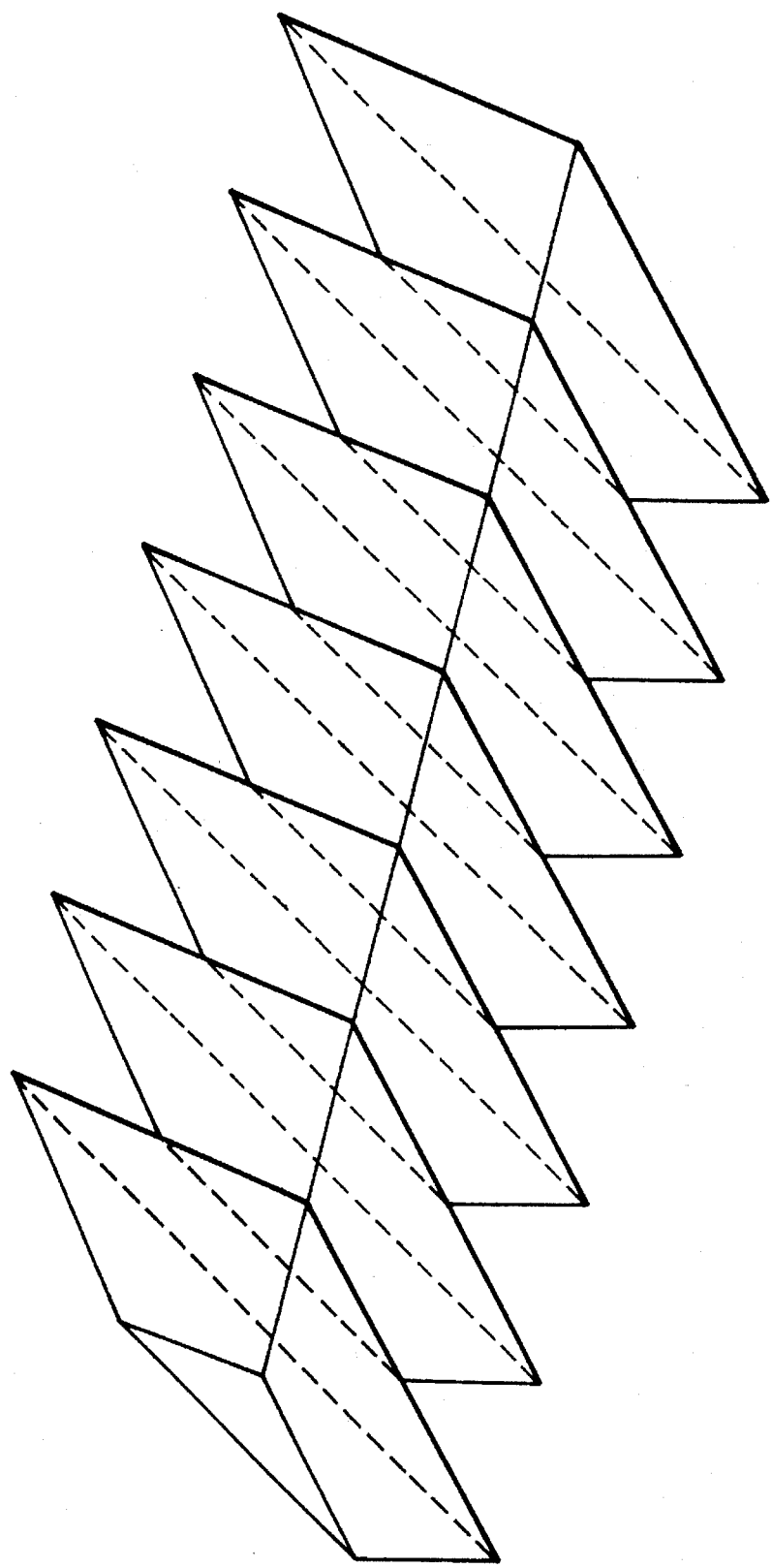
FIG. 16 is a perspective view of the optical path rotating device of the present invention having the optical elements of FIG. 15 arranged in parallel.

FIG. 16 is a diagram showing an optical path rotating device having optical elements of FIG. 15 arranged in parallel.

Figure 17:
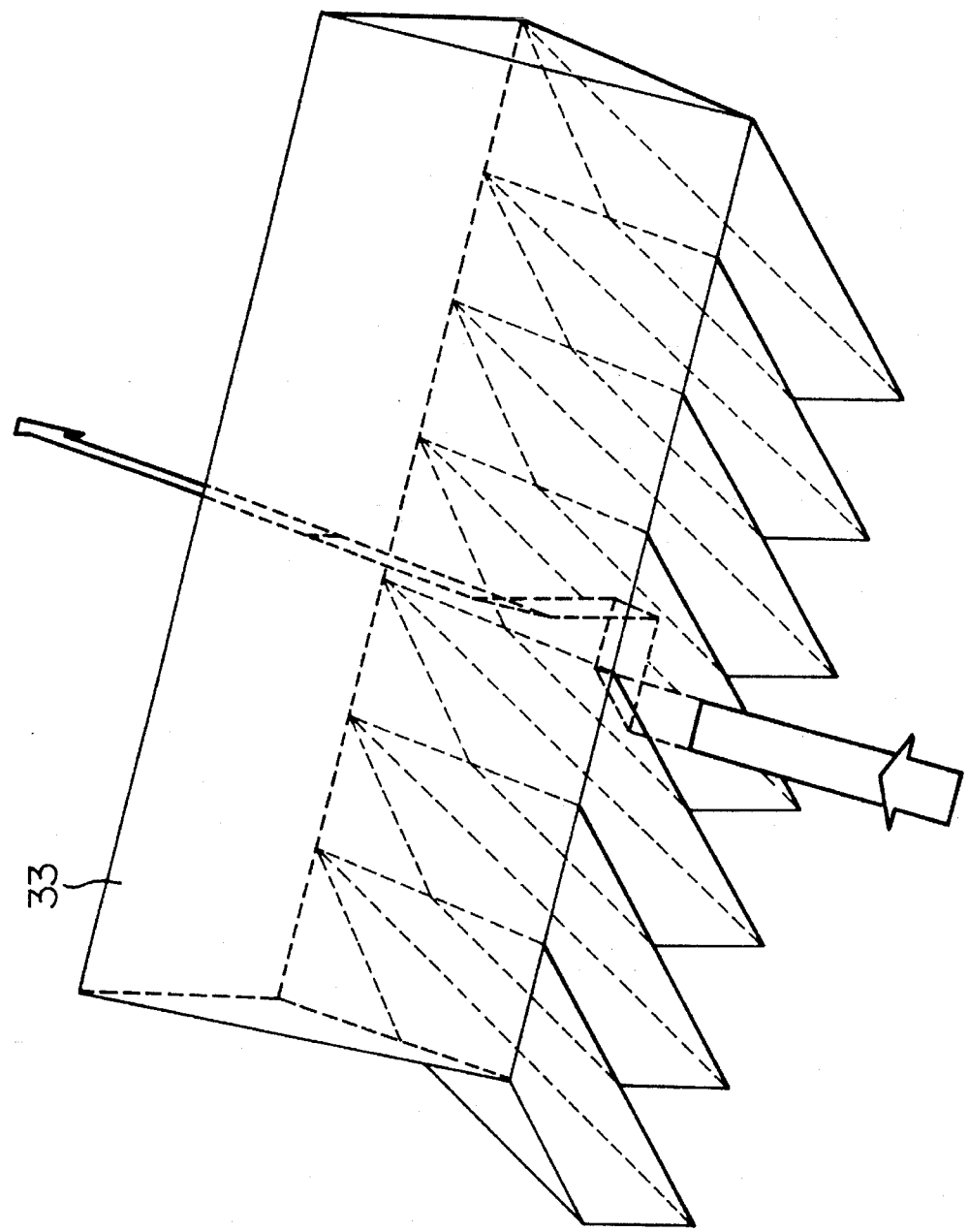
FIG. 17 is a perspective view of another optical path rotating device of the present invention, formed by having the optical path rotating device of FIG. 16 added with a right angle prism.

FIG. 17 is a diagram showing an optical path rotating device having a right angle prism 33 attached to the optical element of FIG. 16.

If an optical path rotating device of FIG. 13 or 14 having tetrahedron prisms of FIG. 12 arranged in parallel is used, the light beams adequately entering the prisms can be changed in direction, but the laser beams which do not strike the prisms cannot undergo a process of change of direction. As a solution, if frustums of tetrahedron BCDHIJ as optical elements are arranged in parallel with the bottom face BCD of each of the prisms closely attached to the top face HIJ of the adjacent optical element (FIG. 16), the gaps between the prisms can be filled, so that the laser diode beams can be received without losing any laser beams. In this case, the frustums of tetrahedron can be formed by cutting off the portions close to the apex A from the tetrahedrons at a plane parallel with the second reflecting plane BCD.

The optical path rotating device of FIG. 16, which have the optical axes of the emerging beams intersecting perpendicularly to the optical axes of the incident beams, is not convenient for use in forming the whole laser apparatus. The optical path rotating device of FIG. 17 has the optical axes of the emerging beams in the same direction as the incident beams, and therefore has an advantage of simplifying the construction of the whole laser apparatus. This advantage is the same as the advantage of the optical path rotating device of FIG. 14 over the optical path rotating device of FIG. 13.

Figure 18:
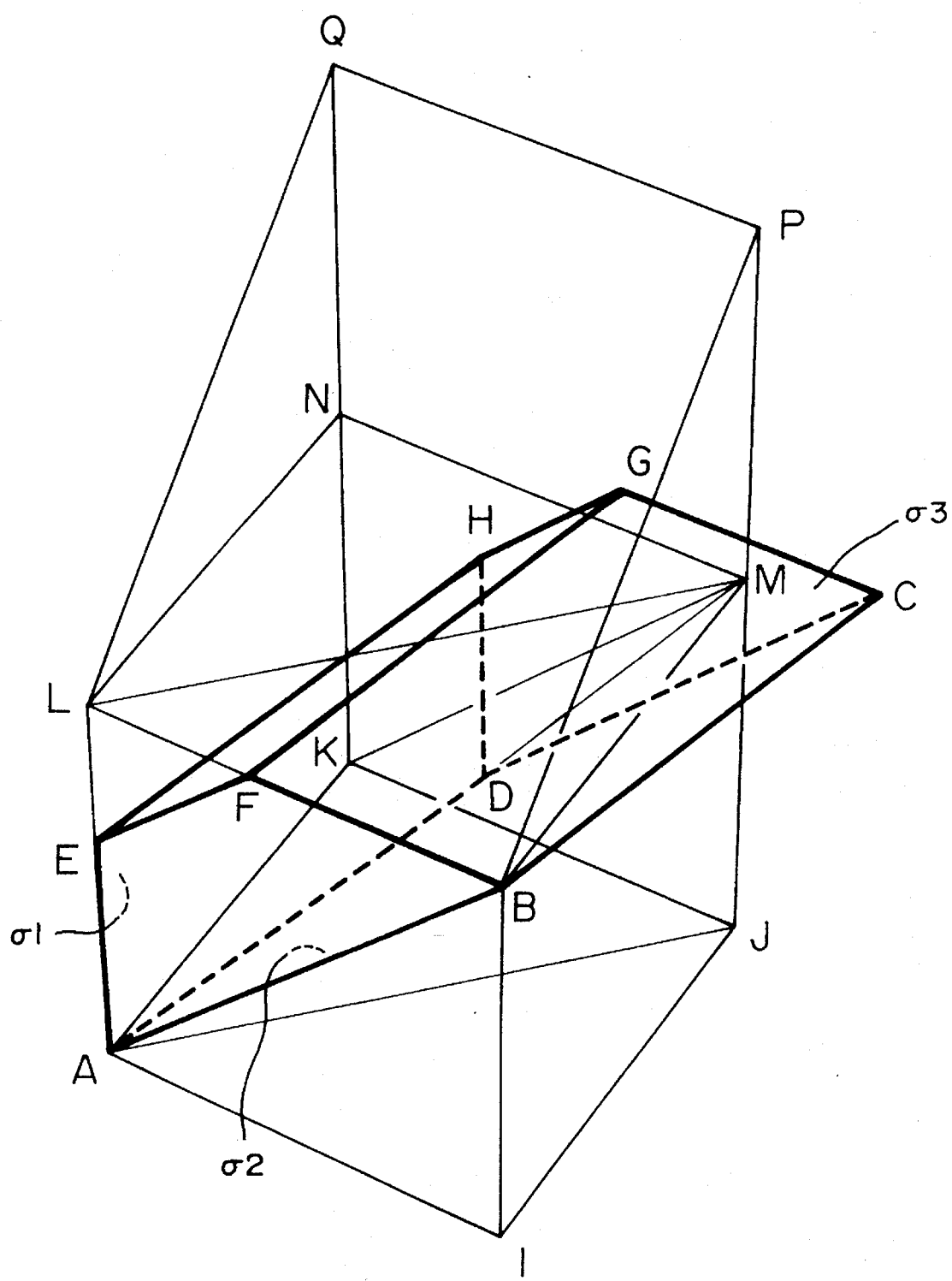
FIG. 18 is a perspective view showing an optical element formed by an oblique prism having three reflecting faces.

FIG. 18 shows an oblique quadangular prism having a trapezoidal base having three reflecting faces, the same number as in a prism used in the optical element of FIG. 14 or 17. To be more specific, this oblique 10 quadangular prism is a prism defined by three right angle prisms as shown in FIG. 19, in which the three slant faces serve as the reflecting faces, and is in such a shape that a plurality of prisms of this shape can be arranged continuously. In FIG. 19, a first reflecting face $\sigma_1$ is inclined at 45 degrees from a vertical line with respect to the incident beam which is incident horizontally, and reflects the beam to a direction parallel with the face of incidence. A second reflecting face $\sigma_2$ is inclined at 45 degrees to horizontal, and reflects the vertically upwards the reflected beam traveling horizontally after it is reflected by the first reflecting face. A third reflecting face $\sigma_3$ is a slant face inclined at 45 degrees to horizontal, and reflects the beam incident vertically on this reflecting face to a horizontal direction to let the beam emerge horizontally. The face of incidence is substantially perpendicular to the incident beam, and the face of emergence is parallel with the face of incidence.

To explain the shape of the oblique quadangular prism ABCDEFGH of FIG. 18, suppose a cube AIJKLBMN and a triangular prism BMNLQP whose cross section is an isosceles right triangle. If the front face AIBL of the cube is supposed to be a face of incidence, a first reflecting face $\sigma_1$ corresponds to a face AJML formed by connecting contrapositional apexes of the cube, a second reflecting face $\sigma_2$ corresponds to a face ABMK formed by connecting contrapositional apexes, a third reflecting face $\sigma_3$ corresponds to a slant face BPQL of the triangular prism, and the face of incidence is a face JPQK. Since points A and M are at the same distance from the face BPQL, the diagonal AM is parallel with the slant face BPQL of the triangular prism.

In the oblique quadangular prism ABCDEFGH, point D is selected at an arbitrary position on the diagonal AM or an arbitrary position on the edge AL. A face ADHE is a parallelogram having line segments AD and AE belonging to the first reflecting face $\sigma_1$, and therefore exists in the first reflecting face $\sigma_1$. A face ABCD is a parallelogram having the diagonal AB and the line segment AD as two sides of it, and exists in the second reflecting face $\sigma_2$. Since a line segment BC is parallel with the diagonal AM, it exists in the slant face BPQL of the triangular prism, and therefore a face BCGF exists in the third reflecting face $\sigma_3$. The sides of a face of emergence CDHG are parallel with the corresponding sides of a face of incidence ABFE, and therefore the face of emergence CDHG is parallel with the face of incidence ABFE. In addition, a top face EFGH is parallel with the bottom face ABCD.

As for the shape of this prism, the intersection angle of the first reflecting face $\sigma_1$ and the second reflecting face $\sigma_2$ and the intersection angle of the second reflecting face $\sigma_2$ and the third reflecting face $\sigma_3$ are both 60 degrees, so that a desired prism can be obtained easily by processing a prism whose cross section is a regular triangle. To be more specific, in order to obtain this prism, it is only necessary to cut diagonally a quadrangular prism made by cutting the prism having a base of regular triangle at a plane parallel with the bottom of the prism to cut off one edge portion, and as a result, a prism can be produced with high accuracy and by simple processing.

The face of incidence ABEF of the oblique quadangular prism is arranged to allow the incident beam to be incident substantially perpendicularly on the face of incidence. The first reflecting face ADHE intersects vertically to the face of incidence ABEF, and the intersection angle is substantially 45 degrees, so that the incident beam is bent in a horizontal direction. Since the second reflecting face ABCD is inclined at 45 degrees to horizontal, the horizontal incident beam is bent to a vertical direction. Since the third reflecting face BCGF is inclined at 45 degrees to a vertical direction, the incident beam which is incident perpendicularly to the third reflecting face is bent to a horizontal direction. Finally, the beam bent to a horizontal direction is incident substantially perpendicularly to the face of emergence CDHG and passes therethrough, and the beam emerges with the orientation of the cross section perpendicular to the optical axis of the beam turned substantially 90 degrees.

Figure 20:
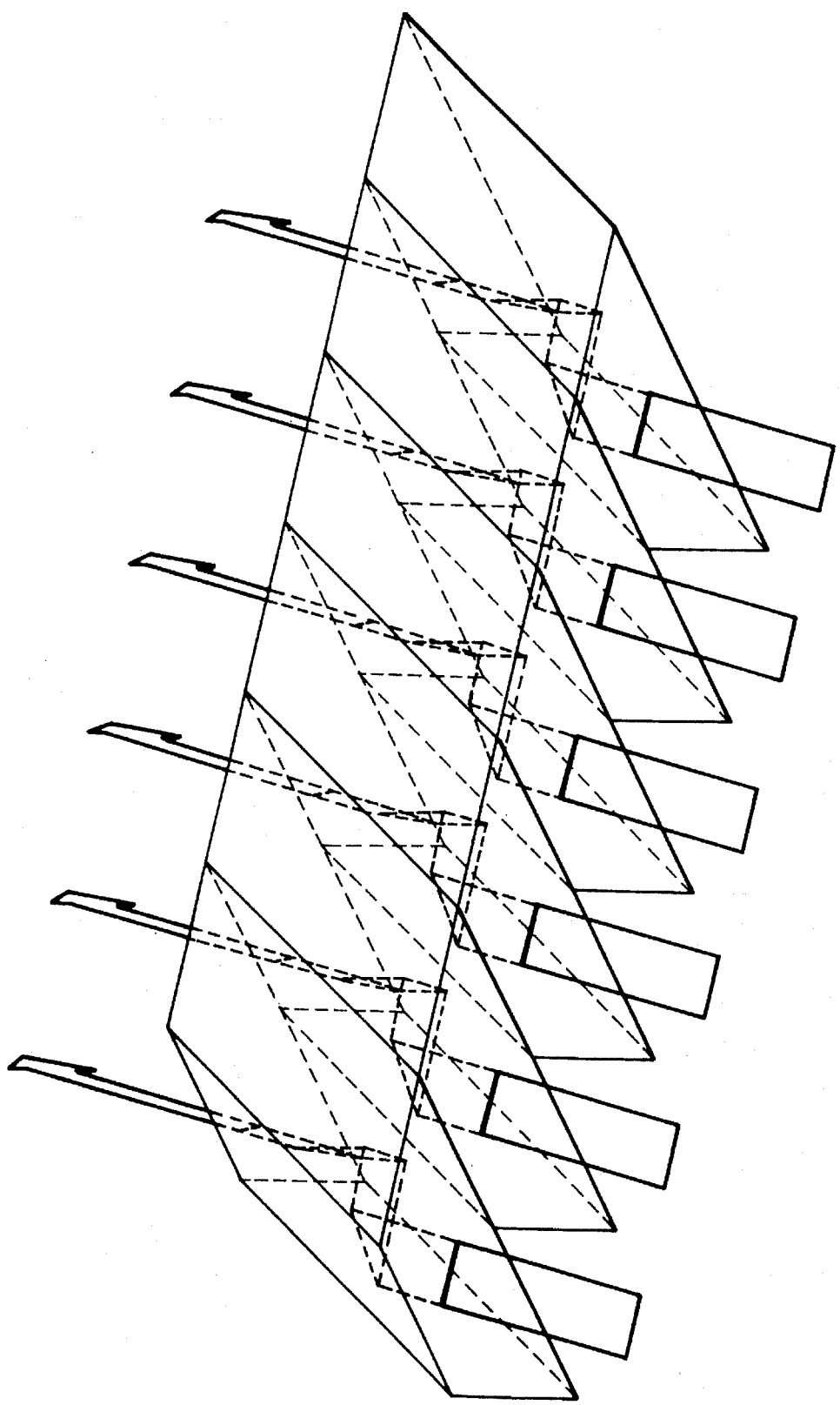
FIG. 20 is a perspective view of the optical path rotating device formed by having the optical elements of FIG. 18 arranged in parallel.

FIG. 20 shows an optical path rotating device having a plurality of optical elements of FIG. 18 arranged in parallel. This optical path rotating device can be formed by arranging a necessary number of optical elements, having the face of incidence and the third reflecting face located in the same plane, and joining the underside of each optical element to the top face of the adjacent optical element. In this figure, the loci of the incident beams are shown for explanation's sake. From the figure, it is evident that the laser beams arranged in a dotted line are changed into the laser beams in a ladder form as they pass through the optical path rotating device.

Figure 21:
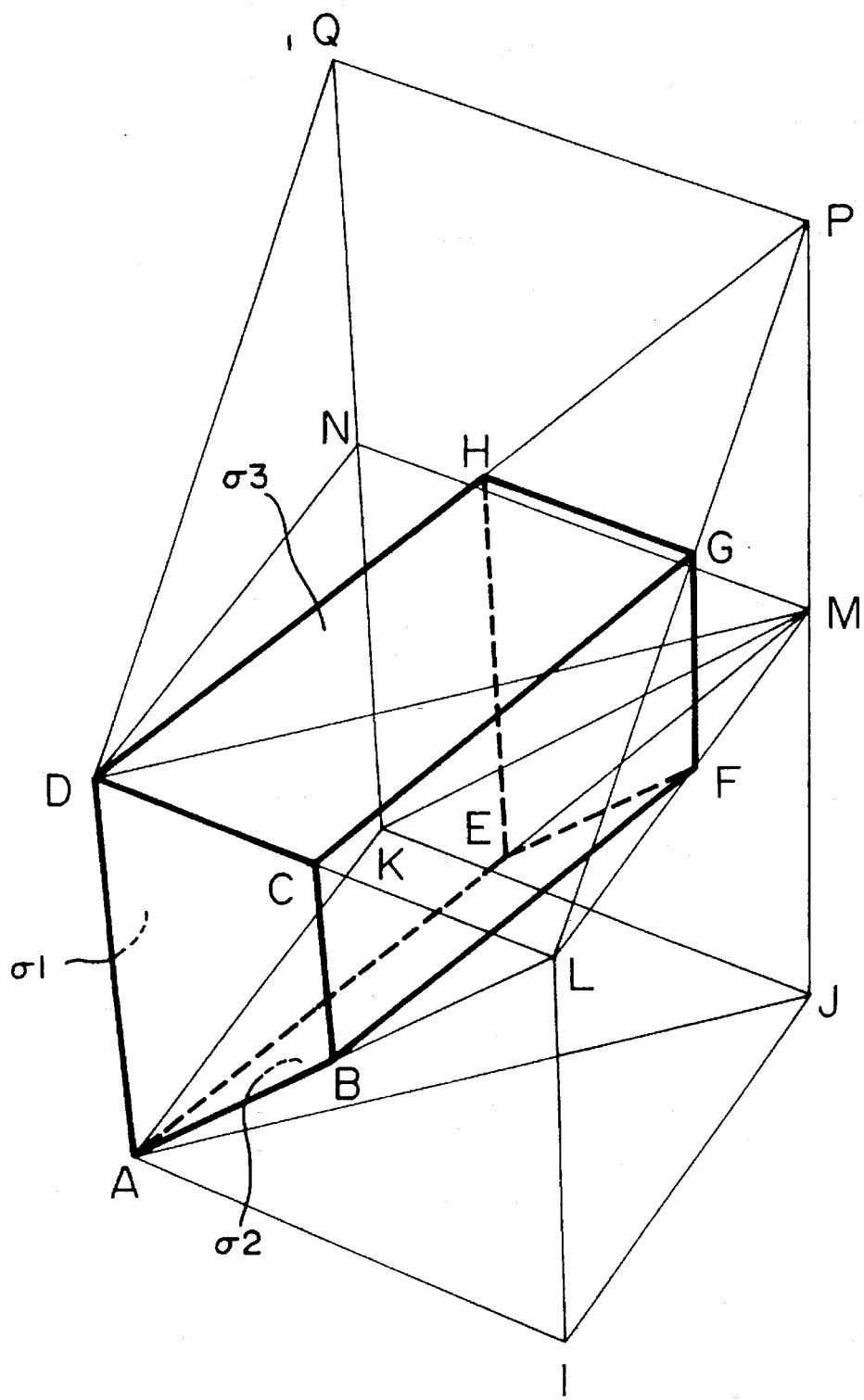
FIG. 21 is a perspective view showing another optical element formed by an oblique prism having three reflecting faces.

FIG. 21 shows another example of an oblique prism having three reflecting faces. Like the oblique prism shown FIG. 18, this oblique prism too is a prism, three slant faces of which serve as reflecting faces, and is in such a shape that a plurality of prisms can be arranged continuously.

To explain the shape of an oblique quadangular prism ABCDEFGH in FIG. 21, suppose a cube AIJKLMND and a triangular prism whose cross section is a isosceles right triangle. If a front face of the cube is supposed to be the face of incidence, a first reflecting face $\sigma_1$ corresponds to a face AJPD, a second reflecting face $\sigma_2$ corresponds to a face ALMK, and a third reflecting face $\sigma_3$ corresponds to a slant face LPQD of a triangular prism. A diagonal AM of the cube is parallel with the slant face LPQD of the triangular prism.

In the oblique quadangular prism ABDCEFGH, point B is selected at an arbitrary position on a diagonal AL which makes it possible to secure a sufficient area for the second reflecting face to reflect the incident beam. Point F is an arbitrary point on a line drawn in parallel with the diagonal AM from point B, and at point E is located on the diagonal AM and the same distance as the line segment BF from the apex A. A face ABFE is a parallelogram having as two sides line segments AB and AE in the second reflecting face, and exists in the second reflecting face $\sigma_2$. The line segment AE also belongs to the first reflecting face. A line segment EH is parallel with the edge AD, and a line segment DH is parallel with the line segment AE. Therefore, a face ADHE is a parallelogram belonging to the first reflecting face $\sigma_1$. Point H is located on the diagonal DP of the third reflecting face. A line segment BC is parallel with the edge AD, and a line segment BF is parallel with the diagonal AM, a line segment FG is parallel with the edge BC, and a line segment CG is parallel with a line segment DH, and therefore a face BCGF is parallel with the first reflecting face. Since points D, C, G, H belong to the third reflecting face, a face DCGH belongs to the third reflecting face. Sides EF, FG, GH, HE are respectively parallel with the corresponding sides of the face of incidence. Therefore, a face EFGH is parallel with the face of incidence ABCD.

The face of incidence ABCD of the oblique quadangular prism in FIG. 21 is arranged so that the incident beam is incident perpendicularly thereto. The first reflecting face ADHE intersects the face of incidence ABCD in a vertical line, and because the intersection angle is substantially 45 degrees, reflects the incident beam to bend it to a horizontal direction. The second reflecting face ABFE is inclined at 45 degrees to horizontal, and therefore bends the incident beam, being incident horizontally thereto, vertically upwards. The third reflecting face DCGH, inclined 45 degrees from a vertical direction, bends the beam, which is incident perpendicularly thereto, to a horizontal direction. Finally, the beam bent to a horizontal direction is incident substantially perpendicularly to the face of emergence EFGH and passes therethrough, and emerges as the beam, of which the orientation of the cross section perpendicular to the optical axis of the beam has been rotated substantially 90 degrees.

Figure 22:
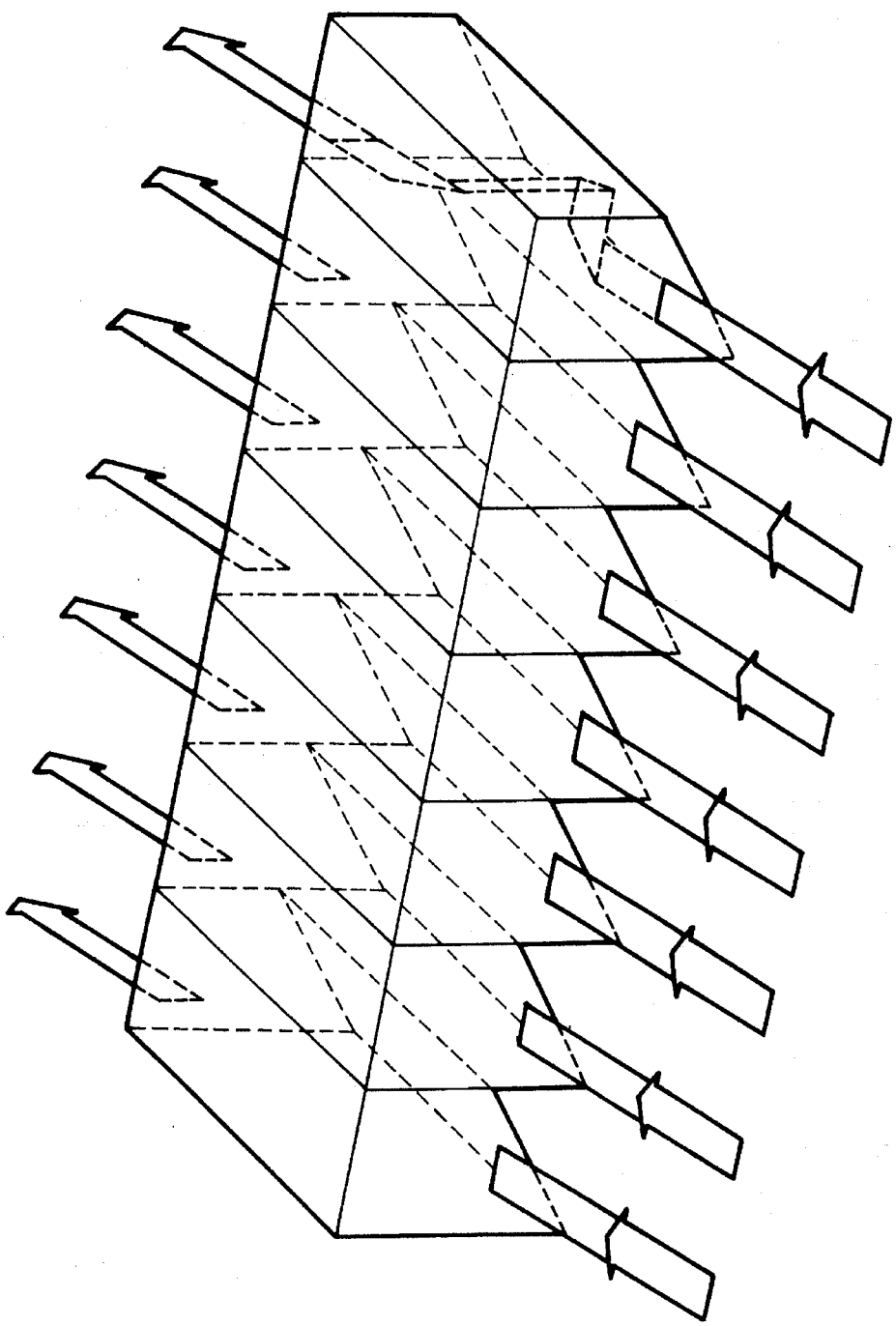
FIG. 22 is a perspective view of an optical path rotating device formed by having the optical elements of FIG. 21 arranged in parallel.

FIG. 22 shows an optical path rotating device having a plurality of optical elements of FIG. 21 arranged in parallel. This optical path rotating device can be formed by arranging a necessary number of optical elements, having the face of incidence and the third reflecting face placed in the same plane, and joining the underside of each optical element to the top face of the adjacent optical element. FIG. 22 shows the loci of the incident beams for the sake of explanation. It will be understood how the laser beams arranged in a doted line are changed into laser beams in a ladder form as they pass through the optical path rotating device.

Figure 23:
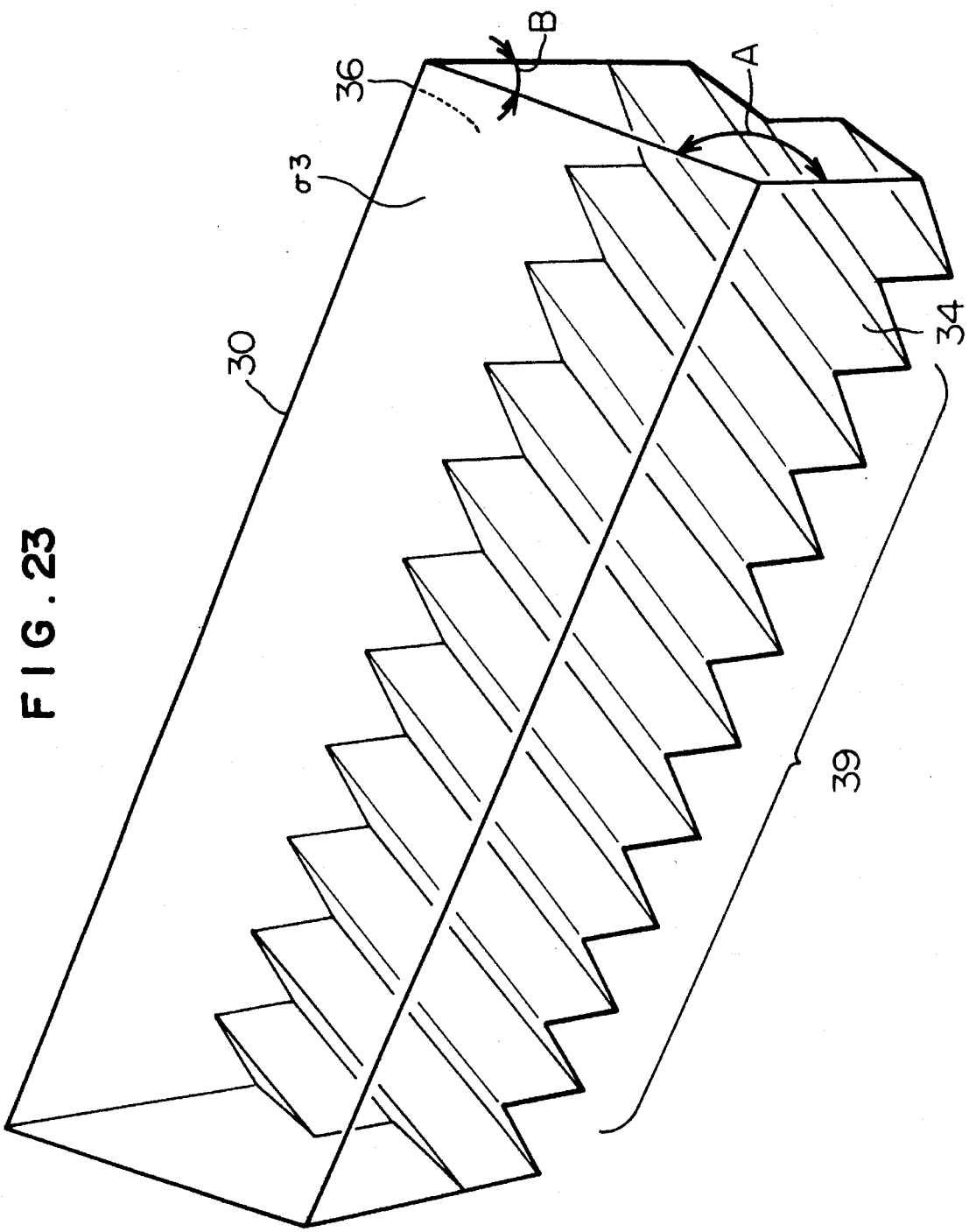
FIG. 23 is a perspective view of a monolithic optical path rotating device equivalent to the optical path rotating device of FIG. 22.

FIG. 23 shows an optical path rotating device 30, equivalent to the one in FIG. 22, which is formed monolithically from a transparent material shaped as a prism by removing unnecessary portions instead of adhering a plurality of optical elements. The optical path rotating device can be mass-produced by using a mold. By using the silicon semiconductor manufacturing process, an optical path rotating device of such a structure with minute details can be produced.

This optical path rotating device 30 includes a face of incidence 34 and a face of emergence 36 which are parallel, a reflecting face $\sigma_3$ intersecting the face of incidence 34 at an included angle (A) of 135 degrees and intersecting the face of emergence 36 at an included angle (B) of 45 degrees, a cyclically corrugated face having peak lines and bottom lines occurring alternately at angles of 60 degrees in a direction intersecting the face of incidence 34 at an angle of $\tan^{-1}(1/\sqrt{2})$, and also a face 39 having the peak lines and the bottom lines in parallel with the third reflecting face $\sigma_3$.

Figure 24:
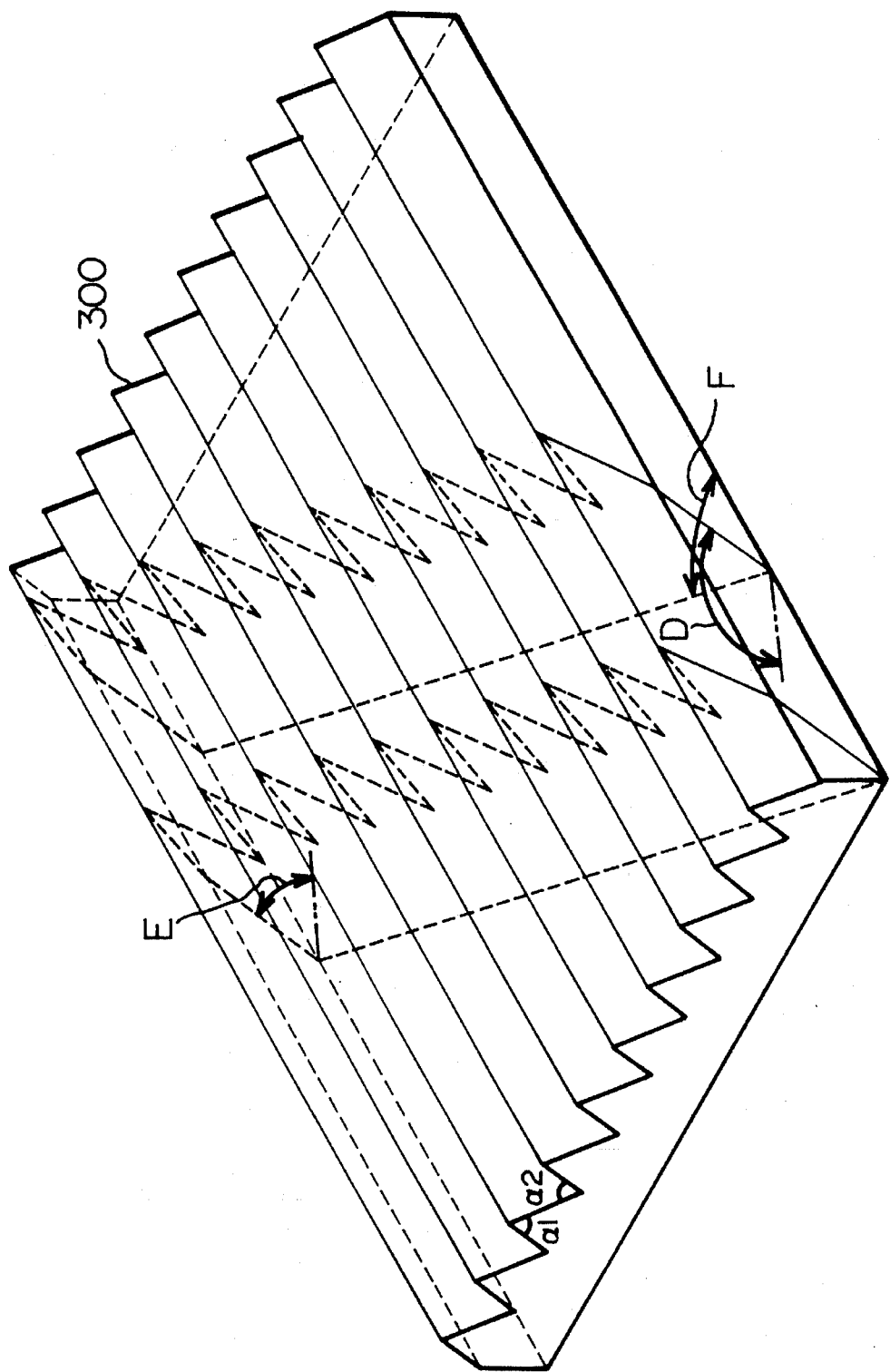
FIG. 24 is a diagram for explaining a method for producing the optical path rotating device of FIG. 23.

FIG. 24 is a diagram for explaining the method for manufacturing the optical path rotating device of FIG. 23.

As shown in FIG. 24, a plate material 300 is made of a transparent material (glass, quartz, or the like) having front and rear faces parallel with each other, one face (the upper face in FIG. 24) which has a cyclically corrugated face of a cross section of a triangular wave with apex angles of 60 degrees and bottom angles of 60 degrees. An optical path rotating device 32 can be obtained by cutting the plate material 300 at two parallel planes which are at an angle D (E) of 135 degrees (or 45 degrees) from the other face (bottom face in FIG. 24) with an angle F formed on the other face with the peak lines and bottom lines of the triangular wave being $\tan^{-1}\sqrt{\sqrt{2}}$.

Figure 25:
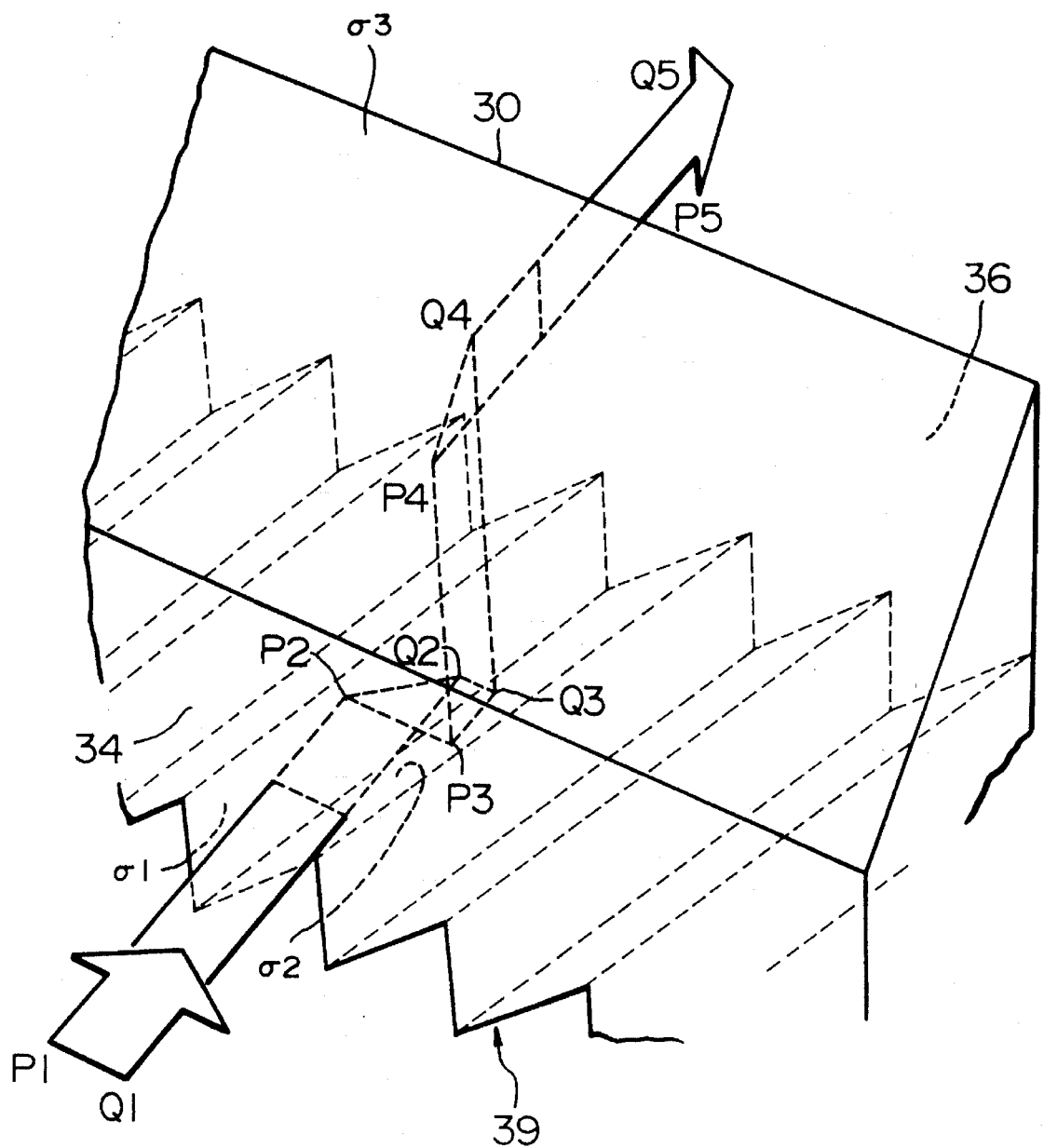
FIG. 25 is a diagram for explaining the locus of a light beam in the optical path rotating device of FIG. 23.

The principle of optical path change in the above-mentioned embodiment will be described with reference to FIG. 25. This optical path rotating device 30 has, out of the faces provided face to face with each other at included angles of 60 degrees at a fourth face 39 cyclically bending as in a washboard, first reflecting faces $\sigma_1$ intersecting the face of incidence 34 at included angles of 45 degrees, second reflecting faces $\sigma_2$ intersecting the face of incidence 34 and a face of emergence 36 at angles of 90 degrees, and a third reflecting face $\sigma_3$ as an internal reflecting face provided against the other reflecting faces. The incident beams are totally reflected by the respective reflecting faces.

A light beam entering the face of incidence 34 is reflected by the first reflecting face $\sigma_1$ and then by the second reflecting face $\sigma_2$ of the fourth face 39, and subsequently reflected by the third reflecting face $\sigma_3$, and emerges from the face of emergence 36. If the flat beam emitted from a slit-like light source is designated by a line segment P1Q1, when this beam is incident on the face of incidence 34 from a direction at right angles with that face, the line segment P2Q2 in the first reflecting face $\sigma_1$ is reflected at the line segment P3Q3 in the second reflecting face $\sigma_2$, and further reflected at the line segment P4Q4 in the third reflecting face $\sigma_3$ and therefore the emerging beam from the face of emergence 36 is expressed by the line segment P5Q5. Specifically, by this embodiment, though the optical axis of the emerging beam is shifted upwards in FIG. 25 by parallel translation with respect to the optical axis of the incident beam, the widthwise position of the flat beam can be rotated by 90 Degrees from the position of the beam before entering this optical device.

Figure 26:
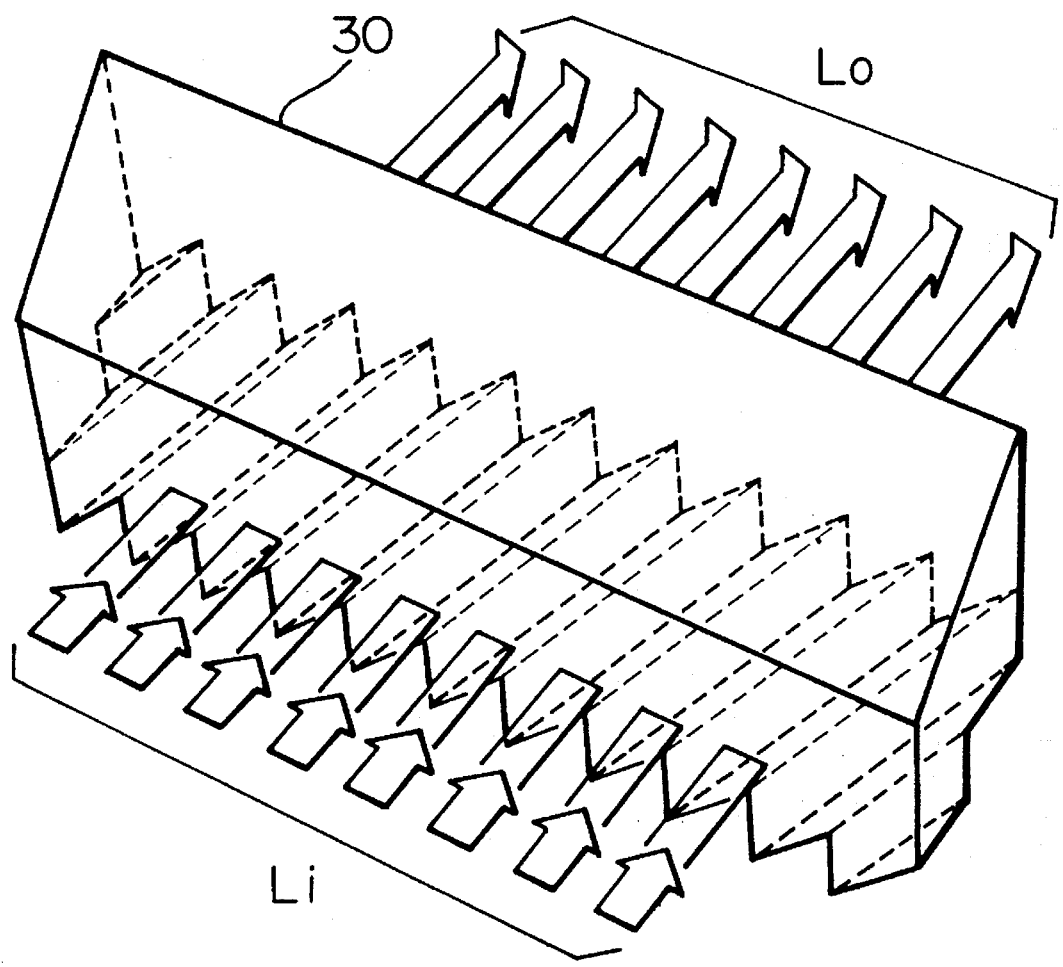
FIG. 26 is a diagram for explaining the function of the optical path rotating device of FIG. 23.

In the present invention, the stripe beams arranged in a row in the form of a dotted line when emitted from the light sources are turned by 90 Degrees, respectively, by prism elements as if the stripe beams were arranged in the form of ladder rungs. In other words, if the prism elements shown in FIG. 25 are arranged on a one-to-one correspondence with the stripe beams, the horizontal position P1Q1 of the stripe beam is changed to the vertical position P5Q5. As shown in FIG. 26, a number of stripe beams Li arranged in a dotted line on a straight line are converted into the stripe beams Lo arranged like a ladder's rungs by the optical path rotating device 30.

In the above arrangement, a couple of reflecting faces $\sigma_1$ and $\sigma_2$ are placed against a stripe beam. Therefore, when many active layers of a narrow width are arranged, prism elements of a very small size must be prepared.

However, in a practical application, a couple of reflecting faces may be placed against a plurality of stripe beams. In this case, the stripes are divided into groups of a certain number of stripes, each group having a width, which is the same as the pitches at which the prism elements are placed, and the stripe beams in respective groups are rotated 90 Degrees by corresponding prism elements. In this case, too, the laser beams can be converged so as to be arranged at pitches about equivalent to the pitches of the prism elements arranged.

However, it goes without saying that preferably, the prism elements should be arranged on a one-to-one correspondence with the stripe beams for convergence to smaller beams. In actual applications, even when the active layer stripes are arranged at pitches of or in widths of 100 μm or less, it is possible to produce an optical path rotating device having the reflecting faces on a one-to-one correspondence with the active layers by using a silicon semiconductor process or an LIGA process.

Figure 27:
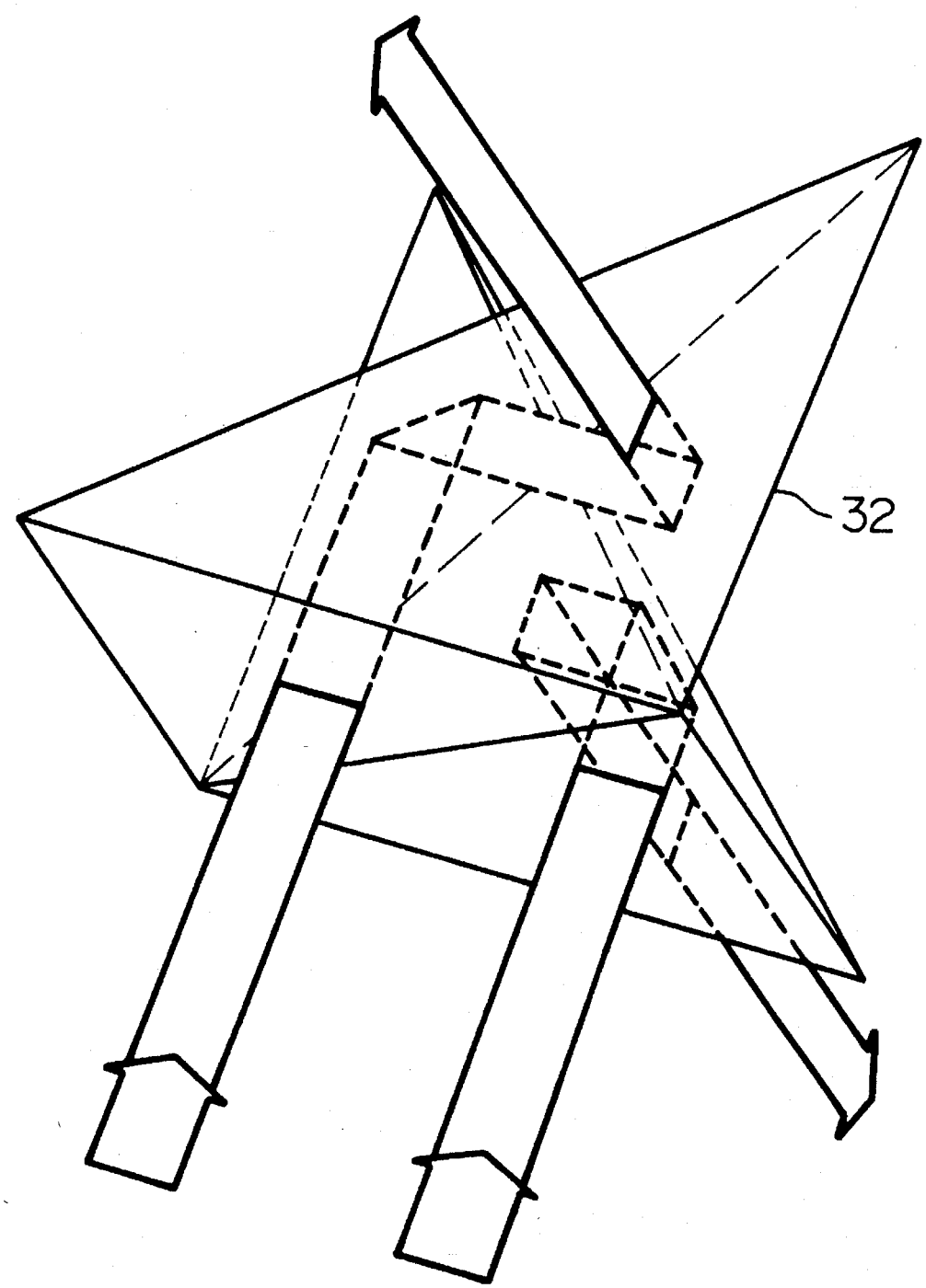
FIG. 27 is a perspective view showing an optical element formed by a composite prism having tetrahedron prisms combined symmetric with respect to the axis.

FIG. 27 is a diagram showing a composite prism including tetrahedron prisms of FIG. 12 combined symmetrically with respect to the axis. This composite prism formed like the prism in FIG. 24 by placing the faces of incidence of two tetrahedron prisms side by side and joining together the second reflecting faces coated with aluminum or silver, for example, for better reflection. The incident beams enter the faces of incidence of the composite prism, and the upper tetrahedron prism reflects the beam to let it emerge upwards, while the lower tetrahedron prism reflects the beam to let it emerge downwards. Therefore, the tolerance of the position of incidence for the incident beams is large, and the energy of the beam that can undergo an effective optical path change is great. The composite prism is more advantageous than a single tetrahedron prism in which the energy of the beam falling on other than the face of incidence is wasted.

Figure 28:
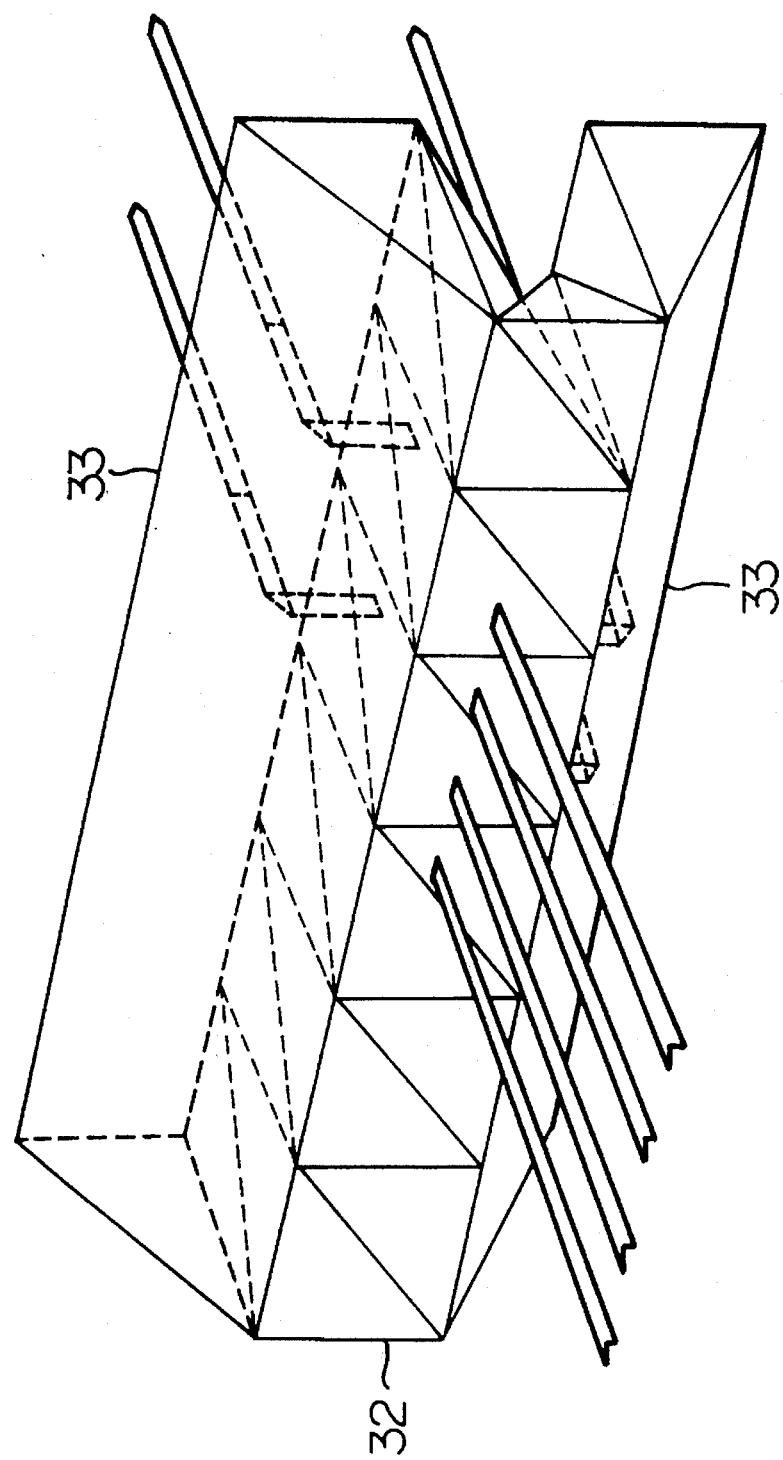
FIG. 28 is a perspective view of an optical path rotating device formed by having composite prisms of FIG. 27 arranged in parallel.

FIG. 28 is a diagram showing an optical path rotating device obtained by having composite prisms shown in FIG. 27 arranged in parallel. The composite prisms have a triangular prism 33 attached to both the upper face and the lower face over the whole length of the optical path rotating device. The beams (only four beams are shown for simplicity of description) whose optical paths are changed by the optical path rotating device are reflected by reflecting mirrors or prisms and directed in the same direction.

FIG. 29 is a diagram showing a dove prism used as an optical element 32. The dove prism is also called a image rotation prism, and has a trapezoidal cross section. The angles of the faces are selected by taking into consideration the refractive index of the optical glass so that the incident beam which is incident in parallel with the bottom face of the dove prism is refracted at the face of incidence, then reflected on the bottom face, and as it is finally refracted by the face of emergence, emerges in parallel with the bottom face.

The dove prism rotates the injected image inside the prism and lets the image emerge from it. When the incident beam is injected in a direction 45 degrees inclined from the bottom face, the position of the active layer stripe in the beam is rotated by 90 Degrees in the prism, by which the present position is perpendicular to the original position, and the beam emerges from the other side. As the optical element, a Pechan prism or the like which rotates the image may be used.

Figure 30:
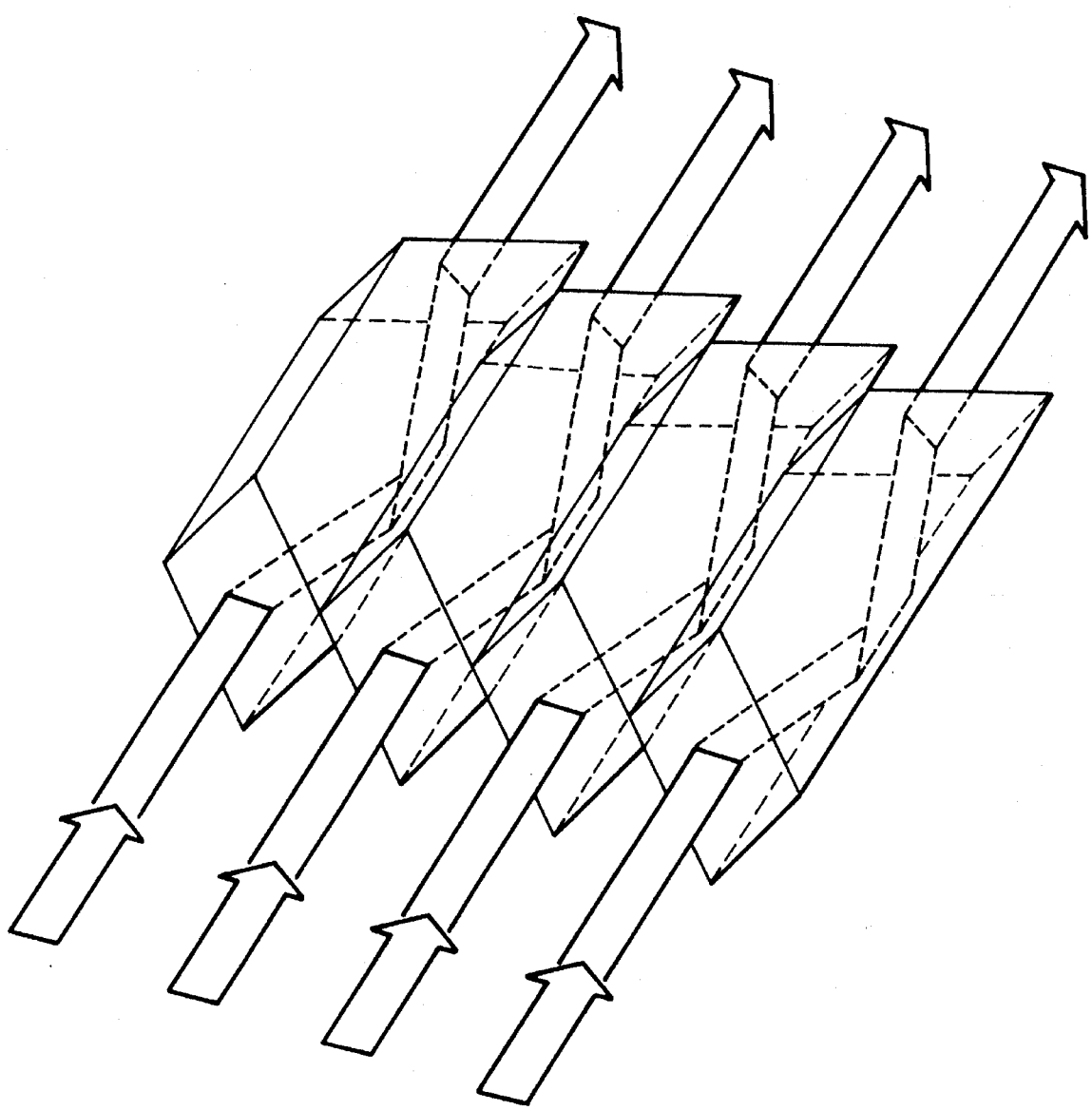
FIG. 30 is a perspective view of an optical path rotating device formed by having dove prisms arranged in parallel.

FIG. 30 shows an optical path rotating device formed by having the dove prisms shown in FIG. 29 arranged in parallel. In order that laser beams are injected into the dove prism with the laser beams inclined about 45 degrees, the respective dove prisms are inclined substantially 45 degrees with respect to the position of the laser beam array. Since the laser beams injected into the dove prisms have their positions corresponding to the active layer stripes rotated substantially by 90 degrees, the laser beams from the linear array laser diode become substantially like an aggregate of rungs of a ladder.

Figure 31:
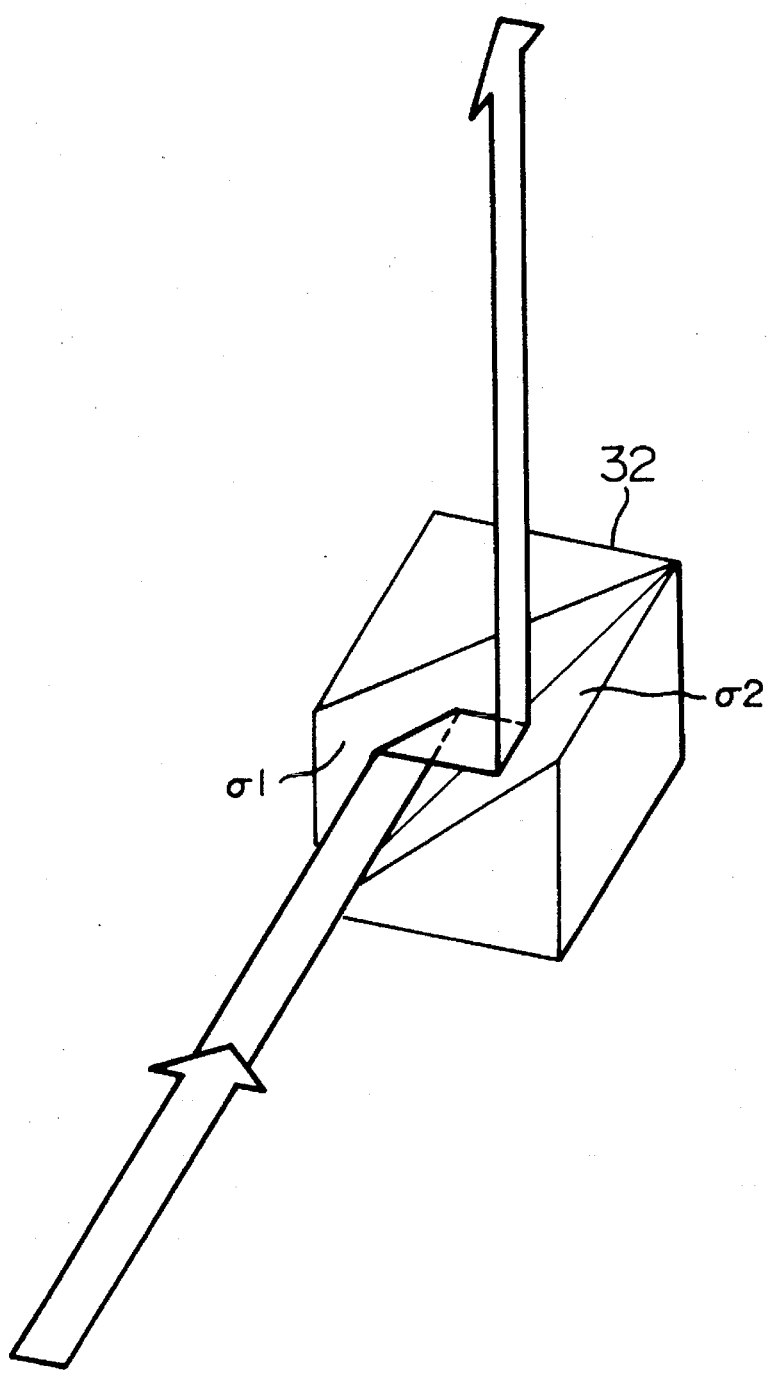
FIG. 31 is a perspective view of an optical element, corresponding to the one in FIG. 12, which utilizes reflective mirrors.
Figure 32:
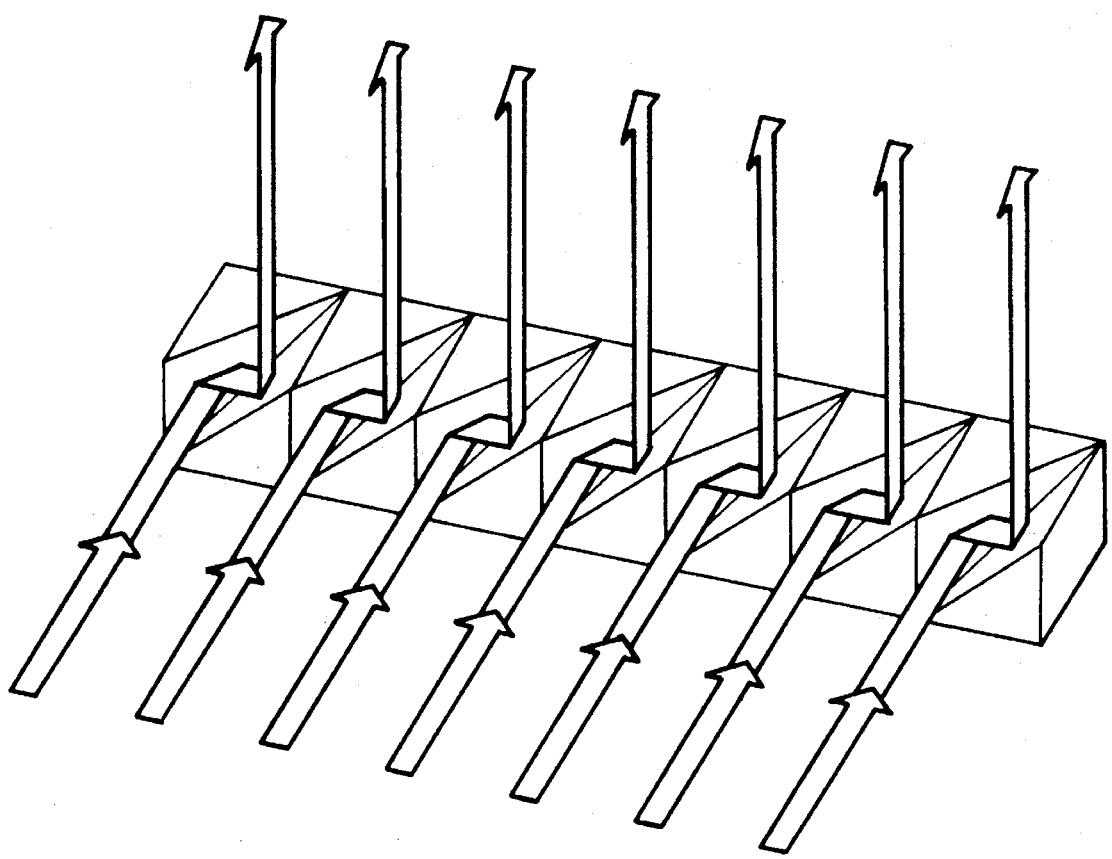
FIG. 32 is a perspective view of an optical path rotating device, formed by having the optical elements of FIG. 31 arranged in parallel.

The optical element using reflecting faces may be suitably arranged reflecting mirrors instead of a prism. FIG. 31 shows an optical element which performs the same function as the prism in FIG. 12. By cutting out a part of the cube, two reflecting mirror faces are formed: the first mirror face $\sigma_1$ is formed which is inclined 45 degrees to reflect the incident beam perpendicularly in a horizontal plane, and a second mirror face $\sigma_2$ to reflect the reflected beam from the first reflecting mirror face vertically upwards. The first and second reflecting mirror faces intersect at an intersection angle of 60 degrees. For the material of this optical element, metal, metal-plated glass, plastics, silicon or the like may be used. FIG. 32 shows an optical path rotating device which is formed as a mirror array by having the optical elements of FIG. 31 arranged so as to correspond to the active layer stripes of the linear array laser diode. The laser beams emitted from the active layer stripes are bent 90 degrees and their positions corresponding to the stripes are turned 90 degrees, so that the laser beams of the linear array laser diode are arranged substantially in the form of ladder rungs. Tiny optical elements corresponding to the active layer stripes of the linear array laser diode can be produced by using a precision mold, a silicon semiconductor manufacturing process or an LIGA process. When a silicon crystal is used, if its cleavage planes are used as reflecting mirror faces, the crystal can be processed easily. Instead of adhering optical elements, by cutting off some parts at one edge of a prism by the silicon semiconductor process, an optical path rotating device as shown in FIG. 32 can be formed. In this case, a strong and accurate optical path rotating device can be produced by a relatively simple manufacturing method.

Figure 33:
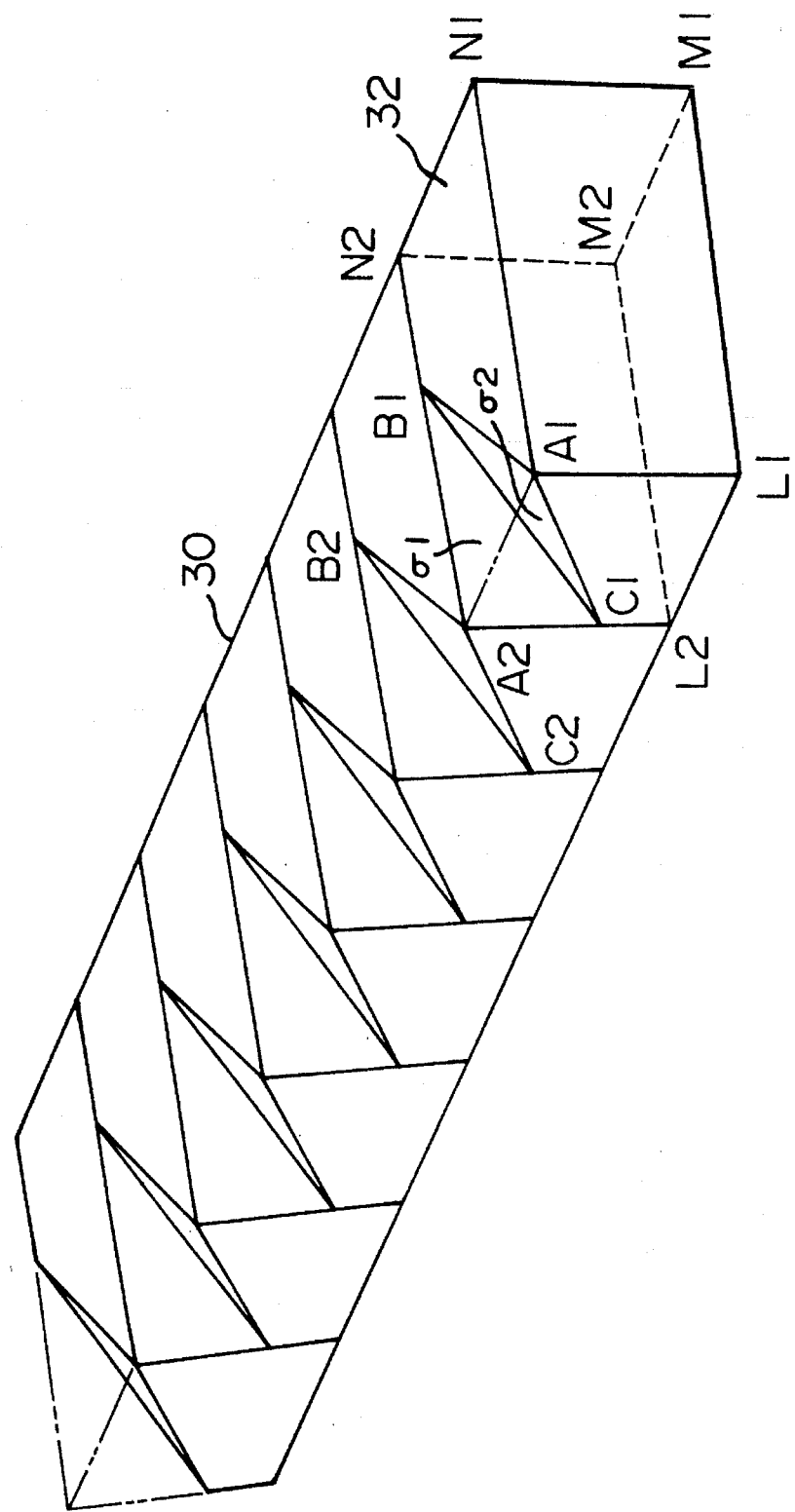
FIG. 33 is a perspective view of another optical path rotating device formed by having the optical elements, corresponding to the one in FIG. 12, which utilize reflective mirrors.

FIG. 33 is a diagram showing another optical path rotating device having the same function as the one shown in FIG. 32. The optical element 32 is formed by removing a tetrahedron A1C1A2B1 having isosceles right triangles A2A1B1 and A1A2C1 as its two faces from an upper bottom A1A2N2N1 and the front face A1L1L2A2 in a prism having parallelograms with opposite angles A1A2N2, A1N1N2, and L1L2M2, L1M1M2 as the upper bottom A1A2N2N1 and a lower bottom L1L2M2M1. The optical path rotating device 32 is formed by cutting the above-mentioned prism at a face A1B1C1 which is inclined at 45 degrees to horizontal, includes a line A1B1 forming an angle of 45 degrees by connecting an apex A1, point B1 on an edge A2N2, and an apex A2. The face A1C1B1 of the optical element 32 and a part A2B1C1 of a face of the adjacent optical element, which have the tetrahedron void space, are mirror-finished. The optical path rotating device 30 of FIG. 33 formed as described has the same function as the optical path rotating device of FIG. 32, and the incident beam entering the first reflecting face $\sigma_1$ is rotated by 90 degrees and emerges from the second reflecting face $\sigma_2$.

Figure 34:
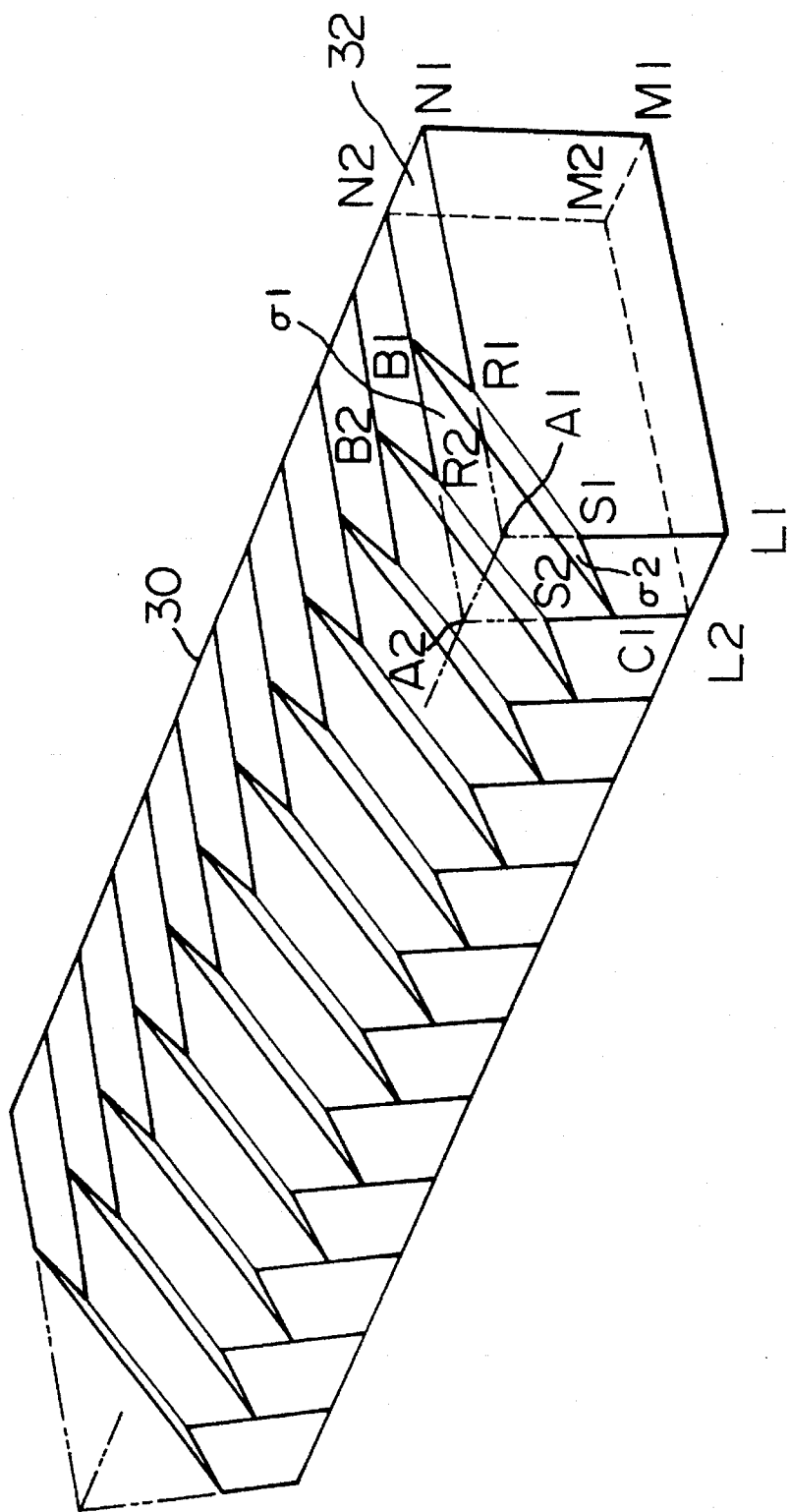
FIG. 34 is a perspective view of the optical path rotating device of FIG. 33 which have had notches deepened.

FIG. 34 is a diagram showing the optical path rotating device 30 in which the recessed portions in the optical path rotating device of FIG. 33 are further deepened. The optical path rotating device 32 has the same function as the prism in FIG. 15, and is in the shape that has the portion including the apex A1 cut off, and has a trapezoidal reflecting face S1R1B1C1 as the second reflecting mirror face $\sigma_2$. The face L1M1N1R1S1 of the optical element is the first reflecting mirror face $\sigma_1$. The beam incident horizontally on the first reflecting mirror face $\sigma_1$ is reflected twice and emerges vertically upwards from the second reflecting mirror face $\sigma_2$. The optical path rotating device has a larger tolerance of position of incidence of the incident beam and the energy of the laser beam, a large proportion of which can be subjected to optical path change.

Figure 35:
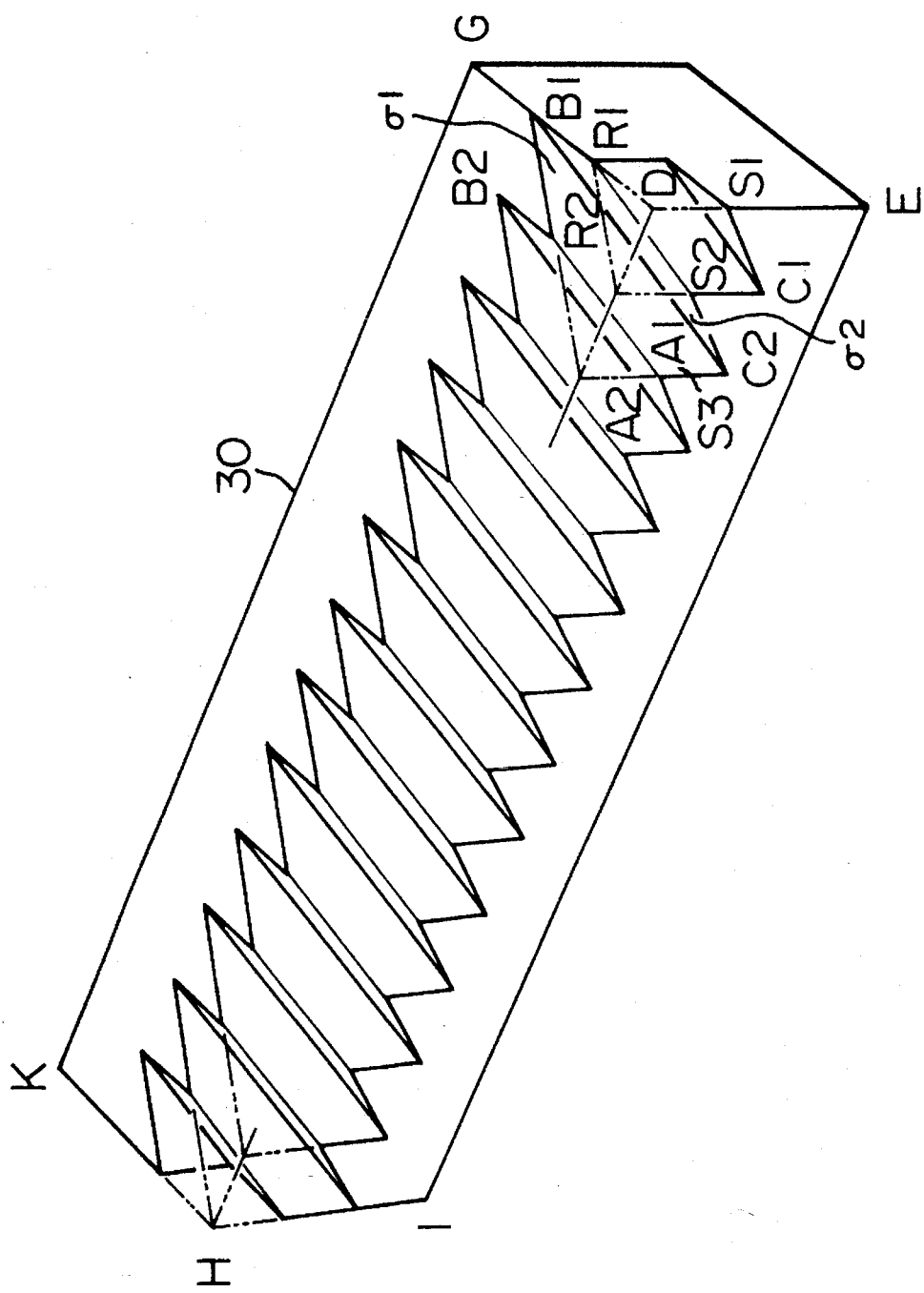
FIG. 35 is a perspective view of a monolithic optical path rotating device equivalent to the optical path rotating device of FIG. 34.

FIG. 35 is a diagram showing a monolithic optical path rotating device formed by cutting out some portion of a prism, the cross section of which is a rectangle, at predetermined pitches instead of adhering unit optical elements. A front face DEIH and a top face DGKH intersect at a right angle, and recessed portions B1R1S2C2S3R2, formed along the edge DH by a vertical face C2B1R2S3 intersecting the front face DEIH at 45 degrees and a face C2B1R1S2 which is perpendicular to the front face and intersects the top face DGKH at 45 degrees, are formed at pitches corresponding to the active layer stripes of the linear array laser diode. By applying the silicon semiconductor manufacturing process, an optical path rotating device of such a minute structure can be manufactured.

Figure 36:
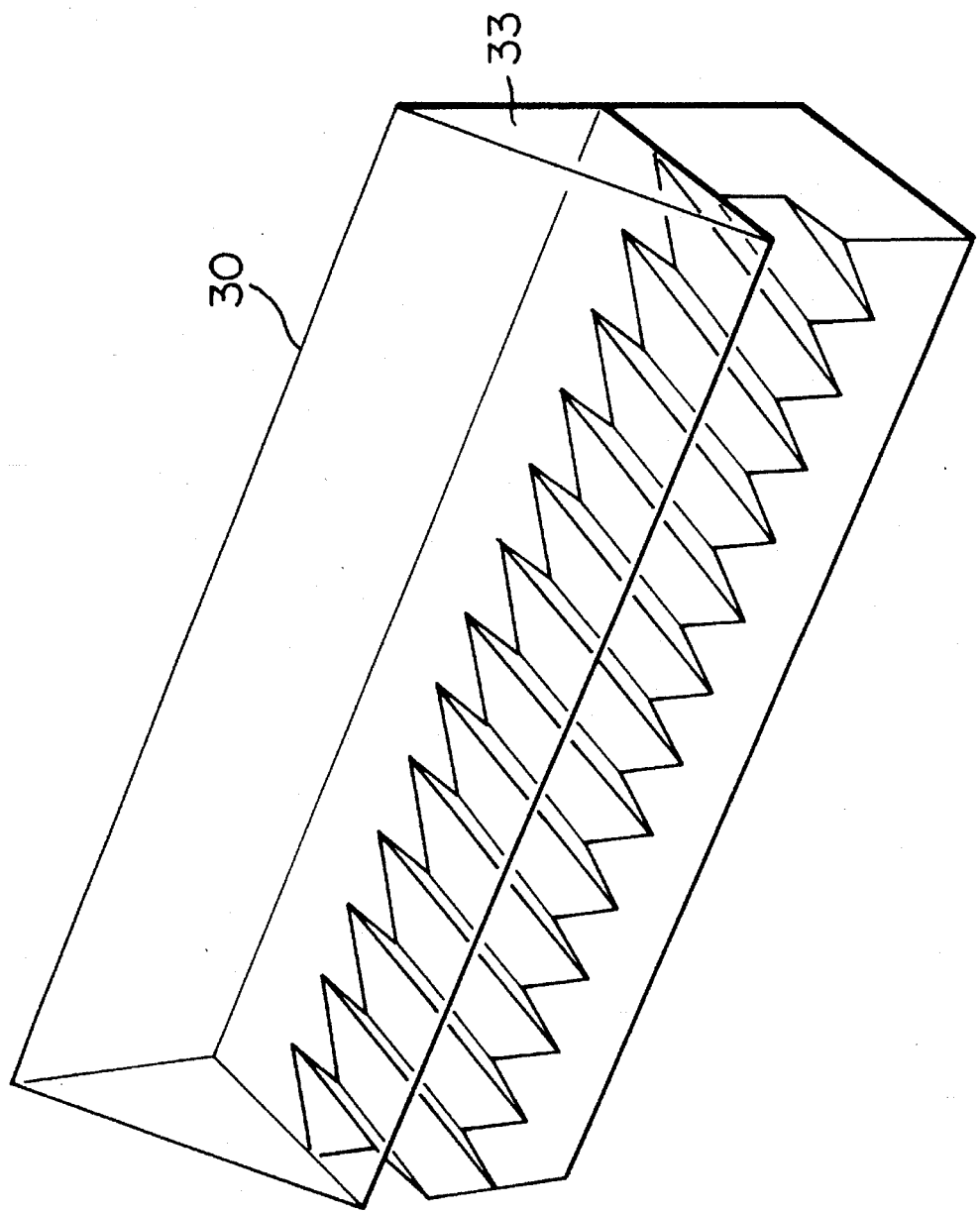
FIG. 36 is a perspective view of an optical path rotating device formed by attaching a right angle prism to the optical path rotating device of FIG. 35.

FIG. 36 is a diagram of an optical path rotating device which bends 90 degrees the direction of the laser beam emerging vertically upwards by the optical path rotating device so as to let the beam emerge in the same direction as the direction of incidence. The light beam traveling vertically upwards, after being reflected in the space placed between the reflecting mirrors, enters vertically the bottom side of the prism, and is bent 90 degrees by a slant face, and emitted in the same direction as the optical axis of the incident beam.

Figure 37:
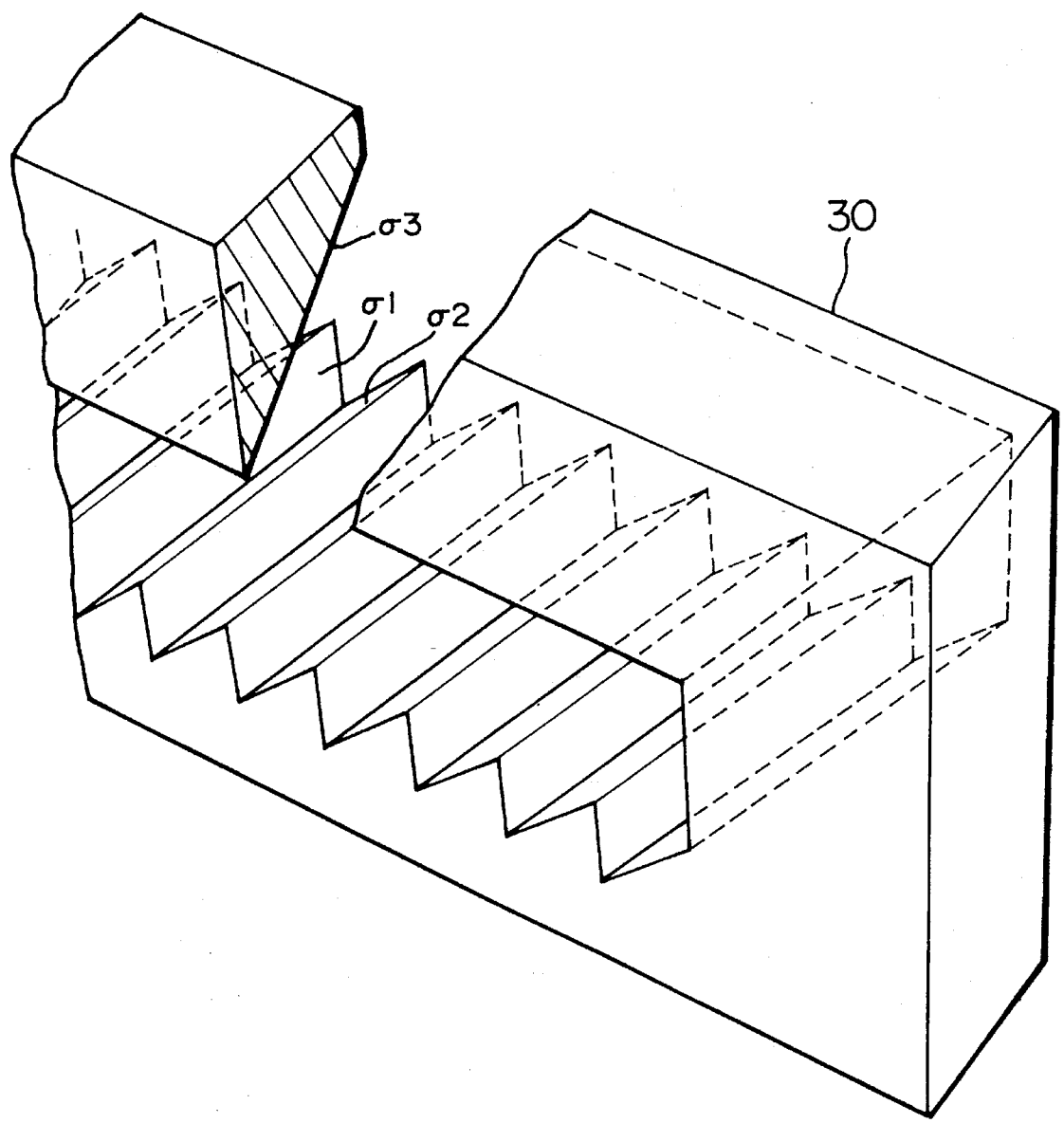
FIG. 37 is a perspective view partly in section showing a portion of the optical path rotating device formed by providing a third reflective mirror on top of the optical path rotating device of FIG. 35.

In the embodiment of FIG. 36, the optical path is changed by a right angle prism, but instead of the right angle prism, reflecting mirrors may be used. FIG. 37 is a diagram showing an optical path rotating device constructed by providing a third reflecting mirror face $\sigma_3$ on the top face of the optical path rotating device of FIG. 35 to bend 90 degrees the direction of the laser beam made to travel vertically upwards by the optical path rotating device of FIG. 35 so as to be emitted in the same direction as the direction of incidence. The beam which is reflected by mirror-finished reflecting mirrors $\sigma_1$ and $\sigma_2$ and emitted vertically upwards, and falls on a mirror-finished third reflecting mirror $\sigma_3$ at an incidence angle of 45 degrees with respect to the bottom side of the optical path rotating device, and the beam is emitted in the same direction as the optical axis 10 of the incident beam. This embodiment offers an advantage that any material can be used if it accepts any mirror finish.

Figure 38:
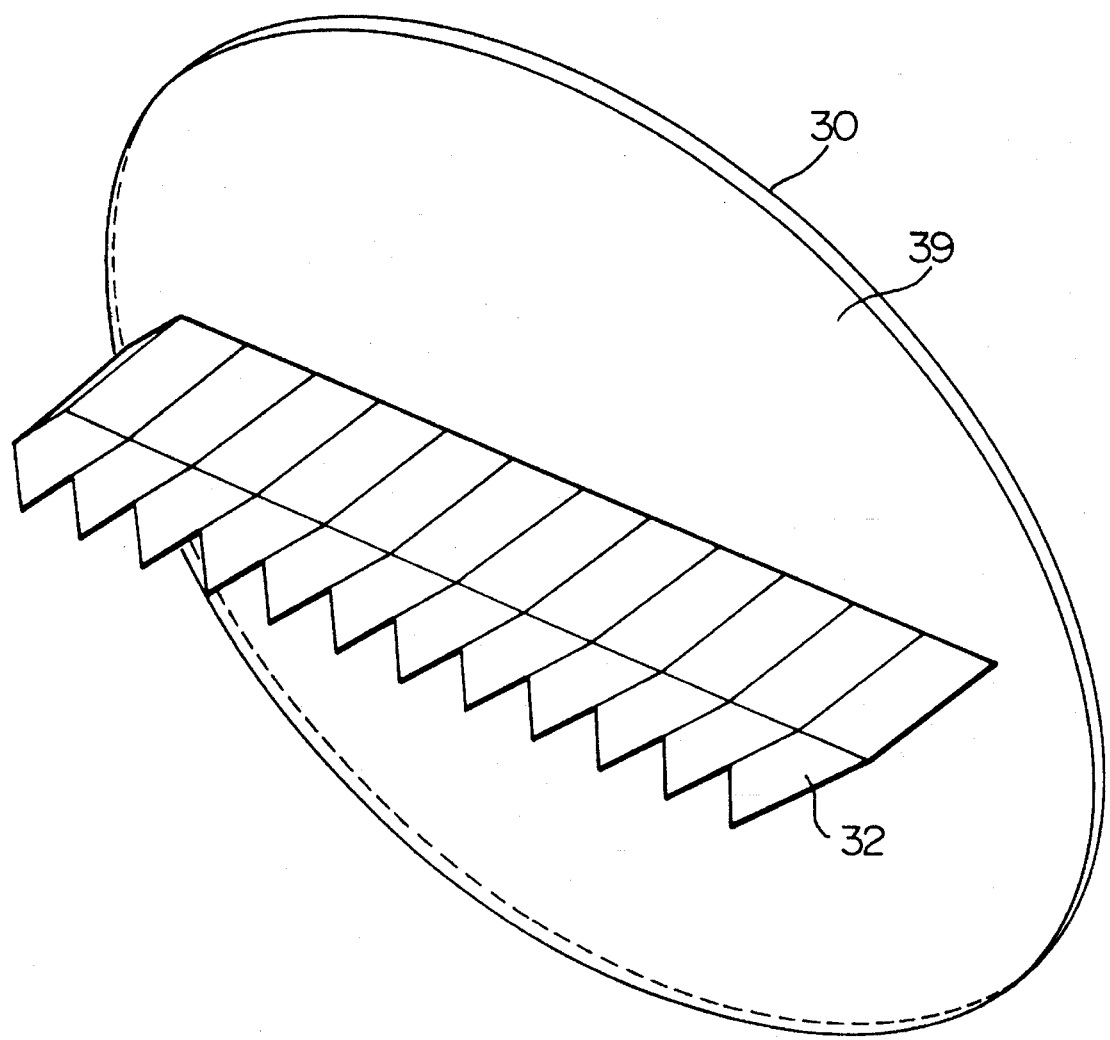
FIG. 38 is a perspective view of an optical path rotating device formed by mounting a plurality of optical elements on a transparent disc.

FIG. 38 shows an optical path rotating device 30 formed for easy handling by mounting a plurality of optical elements 32 on a transparent disc 39. The disc is 3 mm thick and 30 mm in diameter. The optical path rotating device is joined at its face of emergence to the disk with an adhesive having the same refractive index as that of the materials of optical elements and the disc. Optical elements are fixed at fixed positions on a disc, in other words, the unified optical path rotating device 30 is placed at a specified position on a disc, and by using a disc of an adequate size, the optical path rotating device 30 can be controlled so as to be located in a desired position.

Figure 39:
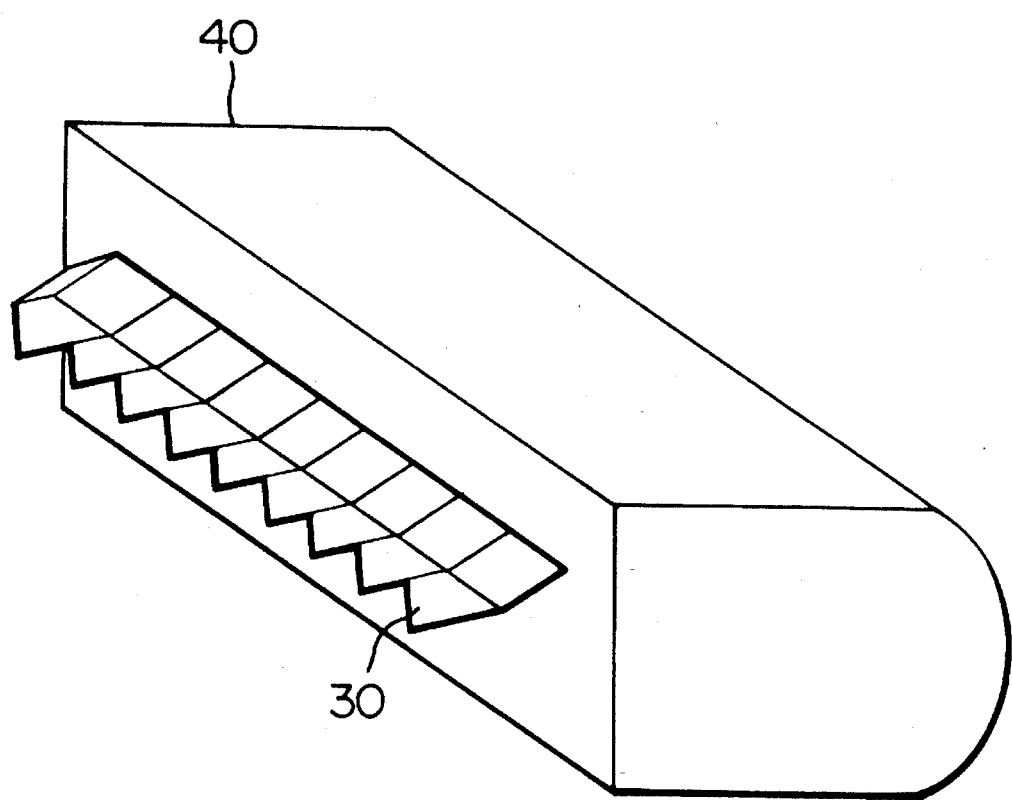
FIG. 39 is a diagram showing an optical path rotating device fitted with a cylindrical lens for collimation.

FIG. 39 is a diagram showing an optical path rotating device 30 joined to a collimating cylindrical lens 40 instead of the disc shown in FIG. 38. As for the cross section of the collimator lens, the face of incidence is flat and the face of emergence is spherical. It be desirable that the lens is thick and the focal distance long. The optical path rotating device 30 is formed by arranging a plurality of optical elements and joining them to the flat face of the lens with an adhesive having an adequate refractive index. By use of the collimator and the optical path rotating device constructed as described, the component parts of the whole semiconductor laser apparatus can be reduced, so that the man-hours for the assembly process can be greatly reduced.

The optical path rotating device may be one that uses a lens of linearly-distributed refractive index as the optical element.

Figure 40:
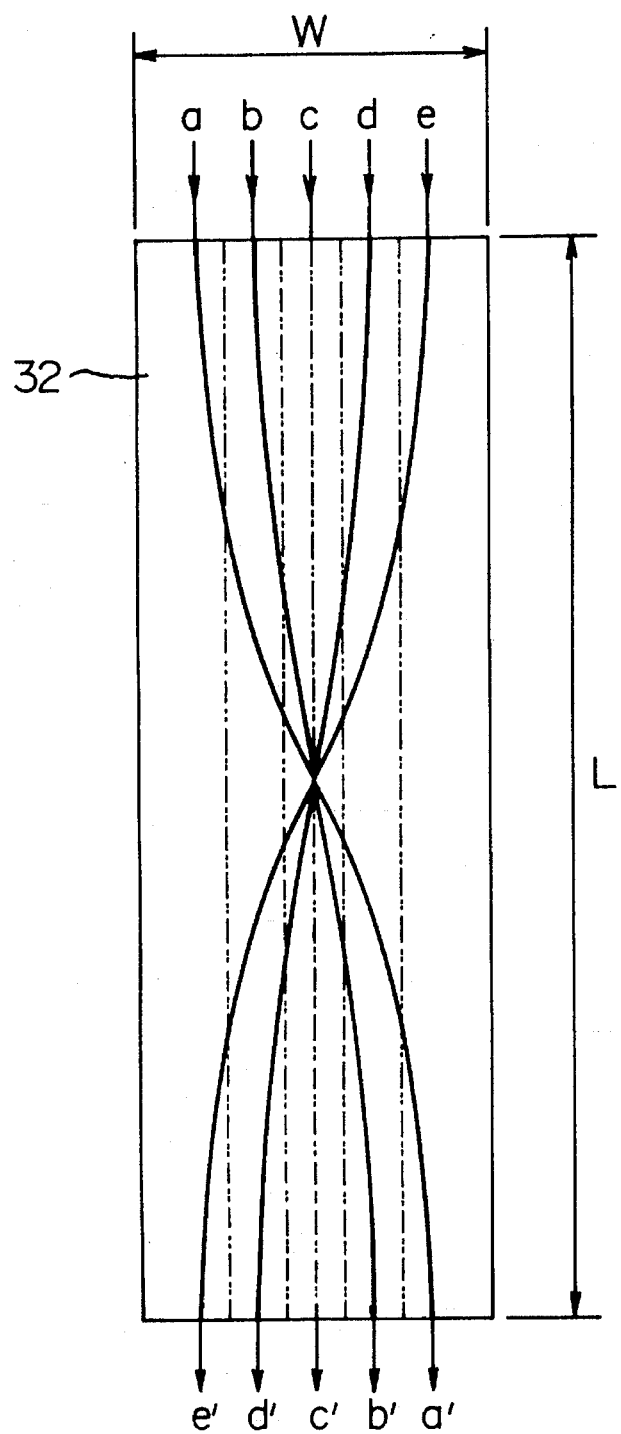
FIG. 40 is a diagram for explaining the function of a lens with a linearly-distributed refractive index.
Figure 41:
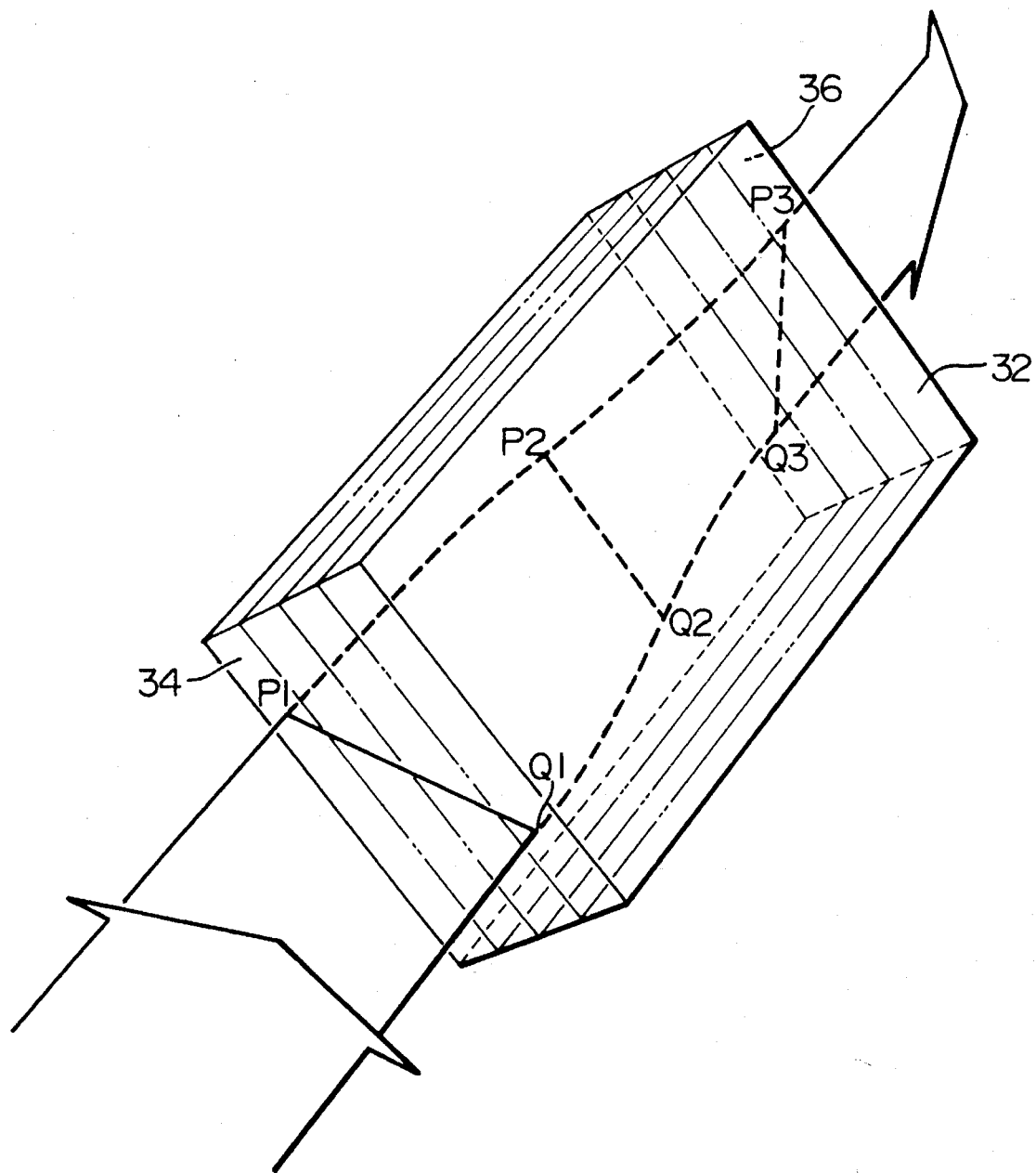
FIG. 41 is a perspective view of an optical element using a lens with a linearly-distributed refractive index.

FIG. 40 is a diagram for explaining the function of a lens of linearly-distributed refractive index, and FIG. 41 is a perspective view of an optical element using a linearly-distributed refractive index lens.

Description will be made of the principle of optical path change of an optical path rotating device according to this embodiment. FIG. 40 is a cross sectional view of a lens element 32 of linearly-distributed refractive index with an optical axis length L of 0.5 pitch (the pitch represents the rotational period of the beam in the lens) used in this invention. This linearly-distributed refractive index lens element 32 is made of a flat optical glass body. In the linear distribution of refractive index across the width, the highest refractive index value $n_0$ is located in the center plane indicated by the solid two-dot chain line, and as approaching towards either side face in the width direction, the refractive index values decrease gradually. For example, the maximum refractive index value $n_0$ is about 1.6, and the difference from the refractive index values at both end face portions is about 0.05. The lens length L conducive to 0.5 pitch is about 10 mm. The lens length L to give 0.5 pitch may change according to the correlation with the refractive index distribution characteristics.

The incident beams a, b, d, and e of light entering from the face of incidence located at the upper position in FIG. 40 advance through the lens marking the curves according to the difference in refractive index at the portions through which the beams travel, and emerge as the emerging beams a', b', d' and e' from the face of emergence. The beam c of light incident on the center portion passes straight through the center portion of the lens, and emerges as the beam c'.

The conventional distributed-refractive-index lens is generally a cylindrical optical glass body in which the refractive index is highest on the central axis and decreases towards the peripheral portions perpendicular to the radiating direction. The refractive index distribution is formed by using ion diffusion distribution obtained by immersing the glass in a molten salt to cause the monovalent ions such as silver ions ($Ag^+$) previously doped in the glass to be exchanged by alkali ions. There is also a known type which has the refractive index varied in the optical axis direction to correct the spherical aberration of the lens. If a flat glass pane is used as in this embodiment instead of the cylindrical lens, by suitably setting the time of ion diffusion, the refractive index distribution is formed such that the refractive index is high in a plane at the center position and low towards the side faces.

When a linearly-distributed refractive index lens element 32 as mentioned above is arranged such that the planes parallel with the optical axis are inclined at 45 degrees to horizontal as shown in FIG. 41 and the beams from a linear light sources flat in the horizontal direction of the incident beams are incident on the face of incidence 34 located at the lower position of the sheet of the diagram, if the line segment at the face of incidence 34 is designated by P1Q1, the beams in the line segment P1Q1 pass through the lens, separately marking respective curves. The line segment P2Q2 at a position where the rotational period is 0.5 pitch, which is the intermediate point of the optical path in the lens, is inclined at 45 degrees from its position at the time of incidence for the highest refractive index $n_0$, in other words, lies along the center plane. At the face of emergence 36, the beams are further rotated 45 degrees to form the line segment P3Q3 tilted vertically, and emerge from the face of emergence. In short, the positions of the flat beams are rotated 90 degrees in the lens.

Figure 42:
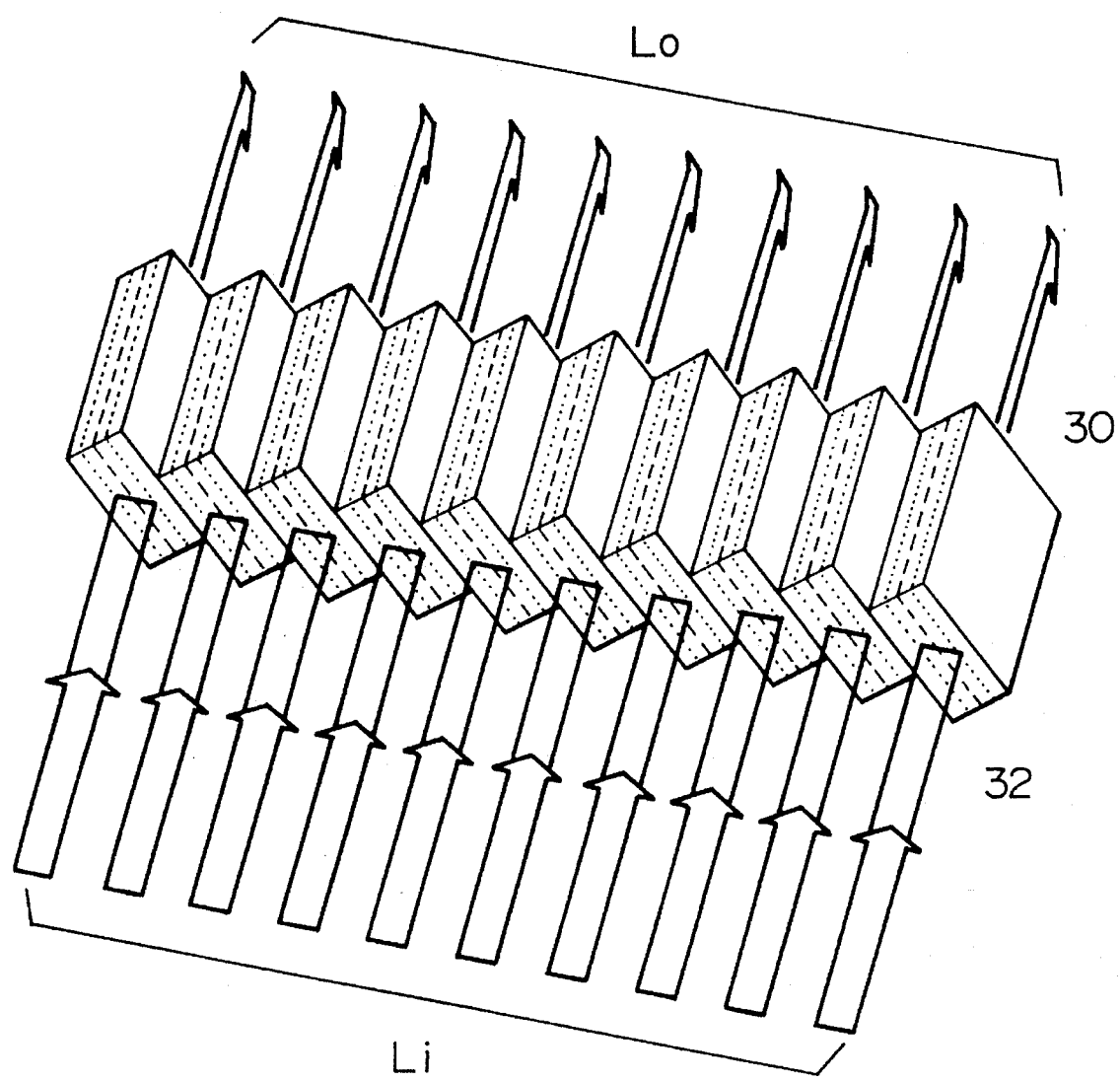
FIG. 42 is a perspective view of an optical path rotating device having the optical elements of FIG. 41 arranged in parallel.

FIG. 42 is a diagram showing an optical path rotating device having linearly-distributed refractive index lenses as the optical elements arranged in a row.

In the optical path rotating device of the present invention, the stripe beams lined up in the form of a dotted line when emitted from the light sources are respectively rotated 90 degrees as they pass through the linearly-distributed refractive index lens elements 32, and emerge from the device as if they were originally arranged in parallel in the form of ladder rungs. More specifically, when an optical path rotating device 30 formed to have a plurality of the linearly-distributed refractive index lens elements 32 shown in FIG. 41 arranged on a one-to-one correspondence with the stripe beams, a plurality of flat stripe beams lined up in a straight line like a dotted line, emitted from the semiconductor laser generating elements, are incident on the corresponding linearly-distributed refractive index lens elements 32. The emerging beams, as the positions of the flat beams are turned 90 degrees from the position when entering the device 30, and therefore the stripe beams are arranged like ladder rungs.

Many stripe beams Li arranged as a short dashed line on a straight line as described above are converted by the optical path rotating device 30 into stripe beams Lo arranged in parallel like ladder rungs as if they were originally emitted that way.

In the above-mentioned arrangement, one linearly-distributed refractive index lens element 32 is placed against a stripe beam. Therefore, when a large number of active layers having small width are arranged, it is necessary to prepare linearly-distributed refractive lens elements of very small size. However, in practical manufacture, a single linearly-distributed refractive index lens element may be used to cover a plurality of stripe beams. In this case, the stripes are divided into groups of a certain number of stripes, each group having a width, which is the same as the pitches at which the linearly-distributed refractive index lens elements are arranged, and the stripe beams in respective groups are rotated 90 degrees by corresponding lens elements. In this case, too, the laser beams can be converged so that their pitches are about equivalent to the pitches of the linearly-distributed refractive index lens elements arranged.

Figure 43:
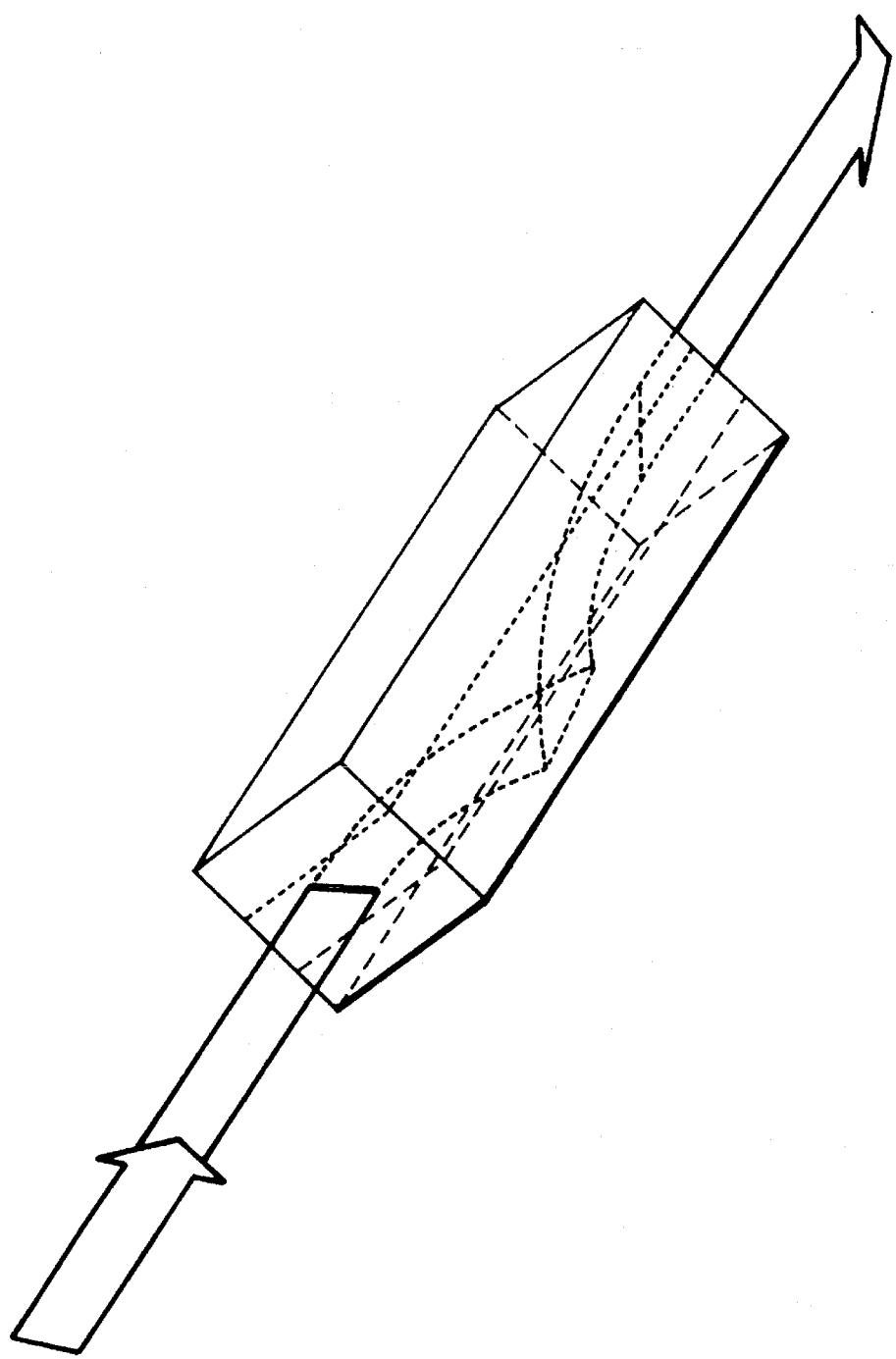
FIG. 43 is a perspective view of an optical element using another lens of a linearly-distributed refractive index.

FIG. 43 is a perspective view of an optical element formed by another linearly-distributed refractive index lens. This optical element 32 is made of a flat optical glass, and its widthwise linearly-distributed refractive index profile shows a monotonic decreasing pattern. When a flat laser beam is incident on the face of incidence as it is suitably inclined with respect to the face of the optical element, the beam is refracted to a direction of high refractive index according to the refractive index distribution, and after being totally reflected by the side face, emerges from the face of emergence marking a refractive locus in contrast to that of the incident beam. By suitably selecting a refractive index distribution and the length of the optical element, it is possible to make an arrangement that when the beam enters the optical element with the widthwise position inclined 45 degrees, the emerging beam emerges with the 10 widthwise position inclined 90 degrees. By arranging optical elements designed as described in a row each inclined 45 degrees, the optical path rotating device of the present invention can be obtained. This optical element is advantageous in that because the refractive index varies in a monotonic pattern from one end face of the plate, a specified refractive index distribution can be formed, and that the manufacturing process is simple.

Figure 44:
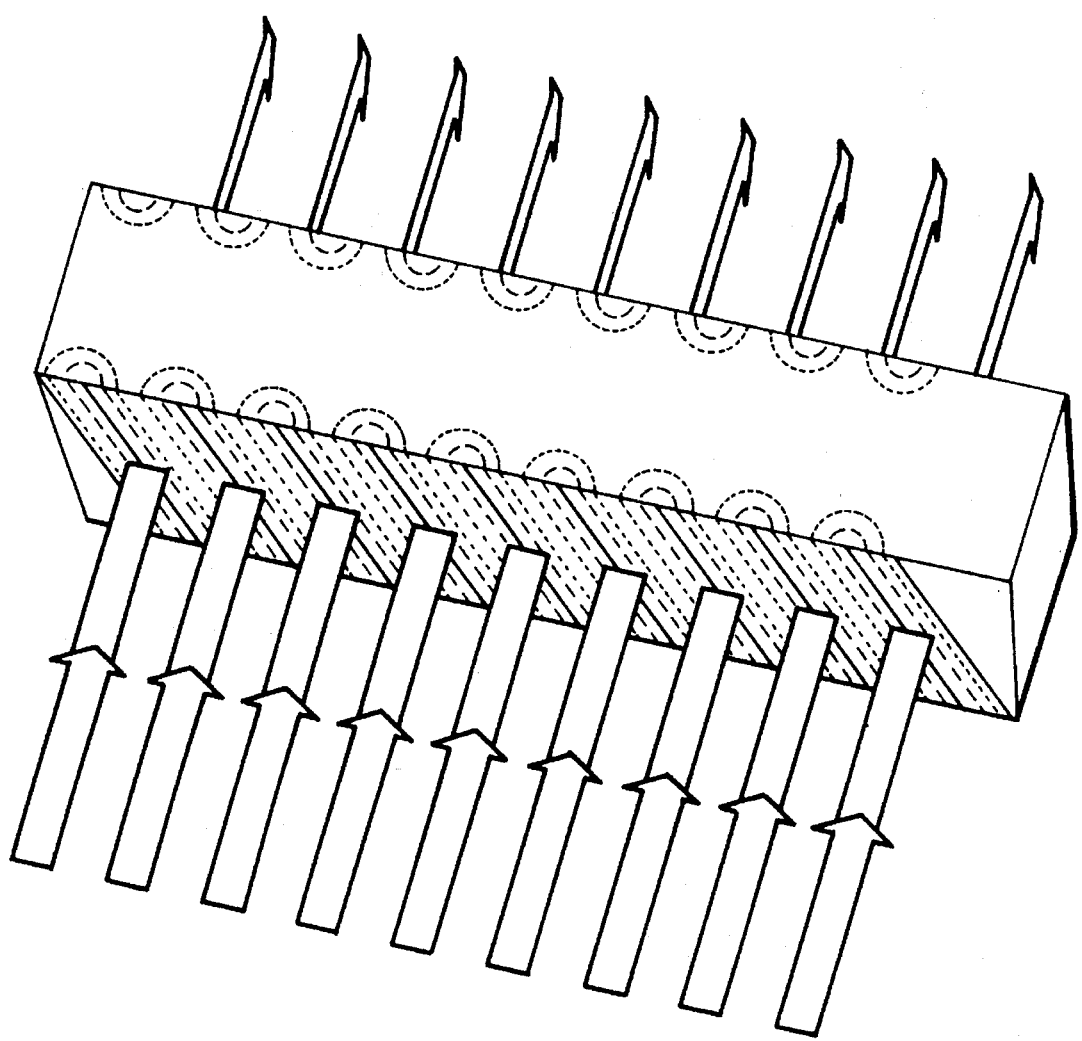
FIG. 44 is a perspective view of an optical path rotating device having arranged on either side of an optical glass body semi-cylindrical portions each with a concentric refractive index distribution.

FIG. 44 is a diagram showing an optical path rotating device having arranged at the corresponding positions on either side of the optical glass body semi-cylindrical portions each with the refractive index decreasing in a concentric pattern. The semi-cylindrical refractive index distribution such as this can be formed by preparing an optical glass having a specified thickness and doped with monovalent ions such as silver ions, and immersing the optical glass in a molten salt with a mask having slanting-line openings inclined 45 degrees applied to the face of incidence and the face of emergence of the optical glass to cause the above-mentioned monovalent ions to be exchanged by alkali ions. In the flat beam incident horizontally on the face of incidence, the beam axis is rotated by being subjected to the refracting powers which differ with different positions of incidence at the 45-degree-inclined semi-cylindrical portions, and becomes parallel with the axis of the semi-cylindrical portion in the middle of the optical path rotating device. When the beam reaches the semi-cylindrical portion at the face of emergence, has the axis of the flat beam further rotated, and emerges from the face of emergence with the beam axis substantially 90 degrees different from the position of the axis of the incident beam. In the manner as described, the stripe beams of the linear array laser diode are converted into the beams arranged substantially like the rungs of a ladder.

The optical path rotating device of FIG. 44 obviates the need to set and join a plurality of optical elements manufactured separately, and can be manufactured easily by performing an ion diffusion process on a flat glass.

Figure 45:
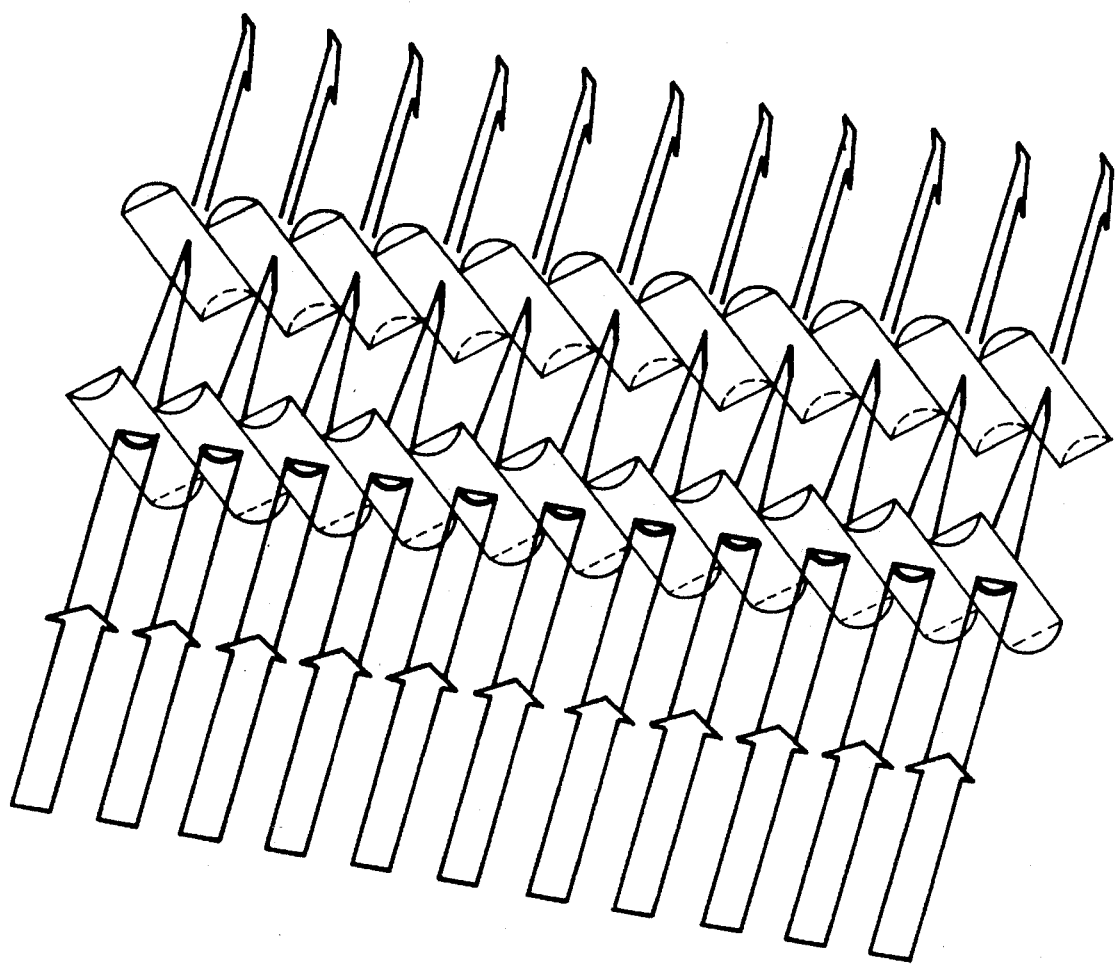
FIG. 45 is a perspective view of an optical path rotating device having cylindrical lenses arranged in two parallel lines.

FIG. 45 is a diagram showing an optical path rotating device having cylindrical lenses arranged side by side with each other. This optical path rotating device is formed by arranging in two parallel lines cylindrical lenses of a cross section of a bow shape formed by a straight line and an arc with the lens axes inclined 45 degrees and with the two lines separated by a suitable distance. In the flat beam incident horizontally on the face of incidence, the axis of the flat beam is rotated by being subjected to different refracting powers at different positions of incidence by a 45-degree-inclined cylindrical lens, and further rotated 45 degrees at the face of emergence for a total rotation of 90 degrees, and emerges from the face of emergence. By using this optical path rotating device, the stripe beams from the linear array laser diode are converted into the beams substantially in the form of the rungs of a ladder.

Figure 46:
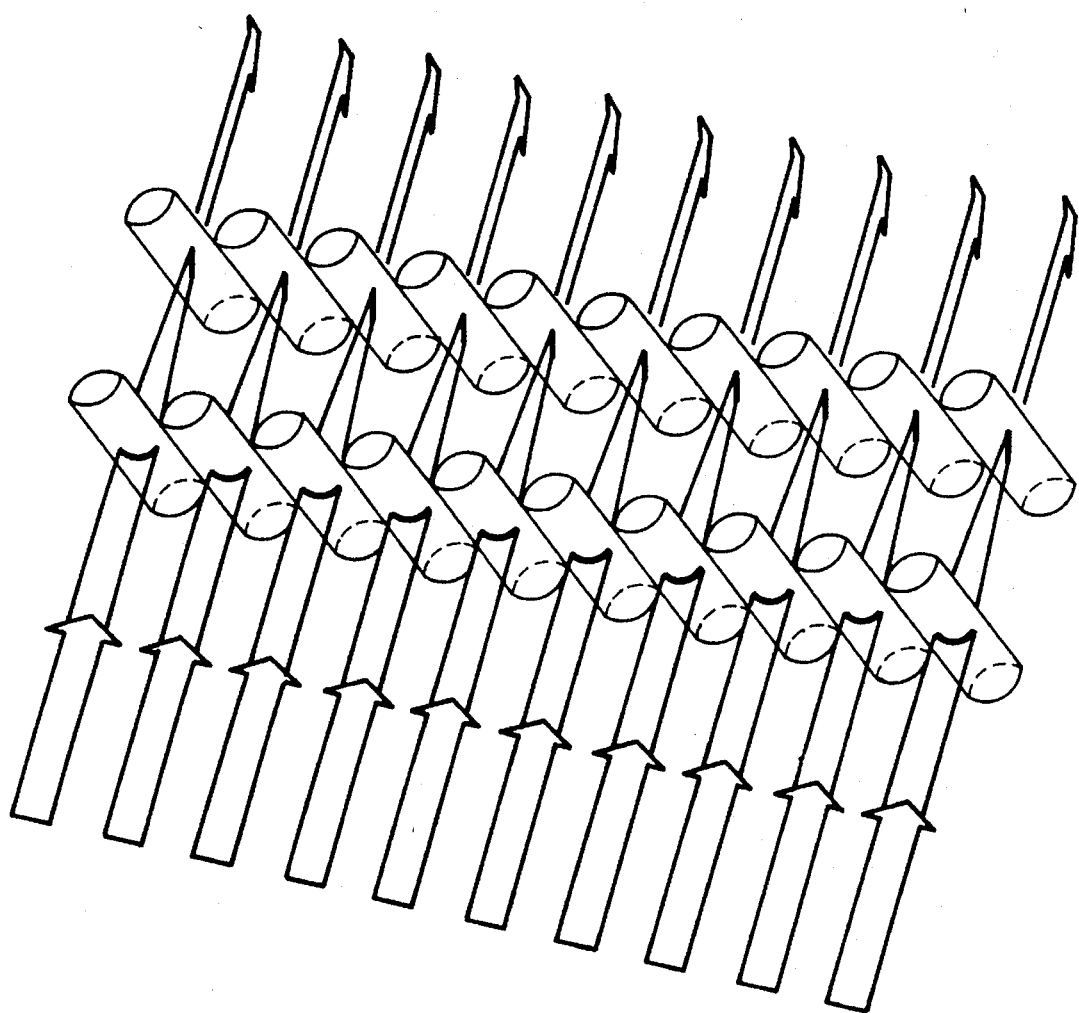
FIG. 46 is a perspective view of an optical path rotating device having cylindrical lenses of another type arranged in two parallel lines.

FIG. 46 is a diagram showing an optical path rotating device having cylindrical lenses of another type arranged in two parallel lines. This optical path rotating device is formed by arranging face-to-face with each other in two parallel lines cylindrical lenses of a cross section formed by two arcs with the lens axes inclined 45 degrees and with a space provided between the two lines. Since the cylindrical lenses of this type have a greater degree of freedom in design than the cylindrical lens of FIG. 45, an accurate optical path rotating device can be produced. Depending on the refractive index, curvature, and distance between the face of incidence and the face of emergence of the lens, the cross section of the cylindrical lens may be a true circle, and if the cross section is a circle, the optical path rotating device can be produced easily.

Figure 47:
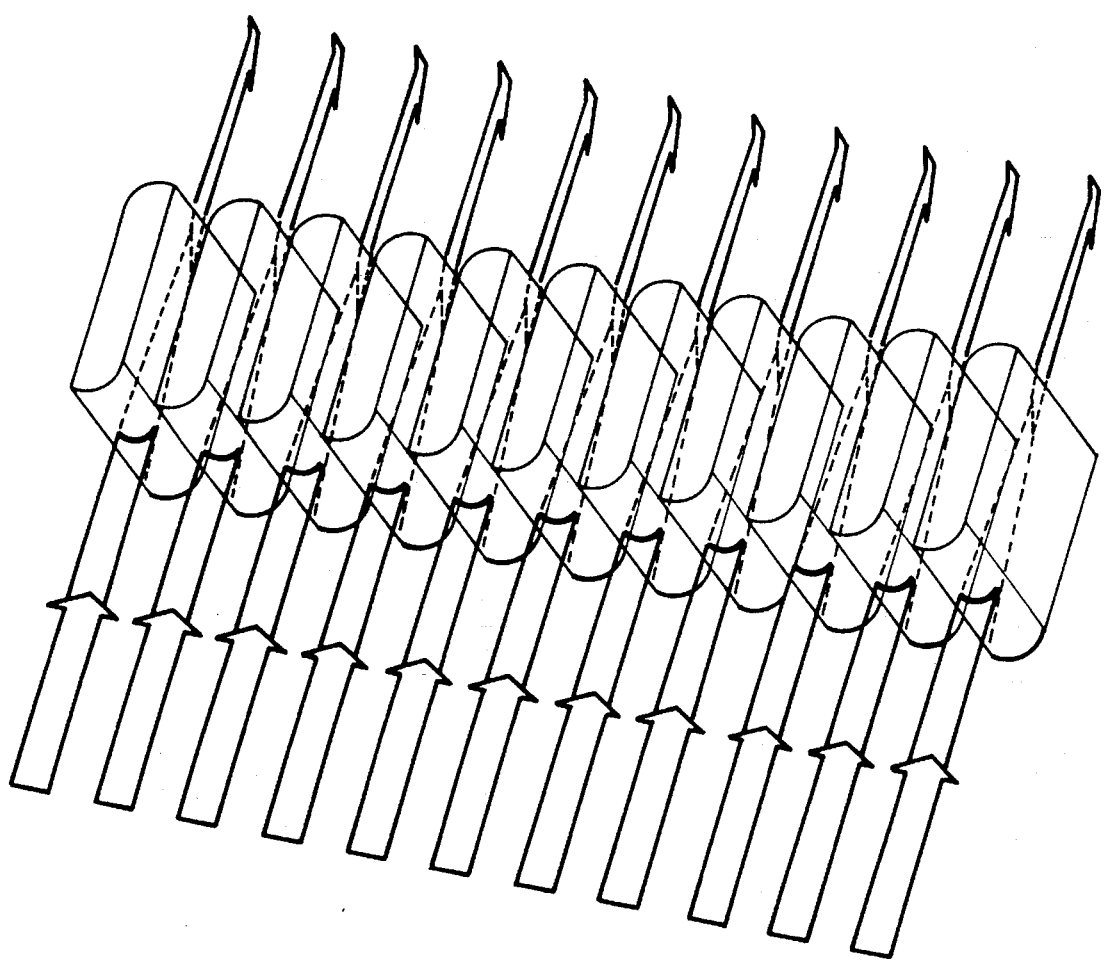
FIG. 47 is a perspective view of an optical path rotating device having optical elements with cylindrical faces for receiving and emitting light arranged in parallel.

FIG. 47 shows an optical path rotating device having joined together a plurality of optical elements made of optical glass each having cylindrical faces of incidence and emergence, parallel side faces, and a dense interior. Each optical element is inclined at 45 degrees to horizontal. In the flat beam incident horizontally on the face of incidence, the axis of the flat beam is rotated by being subjected to different refracting powers at different positions of incidence, which are produced on the cylindrical face of the 45-degree-inclined face of emergence, and the axis of the flat beam is further rotated at the cylindrical face of the 45-degree-inclined face of emergence for a total of substantially 90 degrees, and the beam emerges from the face of emergence. As has been described, the stripe beams from the linear array laser diode are converted into the beams substantially in the form of ladder rungs. If the optical elements are so positioned as to match the pitches of the stripe beams, the optical elements need not have parallel side faces, and a cylindrical lens with a true circle cross section can be used.

Figure 48:
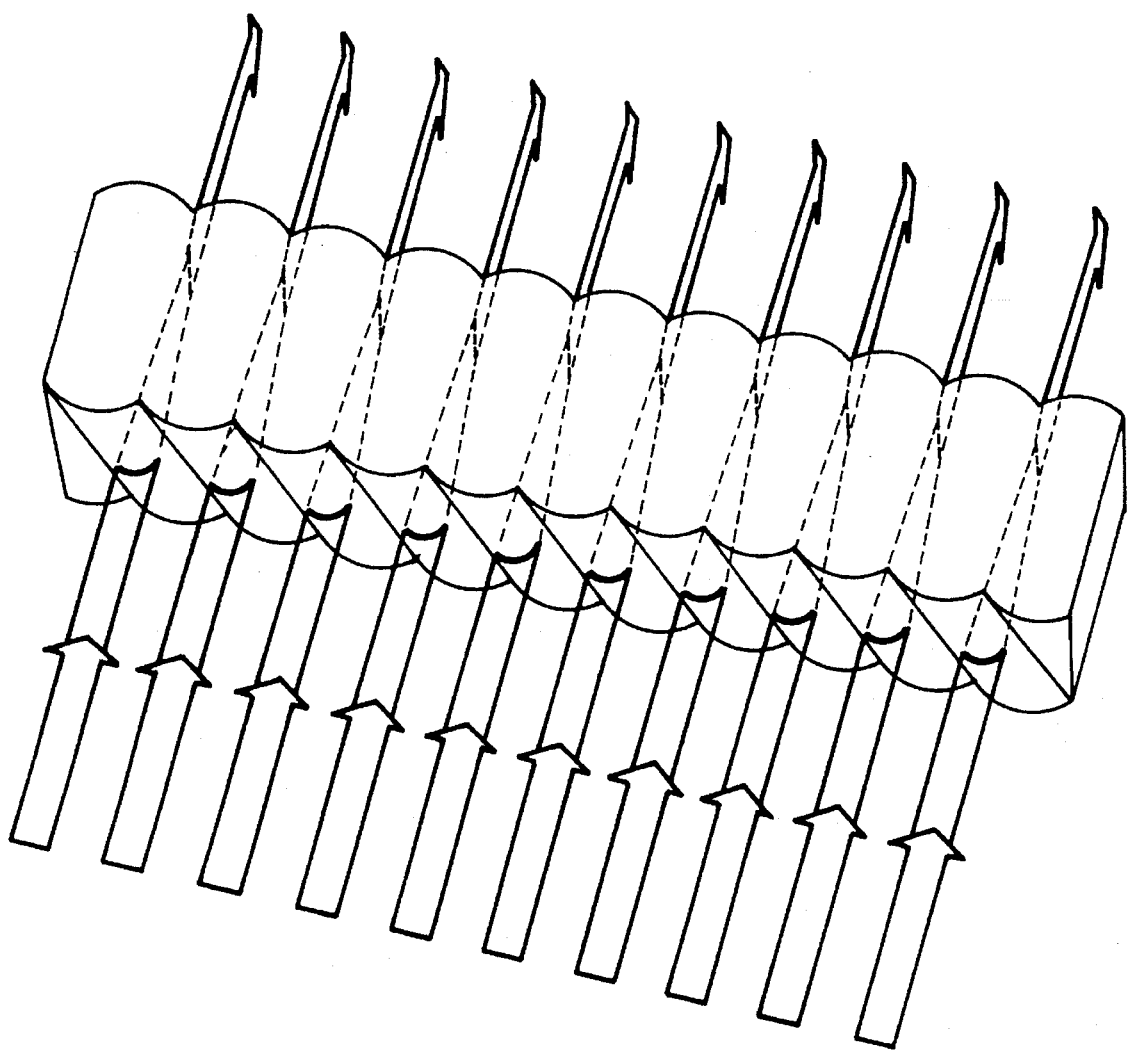
FIG. 48 is a perspective view of an optical path rotating device formed from a block of optical glass.

FIG. 48 shows an optical path rotating device made from an optical glass block. A plurality of cylindrical faces, inclined 45 degrees in the same direction, are formed both on the incidence and emergence faces of an optical glass prism of a rectangular cross section. This optical path rotating device has the same function as the one shown in FIG. 47. The optical path rotating device may be one including optical elements utilizing diffraction.

Figure 49A:
FIGS. 49A and 49B are is a diagrams for explaining an optical element utilizing binary optics.
Figure 49B:
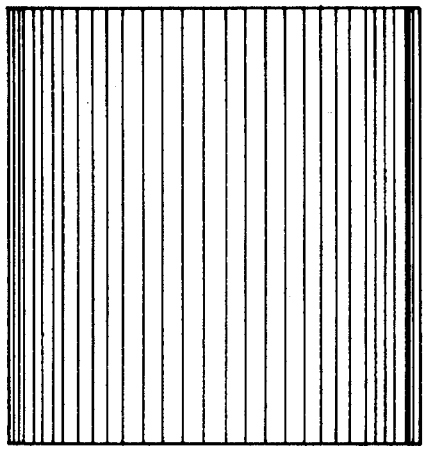

FIGS. 49A and 49B show diagrams of an optical element using binary optics. This optical element is made by forming many grooves with depths varying symmetrically with respect to the center axis in a direction perpendicular to the axis of a transparent plate. Among optical elements obtainable by binary optics, there is a multilevel diffractive lens, for example, in which the depths of the grooves are formed by utilizing diffraction so as to vary such that the diffraction angle increases from the center to the outer portions (Refer to Swanson et al. U.S. Pat. No. 4,895,790). Binary optics mentioned above use optical glass and plastics, and can also be produced using a mold.

Figure 50A:
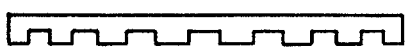
FIGS. 50A and 50B are is a diagrams for explaining an optical element utilizing a laminar Fresnel zone plate.
Figure 50B:
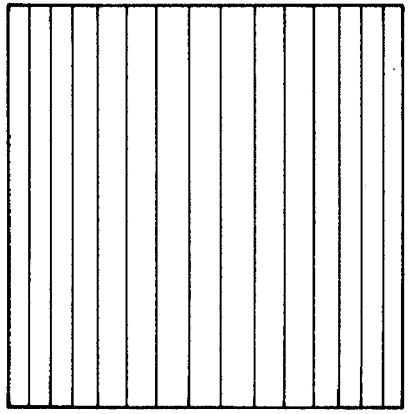

FIGS. 50A and 50B show diagrams of an optical element using a laminar type Fresnel zone plate. This optical element has many square-wave-like grooves formed at different intervals symmetrically with respect to the center axis in a direction perpendicular to the axis of a transparent plate. The intervals of the grooves vary such that the diffraction angle to the incident beams increases from the center to the outer portions. The Fresnel plate with square-wave-like grooves such as this can be obtained by an etching method or a replica method.

Figure 51:
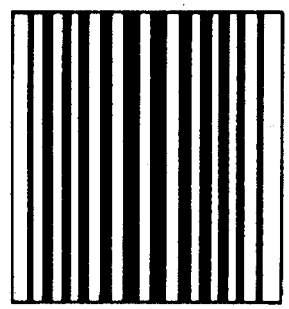
FIG. 51 is a diagram for explaining an optical element utilizing a mask type Fresnel zone plate.

FIG. 51 is a diagram showing an optical element using a mask type Fresnel zone plate. This optical element has many slits with varying intervals formed symmetrically with respect to the center axis in a direction perpendicular to the axis of a transparent plate. The intervals of the slits vary such that like in the optical element using a Fresnel plate in FIG. 50, the diffraction angle to the incident beams increases from the center to the outer portions. The Fresnel zone plate with slits such as this can be obtained by forming slits by using an opaque mask.

Figure 52:
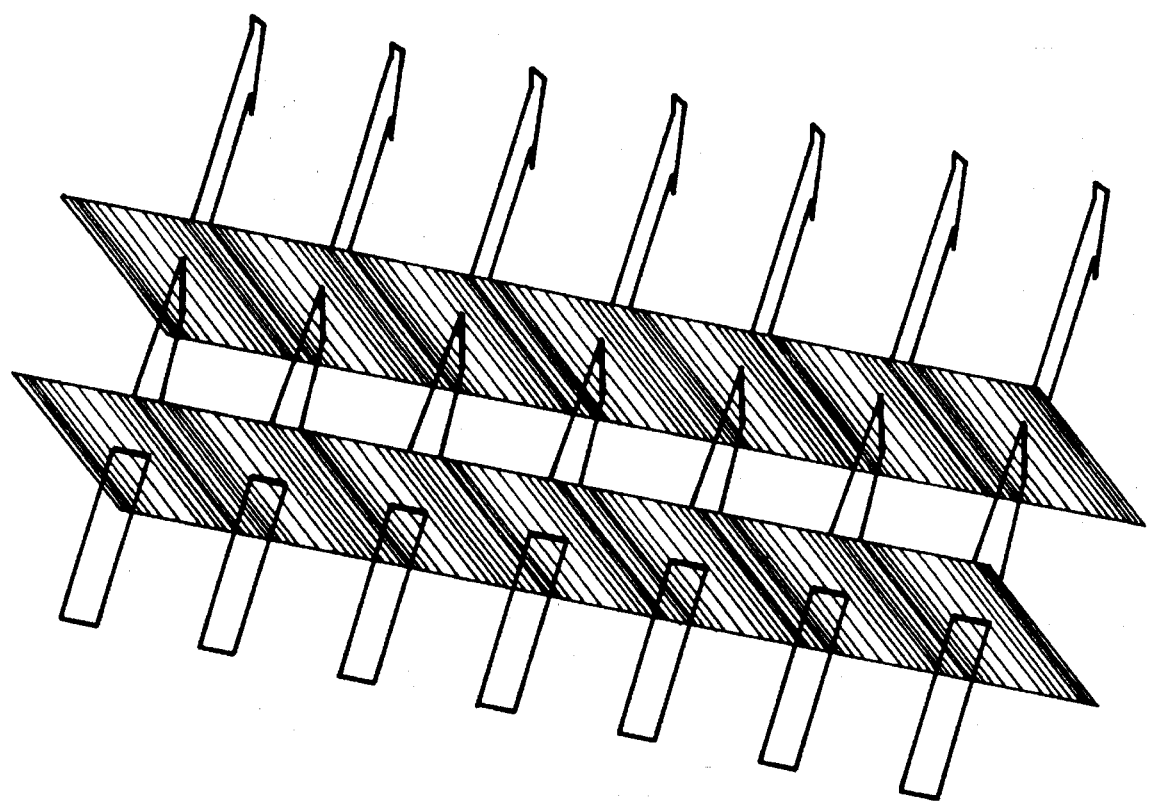
FIG. 52 is a diagram for explaining an optical path rotating device utilizing diffraction.

FIG. 52 is a diagram showing an optical path rotating device made by forming diffraction-applied optical elements on the face of incidence and the face of emergence, and arranging two rows of the optical elements facing each other across a space provided as in the case shown in FIG. 45. This optical path rotating device has optical elements, the axes of which are inclined at 45 degrees to horizontal, arranged in parallel such that a pair of optical elements faces the corresponding active layer stripe of the linear array laser diode. When the beams flat in a horizontal direction fall on the device, since the diffraction angle increases with an increasing distance from the center in each optical element, when the beams pass through the incidence face plate, the axes of the flat beams rotate in the direction approaching the center axes, and after reaching the emergence face plate, the beams are rotated at the face of incidence by the same amount in the same direction on the light reversibility principle, and emerge with the axes of the flat beams rotated for a total of about 90 degrees in the long run. This function is exactly the same as in FIG. 45.

Embodiment 3

Figure 53:
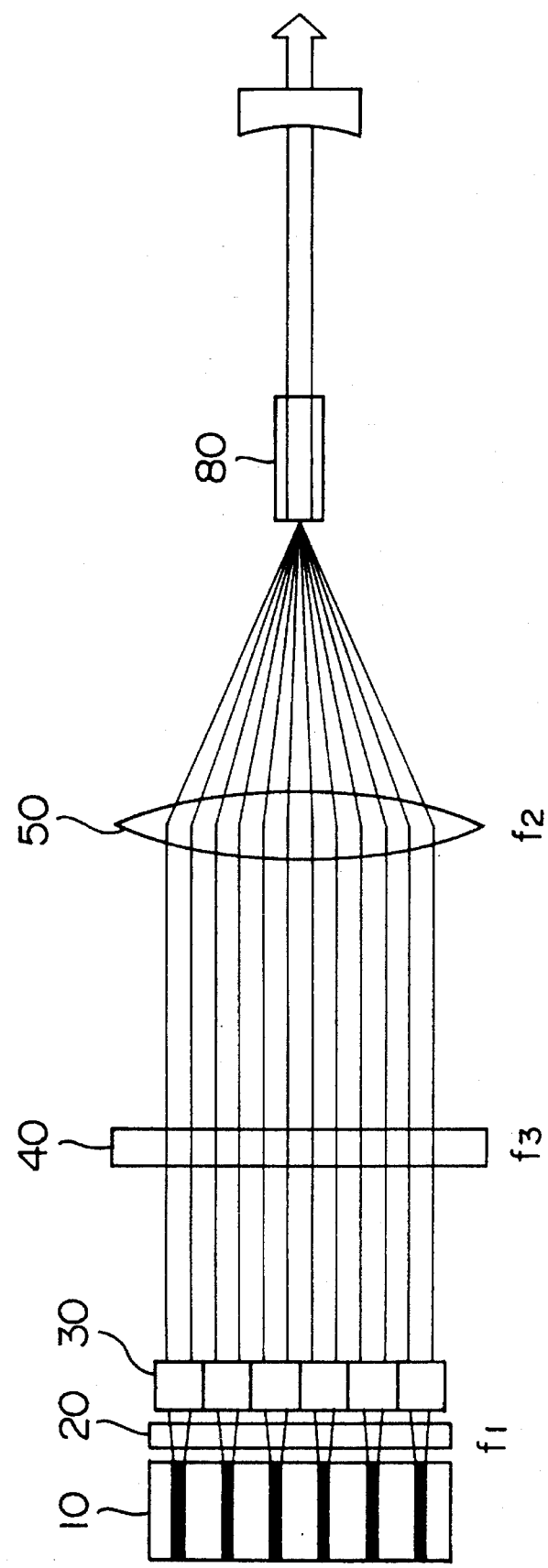
FIG. 53 is a block diagram for explaining a semiconductor-laser-pumped solid state laser apparatus.

FIG. 53 is a block diagram for explaining the semiconductor-laser-pumped solid state laser apparatus of the present invention. This semiconductor-laser-pumped solid state laser apparatus uses the semiconductor laser apparatus of embodiment 1 as a light source for pumping the solid state laser 80. The conventional semiconductor laser apparatus using a linear array laser diode could not produce a substantially high energy density even though it concentrates the energy of the beams by an optical system because the energy is concentrated only in an elongated spot. When it is required to produce a high power output effectively, the only possible laser configuration is a side pumped laser. In contrast, in the semiconductor-laser-pumped solid state laser apparatus of this embodiment, dotted-line-like stripe beams of a linear laser diode 10 are first condensed in a direction perpendicular to the active layer stripes by a first cylindrical lens with a short focal distance $f_1$, and then converted into laser beams in the form of rungs of a ladder by using an optical path rotating device 30. After the ladder-rung-shaped laser beams are condensed in the widthwise direction by a second cylindrical lens 40 with a long focal distance $f_3$, the energy is converged in a small area on the light-receiving face of the solid state laser 80 by a focusing lens 50. The semiconductor laser apparatus of embodiment 1, as described earlier, can concentrate the energy in a specified narrow area by the condensing power which varies with the vertical direction $f_2/f_1$ and the widthwise direction $f_2/_3$. For this reason, the semiconductor-laser-pumped solid state laser apparatus of the present patent application, in which the semiconductor laser apparatus of-embodiment 1 is used, can make effective use of output of the linear array laser diode 10 and enables the solid state laser 80 to be also pumped by end pumping. As the solid state laser element, in addition to ordinary solid state elements such as a YAG or YLF laser, a solid state laser including a Q switch or a wavelength changing element can be used. The light beam may be injected from a pumping light source into the solid state laser element at a Brewstar angle. The solid state laser element may be a short absorption length laser crystal ($YVO_4$). With the semiconductor-laser-pumped solid state laser apparatus of the present invention, a YAG laser output of 3 W is obtained by using a 10-W semiconductor laser element.

Figure 54:
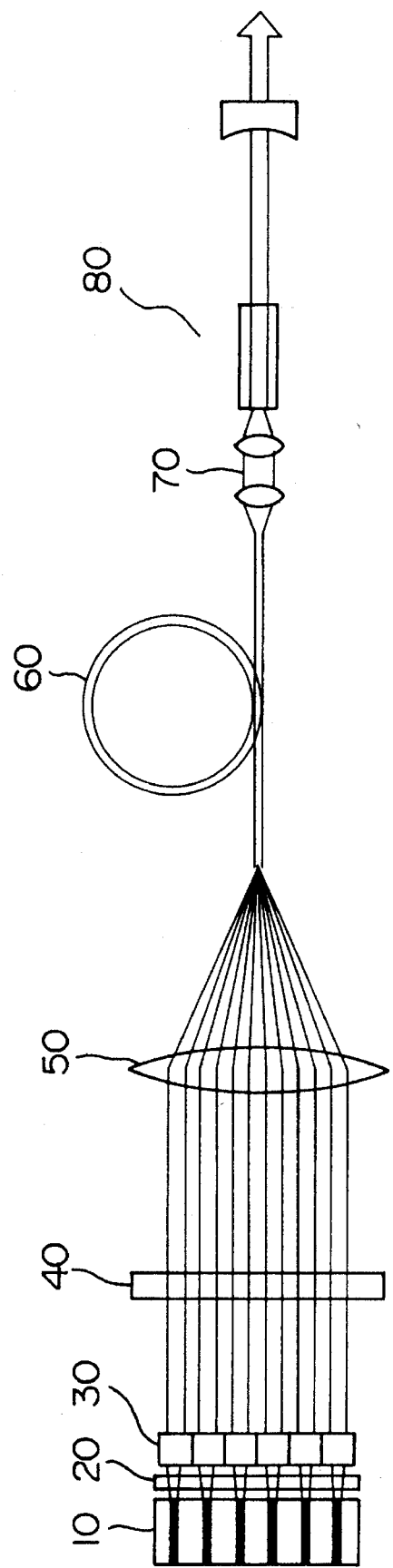
FIG. 54 is a block diagram for explaining optical fiber-guided semiconductor-laser-pumped solid state laser apparatus.

FIG. 54 is a block diagram for explaining an optical-fiber-guided semiconductor-laser-pumped solid state laser apparatus. This optical-fiber-guided semiconductor-laser-pumped solid state laser apparatus uses an optical fiber 60 to guide output of the semiconductor laser apparatus of embodiment 1 to pump the solid state laser 80. The output end of the optical fiber is provided with an optical system 70 for collimating and once again converging the energy of the laser beam which diverges from the end portion. As described, since there is a flexible optical fiber between the semiconductor laser apparatus and the solid state laser unit, the apparatus is provided with a greatly increased degree of freedom, and can be configured more easily. With the optical-fiber-guided semiconductor-laser-pumped solid state laser apparatus, a YAG laser output of 2 W is obtained from a 10-W semiconductor laser element.

Figure 55:
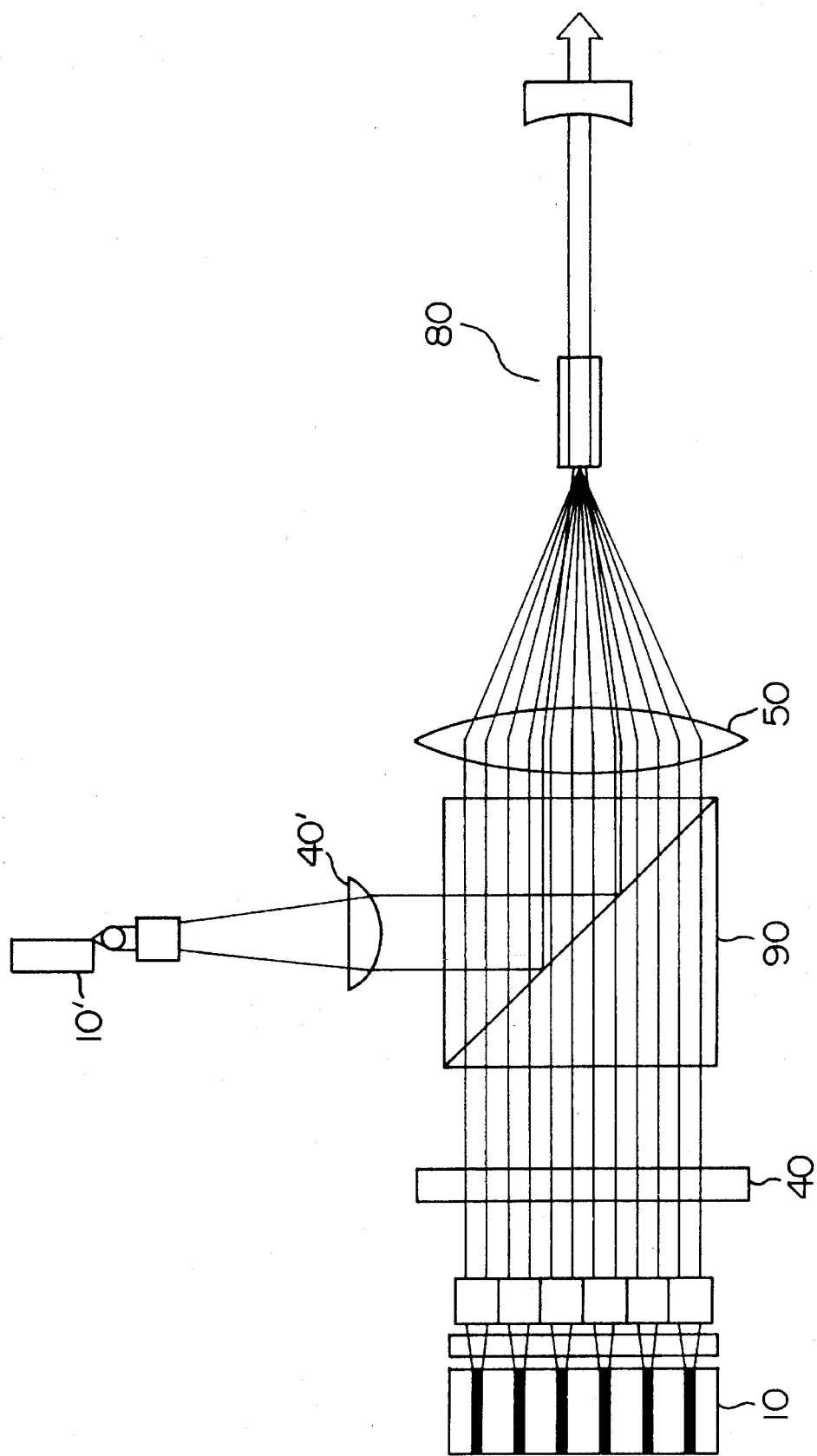
FIG. 55 is a block diagram of a semiconductor-laser-pumped solid state laser apparatus using two linear array semiconductor laser elements.

FIG. 55 is a block diagram for explaining a semiconductor-laser-pumped solid state laser apparatus for obtaining doubled output power made by using two linear array semiconductor laser elements. This apparatus is provided with a polarization beam splitter PBS 90 between a second cylindrical lens 40, and another second cylindrical lens 40' and a focusing lens 50. The polarization beam splitter 90 has a high reflective film for one and a low reflective film for the other of linearly polarized luminous fluxes, the polarization directions of which intersect at right angles. Output beams of two linear array semiconductor laser elements 10 and 10' are arranged to intersect at right angles, and at the intersecting position, a polarization beam splitter PBS 90 is placed, so that one output passes straight through PBS 90 and the other output is reflected by the reflecting face of PBS 90, and the two output beams are combined and are incident on the focusing lens 50 which focuses the beams on the pumping face of the solid state laser 80. In order that the polarization directions of the two laser beams intersect at right angles, the semiconductor laser apparatuses are installed so as to be at a right angle to each other. Under this arrangement, outputs of the two semiconductor laser elements can be utilized, so that the laser apparatus can produces twice as much output as in other embodiments.

Figure 56:
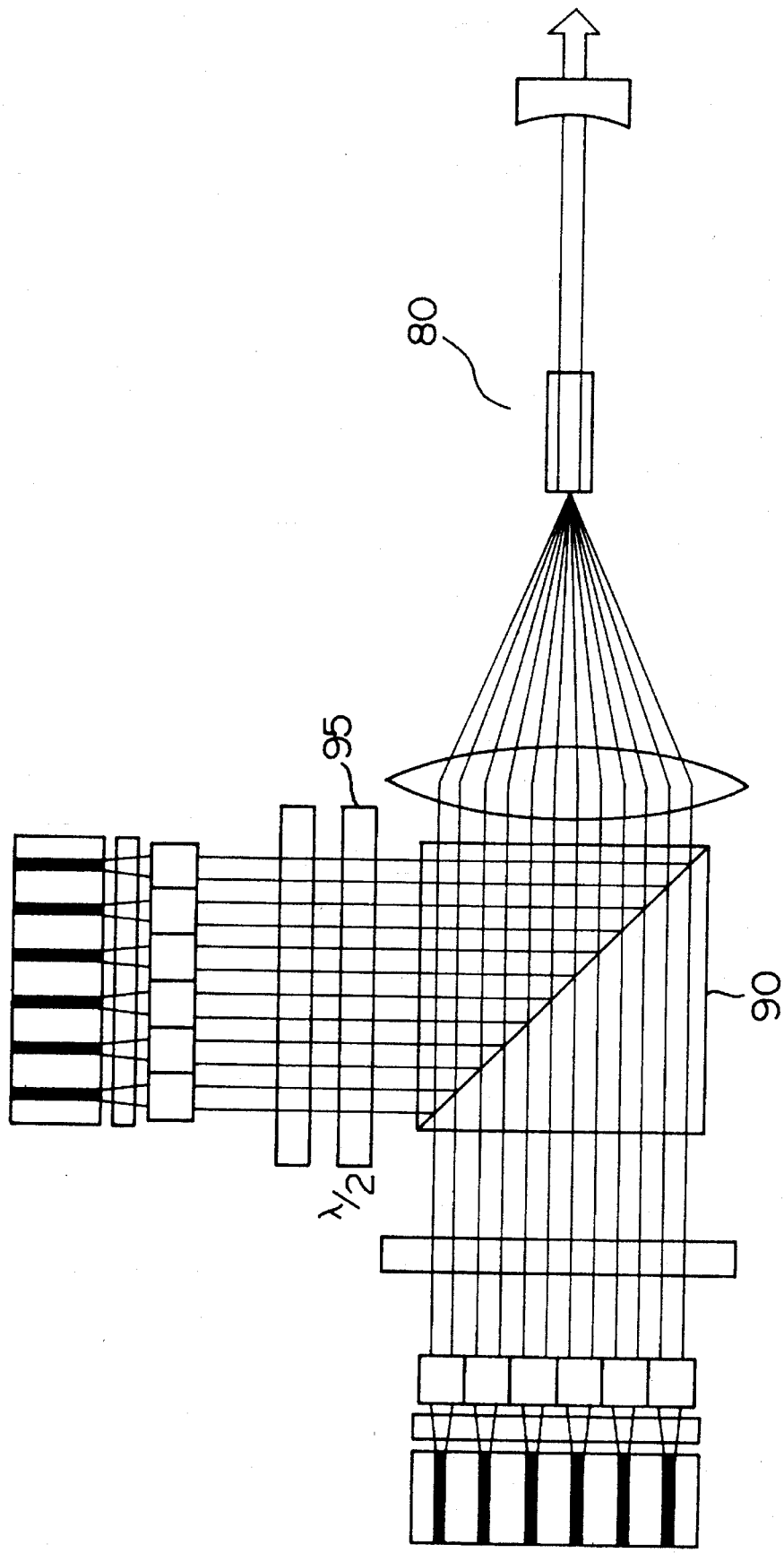
FIG. 56 is a block diagram of another semiconductor-laser-pumped solid state laser apparatus using two linear array semiconductor laser elements.

FIG. 56 is a diagram showing another type of the semiconductor-laser-pumped solid state laser apparatus for obtaining doubled output power. In the semiconductor-laser-pumped solid state laser apparatus in FIG. 55, the semiconductor laser apparatuses are installed at a right angle with each other to have the polarization directions intersecting at a right angle. Instead, in this embodiment, a half wave plate 95 is placed for one of the outputs to pass therethrough. In FIG. 56, the linearly-polarized luminous flux from the semiconductor laser apparatus located to the left of the polarization beam splitter 90 passes 100% through the polarization beam splitter. On the other hand, when the linearly-polarized luminous flux from the semiconductor laser apparatus drawn above the polarization beam splitter 90 in FIG. 56 passes through a λ/2 wave plate 95, the polarization direction is rotated 90 degrees, so that the luminous flux is reflected 100% by the polarizing film on the polarization beam splitter. Thus, the luminous fluxes from the two semiconductor laser apparatuses are combined and radiated to the pumping face of the solid state laser apparatus 80, thereby pumping the solid state laser element. According to the structure of the apparatus, the widthwise dimension of the apparatus can be decreased.

We claim:

1. A semiconductor laser apparatus comprising:

a linear array laser diode, having a plurality of laser-beam-emitting emitters having emitter faces arranged to extend linearly in a first direction for emitting a group of laser beams in a form of a dotted line;

a first condenser, disposed in front of said linear array laser diode, for collimating said group of laser beams by refracting them to a direction substantially perpendicular to said first direction;

an optical path rotating device, disposed in front of said first condenser, having arranged in parallel a plurality of optical elements for bending substantially at a right angle an axis of a cross section of at least a laser beam, for receiving the group of laser beams collimated in said second direction, and emitting the group of laser beams substantially in the form of ladder rungs lined up in said first direction by rotating the axis of the cross section of the laser beams for each of said optical elements;

a second condenser for collimating said group of laser beams substantially in the form of ladder rungs by refracting the beams to a direction substantially perpendicular to said first direction; and a third condenser for bringing the group of laser beams emitted from said second condenser into focus.

2. A semiconductor laser apparatus according to claim 1, further comprising an optical fiber having an end face at a face of said focus.

3. A semiconductor laser apparatus according to claim 1, wherein said first and second condensers are respectively cylindrical lenses.

4. An optical path rotating device comprising a plurality of optical elements, each including a light receiving part for receiving an incident beam, the cross section of which is perpendicular to an optical axis and which has a first axis; an optical system for rotating substantially by a right angle the first axis of said cross section of the beam; and a light emitting part for emitting an emerging beam having passed through said optical system, wherein the light receiving parts and the light emitting parts of the optical elements are arranged so as to be adjacent to one another in the same planes, respectively and in such a way that said optical elements correspond to the emitting faces of a linear array laser diode.

5. An optical path rotating device according to claim 4, wherein said optical elements are arranged at the same pitches as the pitches of the emitters of the linear array laser diode.

6. An optical path rotating device according to claim 4, wherein said optical elements are disposed to correspond to a plurality of emitters of the linear array laser diode.

7. An optical path rotating device according to claim 4, wherein each said optical element has a first reflecting face on which the incident beam having said first axis and reflected by said light receiving part is incident, and a second reflecting face for emitting the emerging beam having said first axis rotated substantially by a right angle by reflecting the incident beam emitted from the first reflecting face.

8. An optical path rotating device according to claim 7, wherein each said optical element has the optical axis of the incident beam, the light receiving part, first and second reflecting faces, and emitting parts formed in such a way as to satisfy the following relations:

$$(N \cdot A)^2 + (M \cdot A)^2 - 2(N \cdot A)(M \cdot A)(N \cdot M) = (1 - \cos\theta)/2$$

$$(N \cdot Ap)^2 + (M \cdot Ap)^2 - 2(N \cdot Ap)(M \cdot Ap)(N \cdot M) = \frac{1}{2}$$

where A is a unit direction vector representing the optical axis of said incident beam, Ap is a unit direction vector representing the direction of the first axis in the incident beam, C is a unit direction vector representing the optical axis of the emerging beam, Cp is a unit direction vector representing the direction of the rotated first axis in the emerging beam, $\theta$ is an angle formed by A and C, N is a unit direction vector representing the normal to the first reflecting face, and M is a unit direction vector representing the normal to the second reflecting face.

9. An optical path rotating device according to claim 7, wherein in each said optical element, the angle $\theta$ formed by the optical axis of the incident beam and the optical axis of the emerging beam is substantially 90 degrees, the normal to the first reflecting face lies in a plane defined by the direction of the optical axis of the incident beam and the direction of the first axis, an angle formed by said normal and incident beam is an acute angle, and the second reflecting face is parallel to said incident beam and the normal to the second reflecting face is inclined at substantially 45 degrees to the first axis.

10. An optical path rotating device according to claim 9, wherein said acute angle is 45 degrees.

11. An optical path rotating device according to claim 9, wherein said first and second reflecting faces intersect to form an angle of 60 degrees.

12. An optical path rotating device according to claim 7, further comprising a third reflecting face for receiving the incident beam from said second reflecting face, bending the optical axis thereof substantially to a right angle, and making the direction of the optical axis of the emerging beam from the optical path rotating device substantially parallel with the optical axis of the incident beam.

13. An optical path rotating device according to claim 7, wherein a plurality of pairs of reflecting faces are arranged side by side with each other, each said pair of reflecting faces comprising the first reflecting face intersecting a first plane at right angles and also intersecting a second plane at an included angle of 45 degrees and the second reflecting face intersecting said second plane at right angles and also intersecting said first plane at an included angle of 45 degrees at a place where said two planes intersect in a solid body having said first and second plane intersecting at right angles.

14. An optical path rotating device according to claim 13, wherein a right angle prism is placed against said first plane of the optical path rotating device in claim 13.

15. An optical path rotating device according to claim 7, wherein each said optical element is a prism made of a transparent body and having a face of incidence as a light receiving part, a face of emergence as a light emitting part, and a plurality of internal reflecting faces disposed so that said first axis of the cross section of said beam is rotated by a right angle.

16. An optical path rotating device according to claim 15, wherein said first reflecting face is vertical and inclined at substantially 45 degrees to the face of incidence, and said second reflecting face is perpendicular to the face of incidence and inclined at substantially 45 degrees to a horizontal plane.

17. An optical path rotating device according to claim 16, wherein each said optical element is a triangular pyramid prism in a shape of a triangular pyramid having an isosceles right triangle, an apex of an acute angle of said isosceles right triangle, through which apex a perpendicular to a plane including said isosceles right triangle passes, wherein a length of said perpendicular is equal to a length of each of two equal sides of said isosceles right triangle.

18. An optical path rotating device according to claim 17, wherein each said optical element is in a shape that the face of incidence of a right angle prism is joined to the face of an isosceles right angle of said triangular pyramid prism, which does not face the corresponding semiconductor laser stripe.

19. An optical path rotating device according to claim 16, wherein each said optical element is a triangular pyramid frustum prism in a shape that has as a lower bottom a face formed by a right-angled triangle, three sides of which triangle are not equal in a triangular pyramid having a isosceles right triangle and an apex of an acute angle of said isosceles right triangle, through which apex a perpendicular to a plane including said isosceles right triangle passes and as an upper bottom a cross section obtainable by cutting said triangular frustum of pyramid along a plane parallel with said isosceles right triangle, wherein a face formed by a bilaterally symmetric isosceles trapezoid of said optical element is placed against a stripe of the linear array semiconductor laser, with a result that said optical elements are arranged in an array.

20. An optical path rotating device according to claim 19, wherein said optical element is formed such that a right angle prism is provided such that a face formed by a trapezoid having a right angle at an apex angle not facing the semiconductor laser stripe of said triangular pyramid frustum prism is joined to the face of incidence.

21. An optical path rotating device according to claim 12, wherein said optical element is an oblique prism having a face of incidence as the light-receiving part and a face of emergence as a light-emitting part parallel with the face of incidence, and a transparent body as an optical system in which said first reflecting face is vertical and inclined at substantially 45 degrees to said face of incidence to reflect a horizontally incident beam to a substantially horizontal direction and at right angles, said second reflecting face is perpendicular to said face of incidence and inclined at substantially 45 degrees to a horizontal plane to reflect the beam reflected by the first reflecting face to a substantially vertical direction, and the third reflecting face horizontally intersects said face of incidence and is inclined at substantially 45 degrees to a horizontal plane to reflect the beam reflected by the second reflecting face to a direction substantially vertical.

22. An optical path rotating device according to claim 21, wherein said optical element has an intersection angle of 60 degrees between the first reflecting face and the second reflecting face, between the second reflecting face and the third reflecting face, and between the third reflecting face and the first reflecting face, respectively.

23. An optical path rotating device according to claim 22, wherein said optical element is an oblique prism formed by parallel translation of an arbitrary line segment extending on a diagonal drawn from an apex of a cube and passing through the center of the cube, and wherein the oblique prism is formed by moving one end of said line segment first on diagonal of a square in one face of the cube, then moving that end of the line segment for a specified length on the side thereof, further moving in parallel with the diagonal on which that end of the line segment has moved, and finally moving that end of the line segment until it returns the starting point.

24. An optical path rotating device according to claim 22, wherein said optical element is an oblique prism formed by moving in parallel translation a trapezoid enclosed by two adjacent sides of a square as one face of the cube, a straight line parallel with one of the two sides, and a diagonal of the square, and wherein the oblique prism is formed by moving an apex having an acute angle of the trapezoid is moved for a specified length on the diagonal passing through the center of the cube.

25. An optical path rotating device according to claim 22, wherein said optical path rotating device has first and second planes which are mutually parallel, a third plane intersecting said first plane at an included angle of 135 degrees, and a cyclically corrugated face like a washboard having peak lines and bottom lines occurring alternately at angles of 60 degrees in a direction intersecting said first plane at an angle of $\tan^{-1}(1/\sqrt{2})$, and a fourth face having peak lines and bottom lines in parallel with said third plane, and wherein said first plane is used as the face of incidence, said second plane is used as the face of emergence, out of the bend-faces constituting a fourth face, one-side bend-faces intersecting said first plane at an included angle of 45 degrees are used as first reflecting faces, and the other-side bend-faces are used as second reflecting faces, and said third plane is used as a third reflecting face.

26. An optical path rotating device according to claim 15, wherein said prism is a dove prism with a trapezoidal cross section.

27. An optical path rotating device according to claim 7, wherein said optical element includes two triangular pyramid prisms bonded together so as to be symmetric with respect to the axis, each prism is in a shape of a triangular pyramid including an isosceles right triangle, and an apex of an acute angle of said triangle in a plane including said triangle, through which apex a perpendicular to a plane including said isosceles right triangle passes, wherein a point of said perpendicular which makes the perpendicular equal to each of two equal sides of said isosceles right triangle is used as the apex.

28. An optical path rotating device according to claim 27, wherein a transparent prism having a cross section of a right triangle is joined to the face of emergence of said triangular pyramid prism as the face of emergence of said optical element.

29. An optical path rotating device according to claim 7, wherein said optical element is a space defined by the reflecting faces, including the first reflecting face which is vertical and inclined at substantially 45 degrees to the incident beam and the second reflecting face which is parallel with the incident beam and inclined at substantially 45 degrees to a horizontal plane.

30. An optical path rotating device according to claim 12, wherein said optical element is a space defined by the reflecting faces, including the first reflecting face which is vertical and inclined at substantially 45 degrees to the incident beam, the second reflecting face which is parallel with the incident beam and inclined at substantially 45 degrees to a horizontal plane, and a third reflecting face parallel with an intersection between the first reflecting line and second reflecting line.

31. An optical path rotating device according to claim 7, wherein said optical element is formed by cutting out from a cube a triangular pyramid having as an apex the point of the perpendicular to the apex of the acute angle of the isosceles right triangle in a plane including said isosceles right triangle in the case where the length of the perpendicular is equal to each of the equal sides of the isosceles right triangle.

32. An optical path rotating device according to claim 7, wherein said optical element is in the shape obtained by cutting a part including an apex having an acute angle of the upper bottom of a prism, which has the upper and lower bottoms in the shape of a paralleled in which one opposite angle is 45 degrees, at a plane inclined 45 degrees to a horizontal plane and parallel with a normal to a front side face.

33. An optical path rotating device according to claim 7, wherein along the edge formed by an upper face and a front face in a prism having an upper face and a front face intersecting said upper face at right angles, recessed portions formed by a vertical face intersecting the front face at 45 degrees and a face perpendicular to the front face and intersecting the upper face at 45 degrees are arranged side by side with each other at pitches corresponding to the emitters of the linear array semiconductor laser and the recessed portions are mirror-finished.

34. An optical path rotating device according to claim 12, wherein along an edge formed by an upper face and a front face in a prism having said upper face and the front face intersecting the upper face at right angles, recessed portions formed by a vertical face intersecting the front face at 45 degrees and a face perpendicular to the front face and intersecting the upper face at 45 degrees are arranged side by side with each other at pitches corresponding to the emitters of the linear array semiconductor laser, and a right angle prism is joined to the upper face.

35. An optical path rotating device according to claim 12, wherein in a flat plate having a specified thickness, recessed portions are formed, which have vertical first faces produced at pitches corresponding to the emitters of the linear array semiconductor laser and intersecting the front face at 45 degrees, second faces perpendicular to the front face and intersecting a horizontal plane at 45 degrees, a third face parallel with edges formed by intersections of said first and second faces, a fourth face connecting the first face at the end with the third face, and a fifth face connecting the second face at the end with the third face, and wherein the recessed portions are mirror-finished.

36. An optical path rotating device according to claim 4, wherein said optical element is a linearly-distributed refractive index lens element made of optical glass in which a refractive index is highest at the center plane and gradually decreases as we move towards the side faces, and wherein said center plane is inclined at substantially 45 degrees to a horizontal plane.

37. An optical path rotating device according to claim 4, wherein said optical element is a linearly-distributed refractive index lens element made of optical glass having two mutually parallel side faces, in which the refractive index is highest at one side face and gradually decreases as we move towards the other side face, and wherein said side faces are inclined at substantially 45 degrees to a horizontal plane.

38. An optical path rotating device according to claim 4, wherein a plurality of semi-cylindrically-distributed refractive index lens elements, 45-degree-inclined, are arranged side by side with each other linearly on either side of the optical glass body in a manner that said corresponding lens elements on the opposite sides are paired and correspond to the emitter faces of the linear array laser diode, and wherein the refractive index in said lens elements is highest at the center of the semi-circle and gradually decreases as we move towards the outer side.

39. An optical path rotating device according to claim 4, wherein said optical elements are pairs of bowed cylindrical lenses, the axes of which are inclined 45 degrees, arranged face to face with each other across a specified distance.

40. An optical path rotating device according to claim 4, wherein said optical elements are cylindrical lenses having bowed lens portions at opposite ends across side faces, and wherein said optical elements are joined together each inclined at 45 degrees to the incident beam.

41. An optical path rotating device according to claim 4, wherein a plurality of cylindrical surfaces, inclined substantially 45 degrees in the same direction, are formed on the face of incidence and the face of emergence of optical glass prism with a rectangular cross section, and wherein the incident beams incident on the respective cylindrical surfaces are rotated substantially by 90 degrees and emerge from the faces of emergence.

42. An optical path rotating device according to claim 4, wherein in arranging the optical element, each pair of optical elements, in which power varies only in a direction perpendicular to the center axis by diffraction, is placed facing each other with the center axis inclined substantially at 45 degrees.

43. An optical path rotating device according to claim 42, wherein said optical element is a set of binary optic elements, in each of which a number of grooves are formed along the center axis with depths varying symmetrically with respect to the center axis inclined substantially at 45 degrees in a direction perpendicular to the center axis.

44. An optical path rotating device according to claim 42, wherein said optical element is a set of bowed linear Fresnel lenses of the same cross section, each of which is formed so that power varies along the substantially-45-degree-inclined center axis and only in a direction perpendicular to the center axis.

45. An optical path rotating device according to claim 44, wherein said Fresnel lens is a laminar type Fresnel zone plate.

46. An optical path rotating device according to claim 44, wherein said Fresnel lens is a mask type Fresnel zone plate.

47. An optical path rotating device according to claim 42, wherein a plurality of optical elements are arranged side by side to correspond to the active layer stripes of the linear array laser diode, each optical element having the face of incidence and the face of emergence parallel with the face of incidence and the axis of the face of incidence inclined at 45 degrees to horizontal, and wherein a plurality of optical elements symmetric with the optical elements at the face of incidence are arranged side by side to correspond to the optical elements of the face of incidence.

48. An optical path rotating device according to claim 4, further comprising a transparent flat plate on which said linearly-arranged optical elements are fixed.

49. A composite of a condenser and an optical path rotating device for use with a linear array laser diode, said composite comprising a face of incidence for receiving an incident beam having a cross section which is perpendicular to the optical axis and which includes a first axis;

an optical system for rotating the first axis of said cross section substantially by a right angle;

a plurality of optical elements having faces of emergence for emitting the emerging beams that have passed through said optical system; and a cylindrical lens having a flat face of incidence and a bow-shaped face of emergence, wherein the faces of emergence of said optical elements are arranged linearly and fixed such that the faces of emergence are adjacent to the face of incidence of the cylindrical lens, and correspond to the emitting faces of the linear array laser diodes.

50. A composite of a condenser and an optical path rotating device for use with linear array diode, said device comprising:

a face of incidence for receiving an incident beam having a cross section which is perpendicular to the optical axis and which includes a first axis;

an optical system for rotating the first axis of said cross section substantially by a right angle;

a plurality of optical elements having faces of emergence for emitting the emerging beams that have passed through said optical system; and a cylindrical lens having a flat face of incidence and a bow-shaped face of emergence, wherein
the faces of incidence of said optical elements are arranged linearly and fixed such that said faces of incidence are adjacent to said face of emergence of the cylindrical lens, and correspond to the emitting faces of the linear array laser diode.

51. A semiconductor-laser-pumped solid state laser apparatus comprising:

a linear array laser diode, having a plurality of laser-beam-emitting emitters having emitter faces arranged to extend linearly in a first direction, for emitting a group of laser beams in the form of a dotted line;

a first condenser, disposed in front of said linear array laser diode, for collimating said group of laser beams by refracting them to a second direction perpendicular to said first direction;

an optical path rotating device, disposed in front of said first condenser, and having a plurality of optical elements arranged in parallel for bending the axis of a cross section of at least one laser beam substantially to a right angle, for receiving the group of laser beams collimated in said second direction, rotating the axes of the cross sections of the laser beams, and emitting the group of laser beams substantially in the form of ladder rungs lined up in said first direction;

a second condenser for collimating the group of laser beams substantially in the form of ladder rungs to a direction substantially perpendicular to said first direction;

a third condenser for bringing the group of laser beams emitted from said second condenser into focus; and a solid state laser element having a pumping-light-receiving face to which said focus is adjusted.

52. A semiconductor-laser-pumped solid state laser apparatus comprising:

a linear array laser diode, having a plurality of laser-beam-emitting emitters having emitter faces arranged to extend linearly in said first direction, for emitting a group of laser beams in the form of a dotted line;

a first condenser, disposed in front of said linear array laser diode, for collimating the group of laser beams by refracting them to a second direction perpendicular to said first direction;

an optical path rotating device, disposed in front of said first condenser, and having a plurality of optical elements arranged in parallel for bending the axis of a cross section of at least one laser beam substantially to a right angle, for receiving the group of laser beams collimated in said second direction, rotating the axes of the cross sections of the laser beams, and emitting the group of laser beams substantially in the form of ladder rungs lined up in said first direction;

a second condenser for collimating the group of laser beams substantially in the form of ladder rungs to a direction substantially perpendicular to said first direction;

a third condenser for bringing the group of laser beams emitted from said second condenser into focus;

an optical fiber for transmitting light of the group of the laser beams focused into said first focus;

a collimator for collimating the light emitted from said optical fiber to converge the light to a second focus; and a solid state laser element having a pumping-light-receiving face to which said focus is adjusted.

53. A semiconductor-laser-pumped solid state laser apparatus comprising:

a first linear array laser diode, having a plurality of laser-beam-emitting emitters having emitter faces arranged to extend linearly in said first direction, for emitting a group of laser beams in the form of a dotted line;

a first condenser, disposed in front of said linear array laser diode, for collimating the group of laser beams by refracting them to a second direction perpendicular to said first direction;

an optical path rotating device, disposed in front of said first condenser, and having a plurality of optical elements arranged in parallel for bending the axis of a cross section of at least one laser beam substantially to a right angle, for receiving the group of laser beams collimated in said second direction, rotating the axes of the cross sections of the laser beams, and emitting the group of laser beams substantially in the form of ladder rungs lined up in said first direction;

a second condenser for collimating the group of laser beams substantially in the form of ladder rungs to a direction substantially perpendicular to said first direction;

a second linear array laser diode, having a plurality of laser-beam-emitting emitters having emitter faces arranged to extend linearly in said third direction, for emitting a group of laser beams in the form of a dotted line;

a third condenser, disposed in front of said second linear array laser diode, for collimating the group of laser beams by refracting them to a fourth direction perpendicular to said third direction;

a second optical path rotating device, disposed in front of said third condenser, and having a plurality of optical element s arranged in parallel for bending the axis of a cross section of at least one laser beam substantially for a right angle, for receiving the group of laser beans collimated in said fourth direction, rotating the axes of the cross sections of the laser beams, and emitting the group of laser beams substantially in the form of ladder rungs lined up in said third direction;

a fourth condenser for collimating the group of laser beams substantially in the form of ladder rungs to a direction substantially perpendicular to said first direction;

a polarization beam splitter having a first face of incidence for receiving a group of laser beams emitted from said second condenser, a second face of incidence for receiving a group of laser beams emitted from a fourth condenser, and a face of emergence for emitting a group of laser beans, wherein the group of laser beams received on the first face of incidence and having a first polarization direction are made to travel straight, a group of laser beams having a second polarization direction intersecting the first polarization direction and emitted from the fourth condenser are received on the second face of incidence and refracted to a direction of traveling towards the face of emergence, and as a result, both groups of laser beams are emitted from the face of emergence;

a fifth condenser for bringing the group of laser beams emitted from said polarization beam splitter into focus; and a solid-state laser element having a pumping-light-receiving face to which said focus is adjusted.

54. A semiconductor-laser-pumped solid state laser apparatus according to claim 53, further comprising a halfwave plate to cause a polarization direction of a group of laser beams emitted from said third condenser to intersect the polarization direction of said group of laser beams.

* * * * *